United States Patent
Uthoff et al.

(10) Patent No.: US 11,740,534 B1
(45) Date of Patent: Aug. 29, 2023

(54) COUPLING PRISMS FOR TUNABLE OPTICAL METASURFACES

(71) Applicant: Lumotive, Inc., Redmond, WA (US)

(72) Inventors: Ross D. Uthoff, Seattle, WA (US);
Apurva Jain, Lynwood, WA (US);
Gleb M. Akselrod, Kenmore, WA (US);
Matthieu Saracco, Woodinville, WA (US)

(*) Notice: Subject to any disclaimer, the term of this patent is extended or adjusted under 35 U.S.C. 154(b) by 0 days.

(21) Appl. No.: 18/156,375

(22) Filed: Jan. 18, 2023

Related U.S. Application Data

(62) Division of application No. 17/822,717, filed on Aug. 26, 2022, now Pat. No. 11,567,390.

(51) Int. Cl.
| | |
|---|---|
| *G02F 1/29* | (2006.01) |
| *G01J 1/44* | (2006.01) |
| *G01S 7/481* | (2006.01) |
| *G02B 5/04* | (2006.01) |
| *H01S 5/42* | (2006.01) |

(52) U.S. Cl.
CPC ............ *G02F 1/292* (2013.01); *G01J 1/44* (2013.01); *G01S 7/4815* (2013.01); *G01S 7/4817* (2013.01); *G02B 5/04* (2013.01); *G02F 2202/30* (2013.01); *H01S 5/423* (2013.01)

(58) Field of Classification Search
CPC ... G01S 7/48; G01S 7/00; G01S 17/02; G01S 17/04; G01S 17/06; G01S 17/66; G01S 17/86; G01S 17/88; G02B 26/10; G02B 26/12; G02B 5/04; G02B 7/18; G01N 21/55; G02F 1/29
USPC ...................................... 250/216
See application file for complete search history.

(56) References Cited

U.S. PATENT DOCUMENTS

| | | | |
|---|---|---|---|
| 7,187,445 B2 * | 3/2007 | Schanz | G01S 17/931 356/445 |
| 10,451,800 B2 | 10/2019 | Akselrod | |
| 10,665,953 B1 | 5/2020 | Akselrod | |
| 10,915,002 B2 | 2/2021 | Akselrod | |

(Continued)

OTHER PUBLICATIONS

Uthoff, U.S. Appl. No. 17/822,717, Notice of Allowance dated Dec. 23, 2022, 9 pp.

(Continued)

*Primary Examiner* — Que Tan Le
(74) *Attorney, Agent, or Firm* — PCFB, LLC; Justin K. Flanagan

(57) ABSTRACT

According to various embodiments, a solid-state light detection and ranging (LiDAR) transmitter includes a tunable optical metasurface to selectively steer incident optical radiation long an azimuth axis. In some embodiments, different subsets of lasers in an array of lasers are activated to generate optical radiation for incidence on the metasurface at different angles of incidence on an elevation axis for unsteered deflection by the metasurface at corresponding angles of elevation. In some embodiments, a prism is positioned relative to the tunable optical metasurface to deflect the optical radiation from the optical assembly by the optical radiation source for incidence on the metasurface at an angle of incidence that is between the first steering angle and the second steering angle, such that the optical radiation incident on the metasurface and the steered output optical radiation from the metasurface spatially overlap within the prism.

24 Claims, 47 Drawing Sheets

(56) References Cited

U.S. PATENT DOCUMENTS

| | | |
|---|---|---|
| 10,968,522 B2 | 4/2021 | Akselrod |
| 11,092,675 B2 | 8/2021 | Akselrod |
| 11,204,412 B2 | 12/2021 | Kim |
| 11,429,008 B1 | 8/2022 | Akselrod |
| 2012/0194399 A1 | 8/2012 | Bily |
| 2014/0266946 A1 | 9/2014 | Bily |
| 2015/0162658 A1 | 6/2015 | Bowers |
| 2015/0318618 A1 | 11/2015 | Chen |
| 2015/0318620 A1 | 11/2015 | Black |
| 2015/0372389 A1 | 12/2015 | Chen |
| 2015/0380828 A1 | 12/2015 | Black |
| 2018/0239213 A1 | 8/2018 | Akselrod |
| 2018/0241131 A1 | 8/2018 | Akselrod |
| 2019/0285798 A1 | 9/2019 | Akselrod |
| 2021/0124019 A1 | 4/2021 | Tsai |
| 2021/0132196 A1 | 5/2021 | Tsai |

OTHER PUBLICATIONS

U.S. Appl. No. 17/822,718, Non-Final Office Action dated Mar. 14, 2023, 17 pp.

* cited by examiner

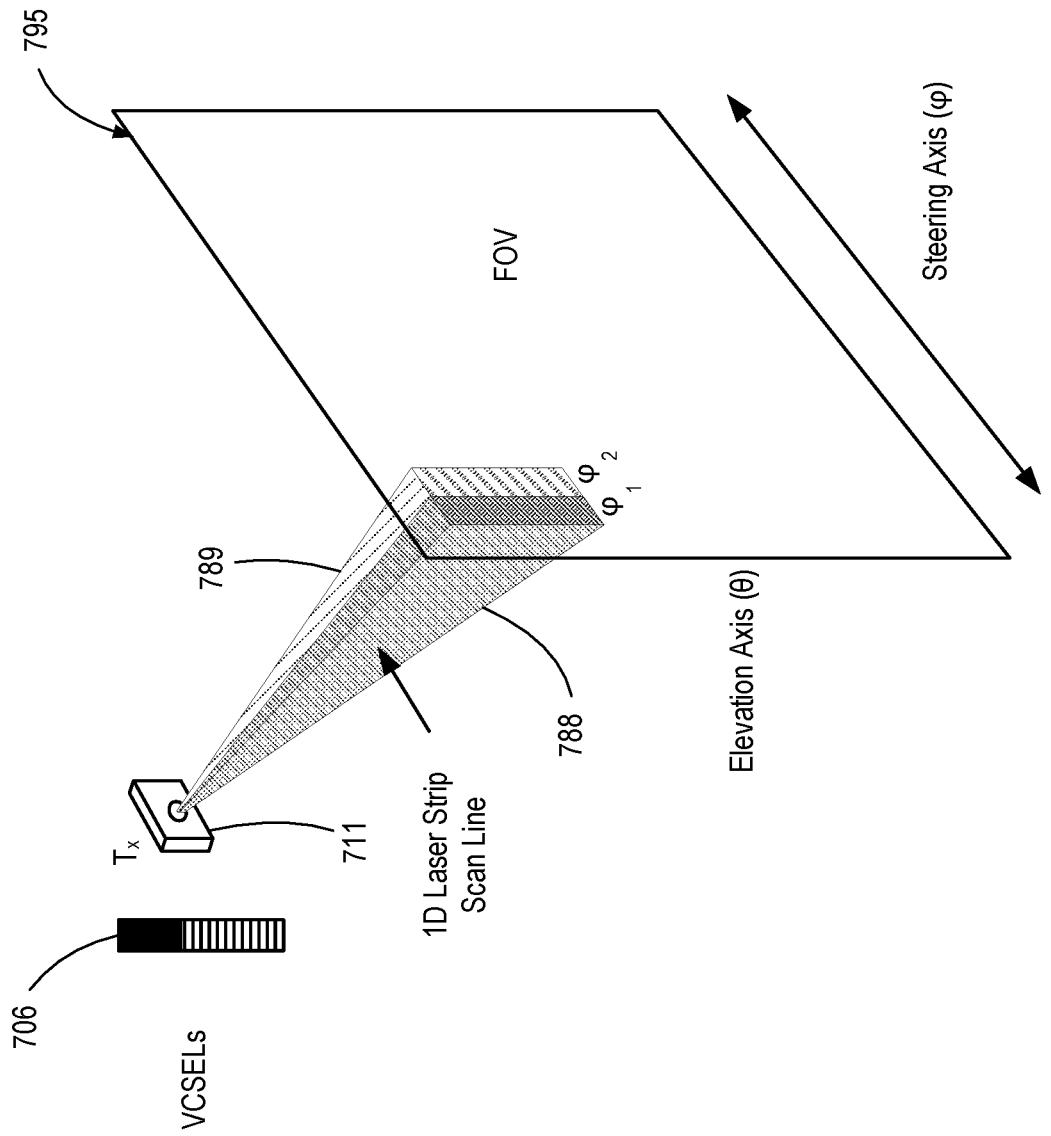

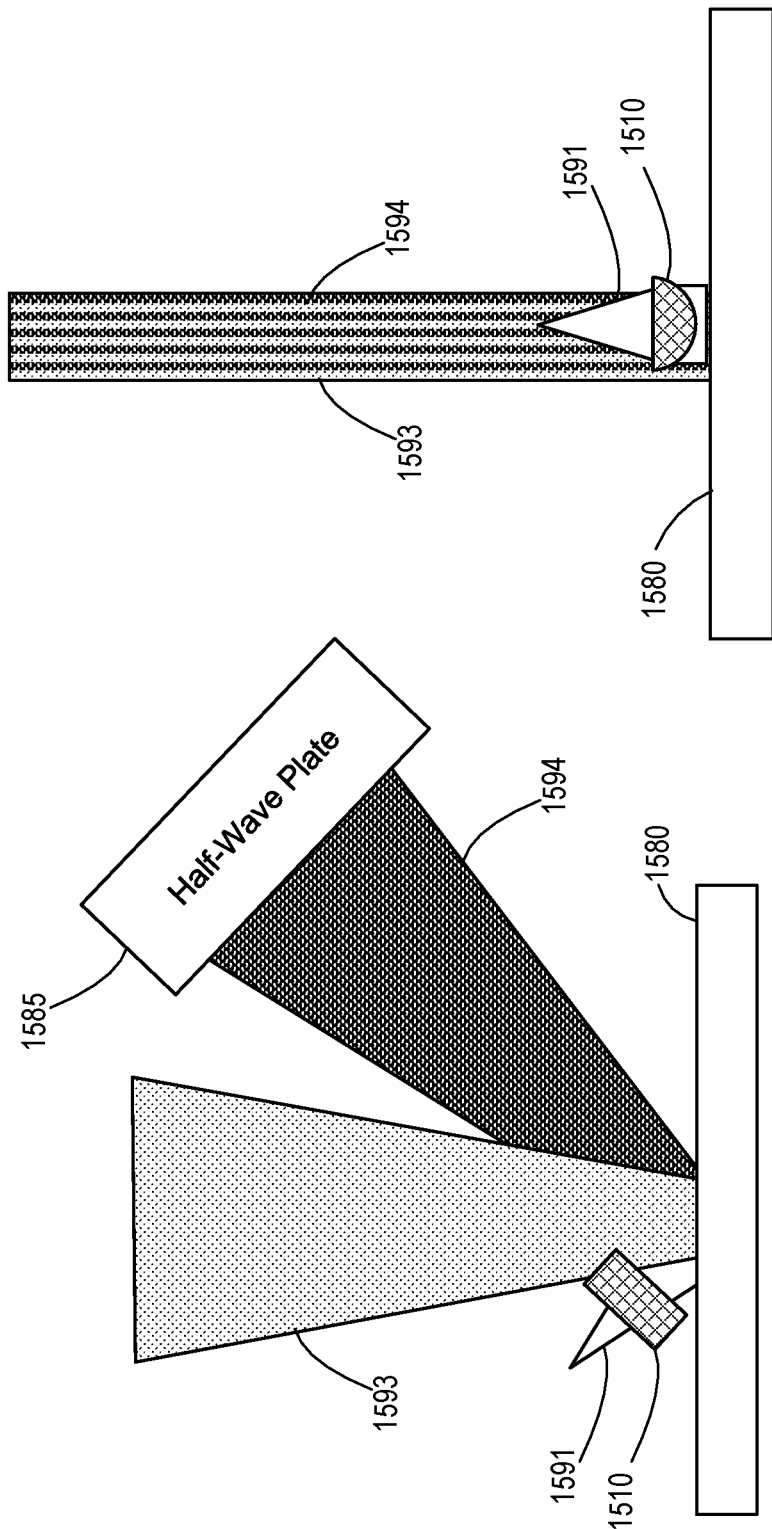

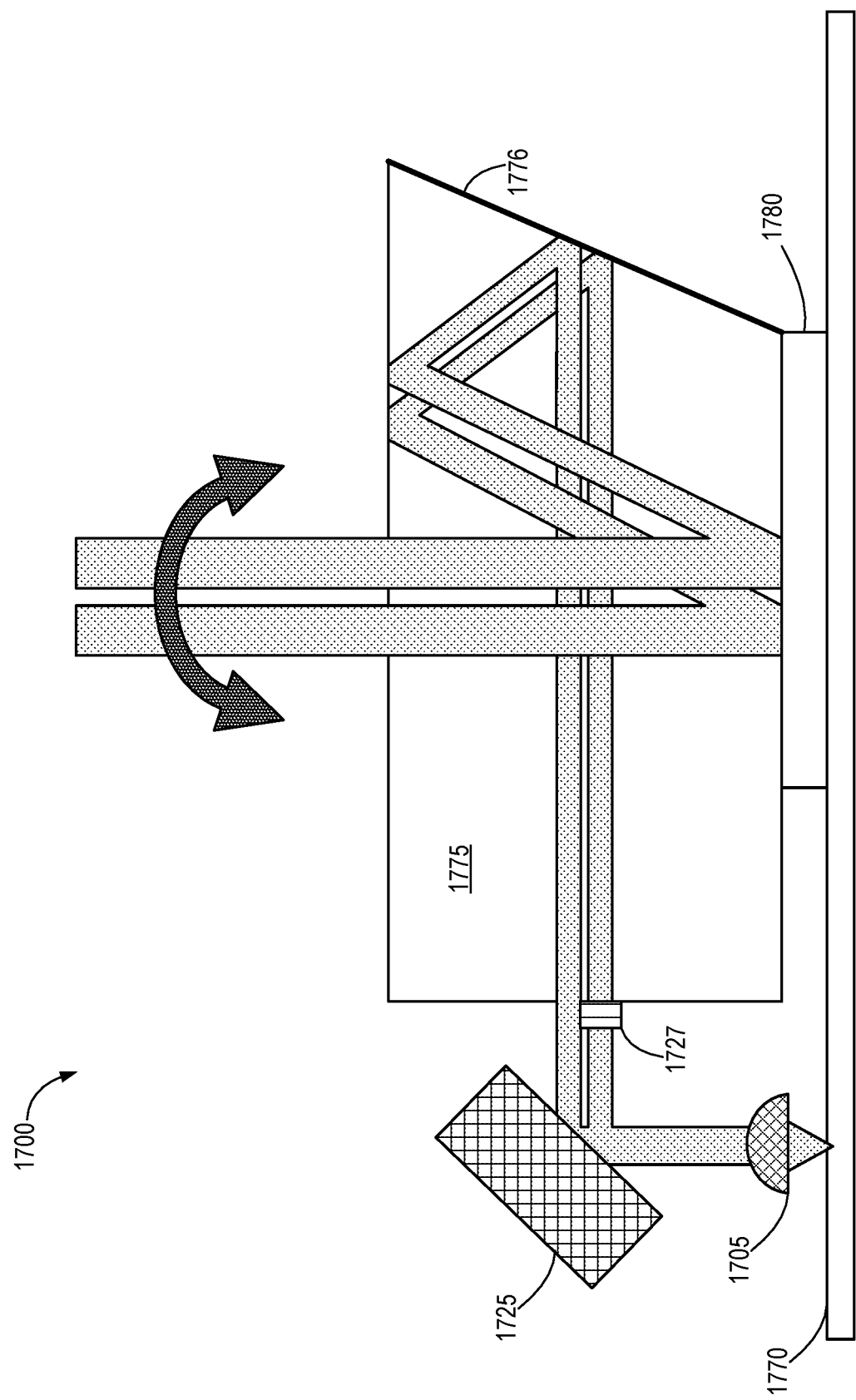

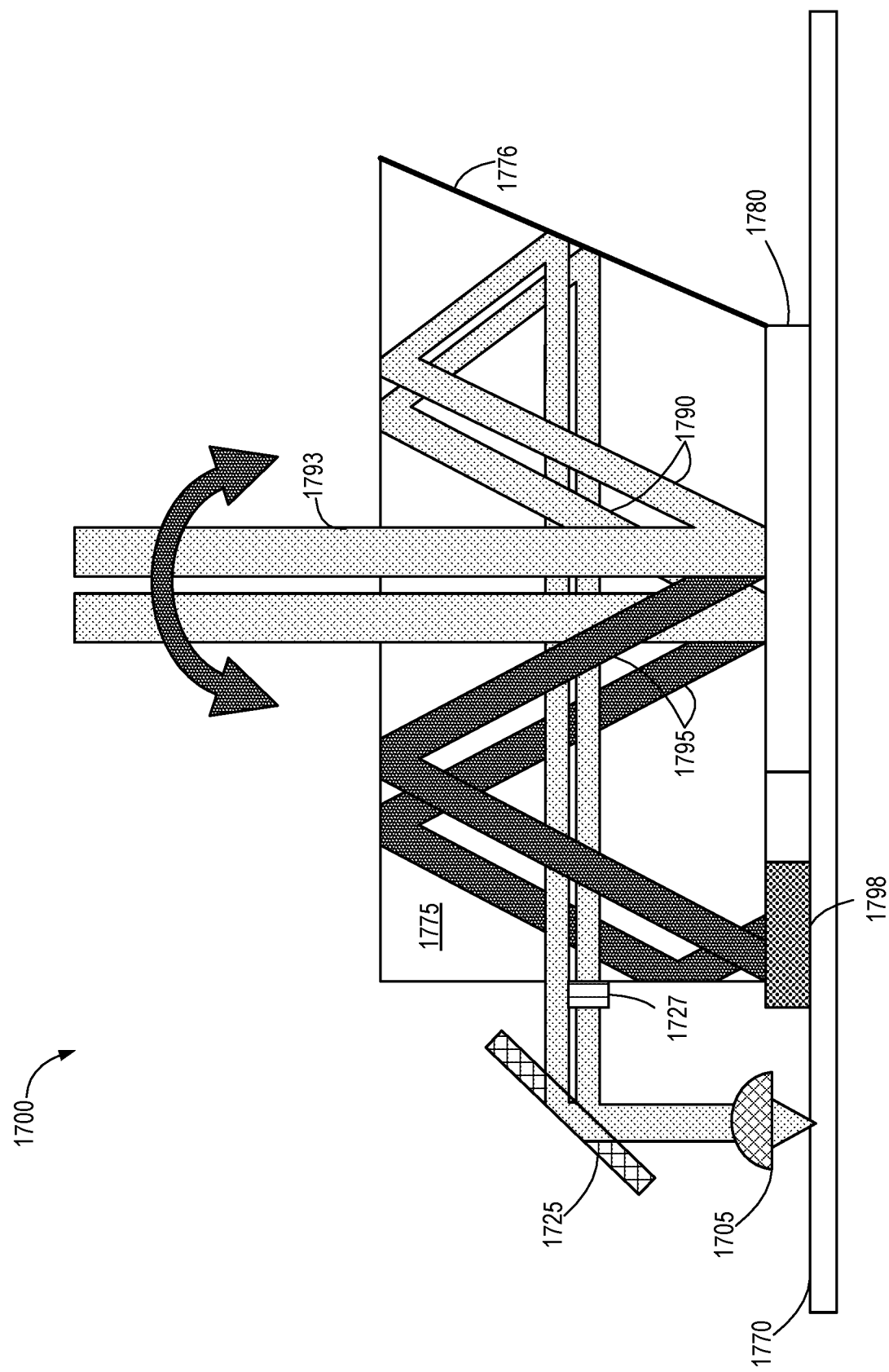

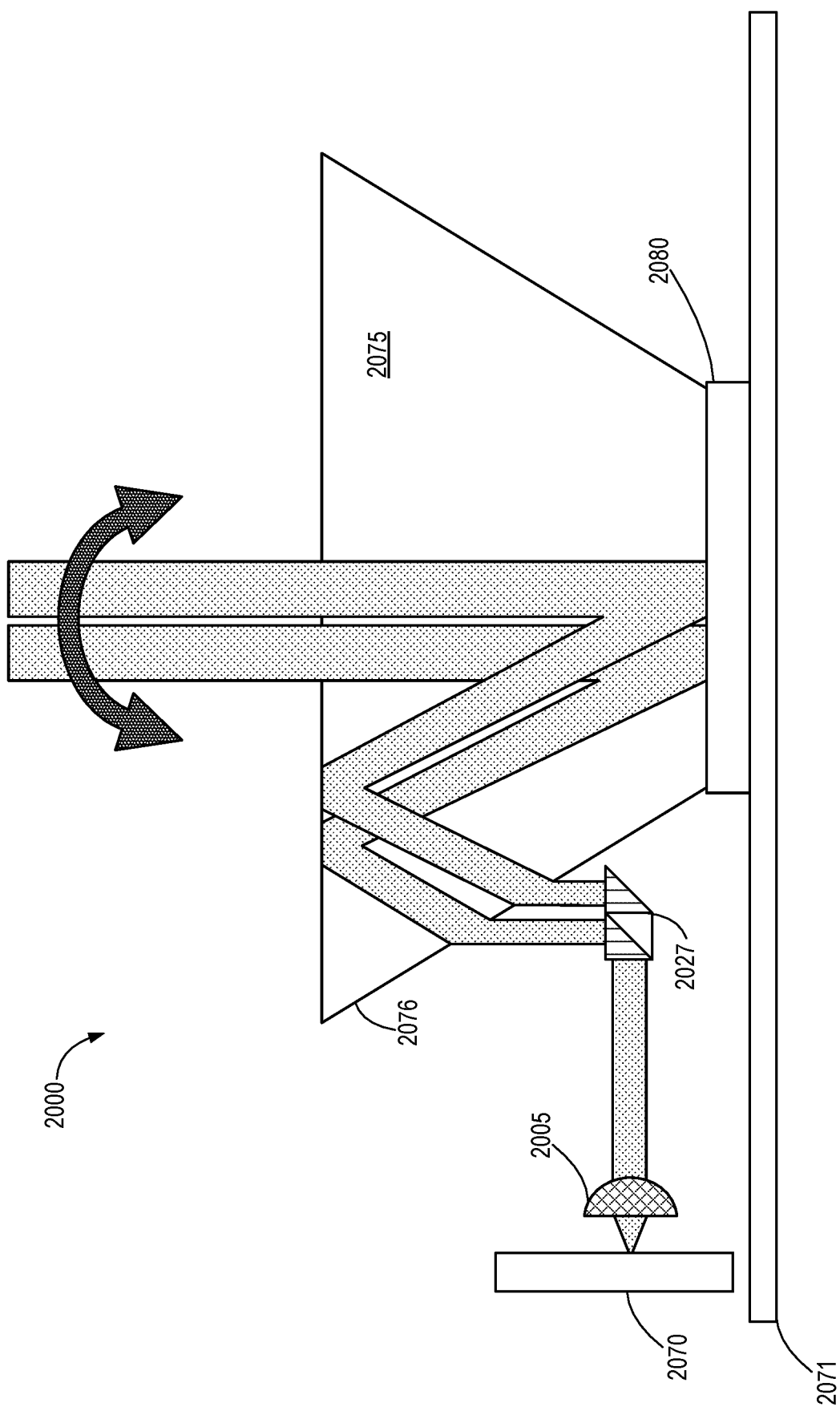

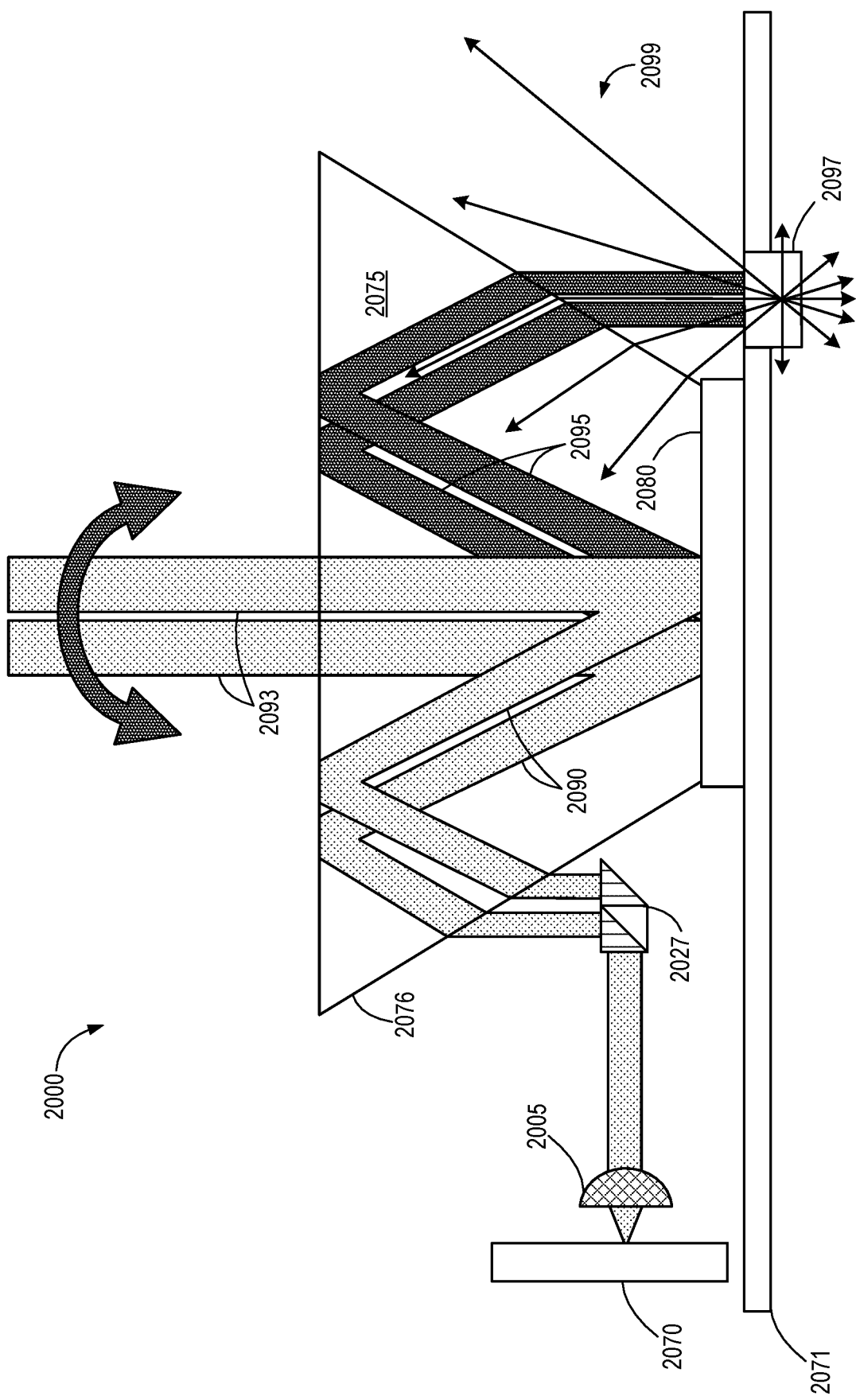

COUPLING PRISMS FOR TUNABLE OPTICAL METASURFACES

RELATED APPLICATIONS

This application claims priority to and is a divisional application of U.S. patent application Ser. No. 17/822,717 titled "Coupling Prisms for Tunable Optical Metasurfaces," filed on Aug. 26, 2022 and issuing as U.S. Pat. No. 11,567,390 on Jan. 31, 2023, which application is hereby incorporated by reference in its entirety.

TECHNICAL FIELD

This disclosure relates to optical metasurfaces, including liquid crystal metasurfaces used for solid-state light detection and ranging (LiDAR).

BRIEF DESCRIPTION OF THE DRAWINGS

FIG. 7A illustrates an example of partial elevation illumination of steered optical radiation by partial activation of a VCSEL array, according to one embodiment.

FIGS. 15A-D illustrate example views of a reflective metasurface with a half waveplate, according to various embodiments.

FIGS. 17A-24 illustrate examples of optical transmitters utilizing prisms to convey optical radiation to a tunable metasurface from optical radiation sources in various locations relative to the metasurface, according to various embodiments.

DETAILED DESCRIPTION

Figure 1:
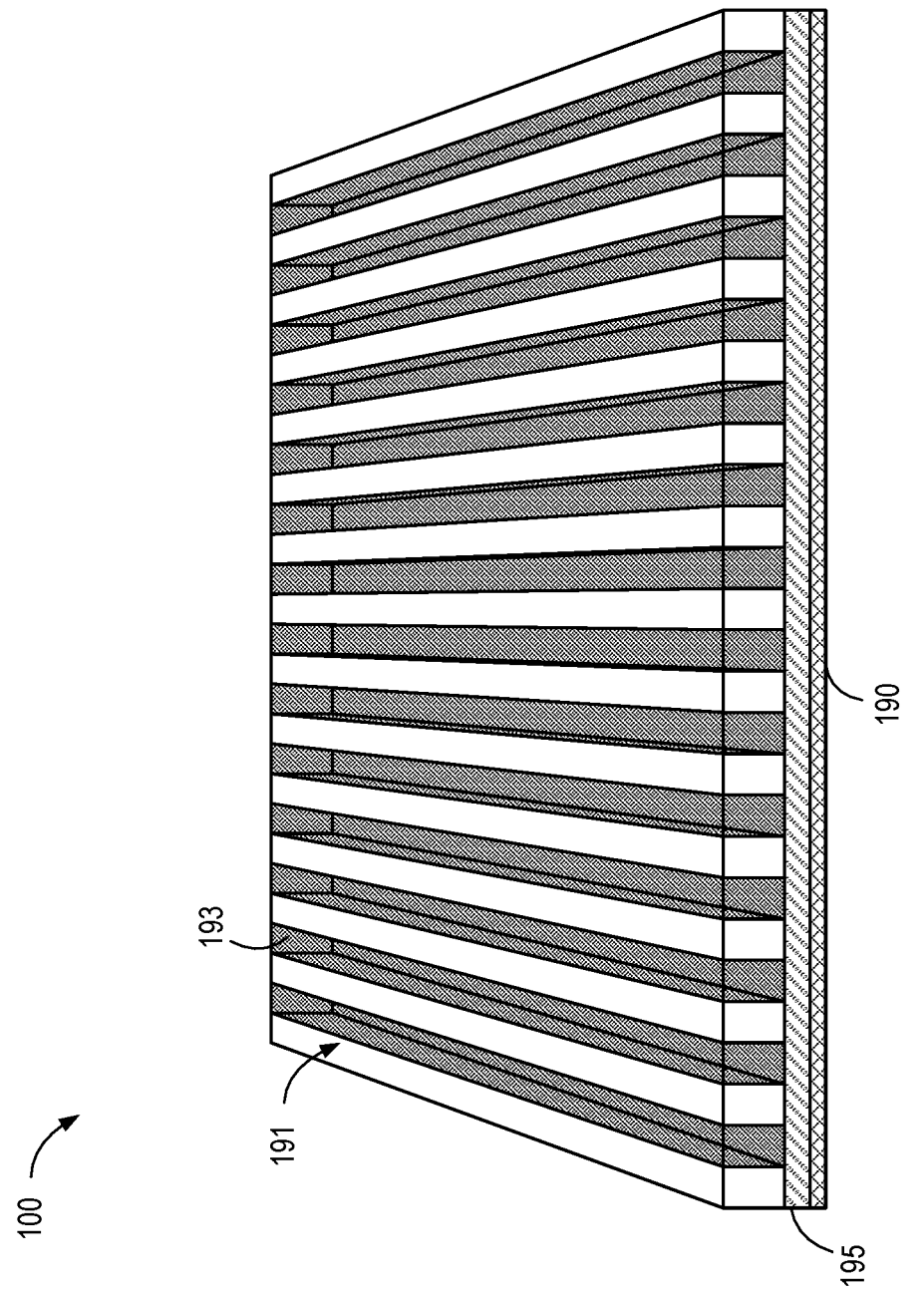
FIG. 1 illustrates an example of a tunable liquid crystal metasurface (LCM), according to one embodiment.

Tunable optical metasurfaces may be used for beamforming, including three-dimensional beam shaping, two-dimensional beam steering, and one-dimensional beam steering. The presently described systems and methods can be applied to tunable metasurfaces utilizing various architectures and designs. In general, a metasurface includes a plurality of optical structures that, together with a tunable dielectric material, can be operated to deflect (e.g., reflect, refract, steer, defocus, focus, converge, diverge, etc.) optical radiation within an operational bandwidth.

Various specific examples of tunable optical metasurfaces are described herein and depicted in the figures. For example, in one specific embodiment, a tunable optical metasurface includes an array of elongated rails (e.g., resonators) arranged parallel to one another with respect to an optical reflector, such as an optically reflective metal layer or a Bragg reflector. In such an embodiment, the elongated rails may be formed from metal, a doped semiconductor material, and/or a dielectric material and be configured with subwavelength interelement spacings.

Examples of suitable metals that may be used as optical reflectors and optical structures in a metasurface include, but are not limited to, copper, aluminum, gold, silver, platinum, titanium, and chromium. In embodiments in which the elongated rails are copper, the elongated copper rails may, for example, be formed using a copper damascene manufacturing process, followed by etching the intermetal dielectric and subsequent passivation of the copper. Examples of suitable fabrication processes that can be adapted for use with the presently described systems and methods are described in, for example, U.S. Pat. No. 10,968,522 granted on Apr. 6, 2021, which is hereby incorporated by reference in its entirety.

Liquid crystal, or another refractive index tunable dielectric material, is positioned in the gaps or channels between adjacent rails (e.g., doped semiconductor or metal rails). Liquid crystal is used in many of the examples provided in this disclosure. However, it is appreciated that alternative dielectric materials with tunable refractive indices and/or combinations of different dielectric materials with tunable refractive indices may be utilized instead of liquid crystal in many instances.

For the sake of clarity and to avoid unnecessary repetition, the alternative dielectric materials are not called out in connection with every example provided herein. Nevertheless, the use or substitution of alternative tunable dielectric materials in each of the examples provided herein is explicitly contemplated and encompassed by this disclosure. Examples of dielectric materials with tunable refractive indices suitable for use in the various example metasurfaces described herein include but are not limited to various forms and combinations of liquid crystal, electro-optic polymers, chalcogenide glasses, other phase change materials, and semiconductor materials.

In some embodiments, an optically tunable metasurface includes a two-dimensional array of pillars instead of (or possibly in combination with) elongated rails. Regardless of the exact optical structures utilized in the metasurface, the tunable metasurface may include liquid crystal or another refractive index tunable dielectric material in, around, between, and/or on the optical structures. For example, liquid crystal may fill the channels between resonator rails, fill the gaps between neighboring pillars, and/or form a layer of liquid crystal above the rails or pillars. Examples of suitable metals that may be used as optical reflectors and optical structures in a metasurface include, but are not limited to, copper, aluminum, gold, silver, platinum, titanium, and chromium.

In various embodiments, biasing the liquid crystal in a metasurface with a pattern of voltage biases changes the reflection phase and amplitude of the optical radiation (or transmission phase). For example, in embodiments using reflective-type metasurfaces, biasing the liquid crystal in the metasurface with a pattern of voltage biases can be used to change the reflection phase and amplitude pattern of optical radiation reflected by an underlying reflector layer. Each different voltage pattern applied across the metasurface corresponds to a different reflection phase pattern (or transmission phase pattern in transmissive designs). With a one-dimensional array of optical structures (such as a one-dimensional array of resonator rails), each different reflection phase pattern corresponds to a different steering angle or radiation pattern in a single dimension. A digital or analog controller (controlling current and/or voltage), such as a metasurface driver, may apply a voltage differential bias pattern, such as a blazed grating pattern, to the metasurface to achieve a target beam shaping, such as a target beam steering angle. The term "beam shaping" is used herein in a broad sense to encompass one-dimensional beam steering, two-dimensional beam steering, wavelength filtering, beam divergence, beam convergence, beam focusing, and/or controlled deflection, refraction, reflection, and/or arbitrary phase and amplitude control of incident optical radiation.

According to various embodiments, the driver circuit of the tunable optical device comprises a one-dimensional passive matrix controller with driver channels integrated within the substrate to individually control each optical structure of the metasurface. In other embodiments, the optical structures of the metasurface are arranged as tiled subsets of optical structures, where each tile shares a set of common control inputs. As described in some of the applications incorporated herein by reference, each tile of optical structures may include tens, hundreds, thousands, or millions of optical structures. Each tile may be controlled by a common set of control lines, such that the number of unique control inputs for the metasurface is much fewer than the total number of optical structures in the metasurface. The driver circuit may include control lines or driver channels integrated within the substrate to control each individual tile of optical structures.

It is appreciated that the metasurface technologies described herein may incorporate or otherwise leverage prior advancements in surface scattering antennas, such as those described in U.S. Patent Publication No. 2012/0194399; U.S. Patent Publication No. 2019/0285798, U.S. Patent Publication 2018/0239213, and U.S. Patent Publication No. 2018/0241131, which publications are hereby incorporated by reference in their entireties. Additional elements, applications, and features of surface scattering antennas that feature a reference wave or feed wave are described in U.S. Patent Publication Nos. 2014/0266946, 2015/0318618, 2015/0318620, 2015/0380828, 2015/0162658, and 2015/0372389, each of which is hereby incorporated by reference in its entirety. Specific descriptions of optical resonant antenna configurations and feature sizes are described in U.S. patent applications Ser. Nos. 15/900,676, 15/900,683, 15/924,744, and 17/685,621, each of which is hereby incorporated by reference in its entirety.

Throughout this disclosure, examples of transmitting (or receiving) embodiments are provided with the understanding that reciprocal receiving (or transmitting) embodiments are also contemplated. For example, metasurface and optical assembly configurations described as transmitting optical radiation from an optical radiation source can be used in reverse to receive optical radiation for detection by a sensor. Similarly, it is understood that a system may operate as only a transmitter, only a receiver, simultaneously as a transmitter and receiver, with a time-multiplexed transmitter/receiver, with a frequency-multiplexed transmitter/receiver, with the first metasurface acting as a transmitter and a second metasurface acting as a receiver, or another transmit/receive configuration or operation technique. Similarly, many of the examples are described in terms of modifying a reflection phase pattern of a reflective-type metasurface. However, it is appreciated that many of the approaches, techniques, systems, methods, and principles taught herein can be applied to transmissive-type metasurfaces as well. Accordingly, each embodiment in which a reflective-type metasurface is described should be understood as implicitly teaching a corresponding embodiment using a transmissive-type metasurface, except when the specific optical assembly described is dependent upon the specifically described transmissive-type or reflective-type metasurface.

The presently described embodiments support optical bandwidths and are, for example, suitable for optical sensing systems such as LiDAR, optical communications systems, optical computing systems, optical power transfer, and displays. For example, the systems and methods described herein can be configured with metasurfaces that operate in the sub-infrared, mid-infrared, high-infrared, and/or visible-frequency ranges (generally referred to herein as "optical"). Given the feature sizes needed for sub-wavelength optical antennas and antenna spacings (e.g., sub-wavelength interelement spacings), the described metasurfaces may be manufactured using micro-lithographic and/or nano-lithographic processes, such as fabrication methods commonly used to manufacture CMOS integrated circuits.

Additionally, many of the described embodiments of metasurfaces are described in terms of controlling, tuning, or modifying phase patterns (e.g., reflection phase patterns or transmission phase patterns). However, many of the embodiments may be used in conjunction with metasurfaces in which the optical elements are tuned or adjusted to control (i) the reflection/transmission phase, (ii) the reflection/transmission amplitude, or (iii) the reflection/transmission phase and the reflection/transmission amplitude. Accordingly, any of a wide variety of metasurfaces may be utilized in any of the embodiments described herein that operate to control the complex phase and/or complex amplitude of the reflected or transmitted optical radiation. Accordingly, while specific examples are described and illustrated herein, it is understood that the various embodiments may be modified or adapted for use with alternative embodiments of optical metasurfaces and are not limited to the specifically described and illustrated examples.

According to various embodiments, an optical radiation transmission system for use in a LiDAR or other sensing system may include an optical radiation source to generate optical radiation. For example, the optical transmission system may include one or more lasers, a one-dimensional array of lasers, or a two-dimensional array of lasers. For example, the system may include multiple vertical-cavity surface-emitting lasers (VCSELs) suitably described as a plurality, set, array, or group of VCSELs. In other embodiments, the system may include a plurality, set, array, and/or group of edge emitter lasers.

The system may further include a tunable optical metasurface to transmit incident optical radiation as output optical radiation that is selectively steerable in at least one steering direction within a steering range. The steering range may be, for example, a range of angles between a first steering angle and a second steering angle, such as −90 and +90 degrees or −120 and +120 degrees. As described herein, the tunable optical metasurface may be a transmissive-type metasurface or a reflective-type metasurface and may be used to steer optical radiation and/or implement additional optical manipulation functions such as focusing, diverging, collimating, or otherwise beamforming the optical radiation.

An optical assembly, including one or more optical elements, may be used to modify the beam shape, focus, collimation, polarization, and/or other optical characteristics of the optical radiation generated by the optical radiation source, and direct the modified optical radiation for incidence on the tunable optical metasurface for beam steering. In some of the examples described herein, a prism is positioned relative to the tunable optical metasurface to deflect the optical radiation generated by the optical radiation source for incidence on the metasurface.

In various examples, the prism deflects the optical radiation generated by the optical radiation source onto the metasurface at an angle of incidence that is between the first steering angle and the second steering angle, such that the optical radiation incident on the metasurface and the steered output optical radiation from the metasurface spatially overlap within the prism for at least some steering angles. In such embodiments, the optical radiation source may be positioned outside of a transmission aperture of the metasurface (e.g., between the most negative and most positive steering angles), but the optical radiation may still be directed for incidence onto the metasurface at an angle of incidence within the steering range. As such, the transmitted optical radiation and the incident optical radiation share the transmission aperture for at least some steering angles of the metasurface without the optical source blocking the transmitted optical radiation.

As described herein, at least one facet of the prism reflects optical radiation from the optical radiation source that is incident on the face at an angle greater than a critical angle for internal reflection onto the metasurface, while simultaneously transmitting (e.g., refracting) steered optical radiation from the metasurface that passes through the same face of the prism at an angle less than the critical angle for internal reflection. As described and illustrated herein, the use of a prism with such a configuration and positioning relative to the optical radiation source and the metasurface allows for the optical radiation source to be positioned much closer to the metasurface without blocking the steering aperture while still directing the incident optical radiation onto the metasurface at a relatively high angle of incidence for efficient steering thereof.

According to various embodiments, the difference between the indices of refraction of the prism and free space (e.g., a fluid, such as air, a gas, a liquid, or empty space) results in the steered optical radiation being further refracted into the far-field. That is, the prism may further operate to deflect the steered output optical radiation between a first transmit angle and a second transmit angle, wherein the difference between the first transmit angle and the second transmit angle is greater than the difference between the first steering angle and the second steering angle defining the steering range of the metasurface. As an example, the metasurface may steer the optical radiation between −90 degrees and 90 degrees in the prism. At extreme steering angles, the prism may further refract the steered optical radiation by an additional 30 degrees, such that the transmitted steering angle range of the optical system extends from −120 degrees to 120 degrees.

In some examples, the optical assembly may include (in addition to or alternative to a prism) one or more optical lenses, optical mirrors, polarization gratings, polarizing beam splitter elements (e.g., beam splitter plates or cubes), half-wave plates, quarter-wave plates, and/or combinations thereof. In some embodiments, the prism may operate to implement additional modifications to the optical radiation generated by the optical source prior to incidence on the metasurface and/or to the steered optical radiation transmitted by the tuned metasurface. For example, the prism may be configured to additionally collimate and/or modify a polarization state of at least some of the optical radiation generated by the optical radiation source prior to incidence on the metasurface. In some embodiments, modifications to the polarization states of the optical radiation may be performed by optical devices (e.g., waveplates, gratings, etc.) between the prism and the optical radiation source and/or integrated into or attached to one or more faces of the prism.

The optical transmission system may include an integrated or externally connected controller that may be implemented as an applicant-specific integrated circuit (ASIC), via programmable logic, as a microprocessor, as a microcontroller, as a field-programmable gate array (FPGA) or another combination of hardware and/or software.

The controller of the optical transmission system may be configured to cause the optical radiation source to generate optical radiation and tune the metasurface to deflect incident optical radiation as output optical radiation steered at a target steering angle between the first steering angle and the second steering angle.

In some embodiments, the tunable optical metasurface may be a one-dimensionally steerable metasurface that steers the optical radiation between the first steering angle and the second steering angle along one axis (e.g., referred to as an "azimuth axis" herein, regardless of the orientation of the system). The optical radiation in the far-field is a transmit scan line having a narrow width along the azimuth axis and a height in the elevation axis (perpendicular to the azimuth axis in the far-field).

The height in the elevation axis of a transmitted scan line of steered optical radiation can be influenced by diverging optical elements (e.g., traditional lenses, lenslet arrays, diffusers, free form optics, etc.) to diffuse transmitted optical radiation in the elevation axis and the angle of incidence of the optical radiation from the optical radiation source in the axis corresponding to the elevation axis after deflection (e.g., reflection or refraction) by the metasurface.

Accordingly, as described herein, the system may utilize a set of VCSELs as the optical radiation source that includes a first subset of VCSELs that can be activated to generate optical radiation for incidence on the tuned metasurface at a first angle of incidence for unsteered deflection by the metasurface at a first elevation angle. The set of VCSELs may include a second subset of VCSELs that can be activated to generate optical radiation for incidence on the tuned metasurface at a second angle of incidence for unsteered deflection by the metasurface at a second elevation angle. Any number of different subsets of the VCSELs can be selectively activated to generate optical radiation for incidence on the tuned metasurface at varying angles of incidence for unsteered deflection by the metasurface at various, corresponding elevation angles.

In such embodiments, the metasurface steers the incident optical radiation along the azimuth axis, and optical elements may cause the transmitted optical radiation to diffuse or diverge along the elevation axis. For example, the transmitter or optical transmission system may include a field-of-view optical assembly to expand the field of view in the elevation axis by diffusing or diverging the optical radiation along the elevation axis. Even in such embodiments, the center transmission angle along the elevation axis and the total height of the transmitted scan line along the elevation axis can be at least partially controlled by the selective activation of different subsets of the VCSELs. In such embodiments, the optical transmission system allows for steering of the optical radiation in one direction via a one-dimensionally steerable tunable optical metasurface. The optical transmission system allows for quasi or effective steering of the optical radiation in the other, orthogonal direction via the selective application of different subsets, rows, or offset rows of VCSELs in an array of VCSELs.

In these embodiments, the controller of the optical transmission system may be configured to activate one or more subsets, rows, or groups of VCSELs to generate optical radiation for divergence along a target elevation angle. The controller may further tune the one-dimensionally steerable metasurface to deflect the incident optical radiation as output optical radiation steered at a target steering angle.

Some of the infrastructure that can be used with embodiments disclosed herein is already available, such as general-purpose computers, computer programming tools and techniques, digital storage media, and communication links. Many of the systems, subsystems, modules, components, and the like that are described herein may be implemented as hardware, firmware, and/or software. Various systems, subsystems, modules, and components are described in terms of the function(s) they perform because such a wide variety of possible implementations exist. For example, it is appreciated that many existing programming languages, hardware devices, frequency bands, circuits, software platforms, networking infrastructures, and/or data stores may be utilized alone or in combination to implement a specific control function.

It is also appreciated that two or more of the elements, devices, systems, subsystems, components, modules, etc. that are described herein may be combined as a single element, device, system, subsystem, module, or component. Moreover, many of the elements, devices, systems, subsystems, components, and modules may be duplicated or further divided into discrete elements, devices, systems, subsystems, components, or modules to perform subtasks of those described herein. Any of the embodiments described herein may be combined with any combination of other embodiments described herein.

To the extent used herein, a computing device, system, subsystem, module, driver, or controller may include a processor, such as a microprocessor, a microcontroller, logic circuitry, or the like. A processor may include one or more special-purpose processing devices, such as application-specific integrated circuits (ASICs), programmable array logic (PAL), programmable logic array (PLA), a programmable logic device (PLD), field-programmable gate array (FPGA), or other customizable and/or programmable device. The computing device may also include a machine-readable storage device, such as non-volatile memory, static RAM, dynamic RAM, ROM, CD-ROM, disk, tape, magnetic, optical, flash memory, or another machine-readable storage medium. Various aspects of certain embodiments may be implemented or enhanced using hardware, software, firmware, or a combination thereof.

The components of some of the disclosed embodiments are described and illustrated in the figures herein to provide specific examples. Many portions thereof could be arranged and designed in a wide variety of different configurations. Furthermore, the features, structures, and operations associated with one embodiment may be applied to or combined with the features, structures, or operations described in conjunction with another embodiment. In many instances, well-known structures, materials, or operations are not shown or described in detail to avoid obscuring aspects of this disclosure. The right to add any described embodiment or feature to any one of the figures and/or as a new figure is explicitly reserved.

The embodiments of the systems and methods provided within this disclosure are not intended to limit the scope of the disclosure but are merely representative of possible embodiments. In addition, the steps of a method do not necessarily need to be executed in any specific order, or even sequentially, nor do the steps need to be executed only once. As previously noted, descriptions and variations described in terms of transmitters are equally applicable to receivers, and vice versa.

FIG. 1 illustrates an example of a tunable liquid crystal metasurface (LCM) 100, according to one embodiment. The tunable LCM 100 can, for example, be used as part of a solid-state optical transmitter system, receiver system, or transceiver system. As illustrated, the tunable LCM 100 includes an optically reflective substrate 190 and a dielectric layer 195. A plurality of elongated rails 191 are arranged at sub-wavelength intervals on the optically reflective substrate 190 and electrically separated by the dielectric layer 195. The elongated rails 191 may be referred to herein as "resonator rails" because the gaps between them (filled with liquid crystal or other dielectrics that can be tuned to adjust a refractive index thereof) are resonant within the optical operational bandwidth of the LCM 100. Liquid crystal or another refractive index tunable dielectric material 193 is positioned between the elongated rails 191. A controller or metasurface driver (not illustrated) may apply voltage differential bias patterns to the elongated rails 191 to modify a reflection phase of the resonator (or transmission phase of the resonator in transmissive designs). The combination of phase delays imparted from all the resonators creates constructive interference in a desired beam steering direction.

Additional descriptions, variations, functionalities, and usages for optical metasurfaces are described in U.S. Pat. No. 10,451,800 granted on Oct. 22, 2019, entitled "Plasmonic Surface-Scattering Elements and Metasurfaces for Optical Beam Steering;" U.S. Pat. No. 10,665,953 granted on May 26, 2020, entitled "Tunable Liquid Crystal Metasurfaces;" and U.S. Pat. No. 11,092,675 granted on Aug. 17, 2021, entitled "LiDAR Systems based on Tunable Optical Metasurfaces," each of which is hereby incorporated by reference in its entirety. Many of the metasurfaces described in the above-identified U.S. patents include parallel rails positioned above a two-dimensional or planar reflective surface or layer.

Figure 2A:
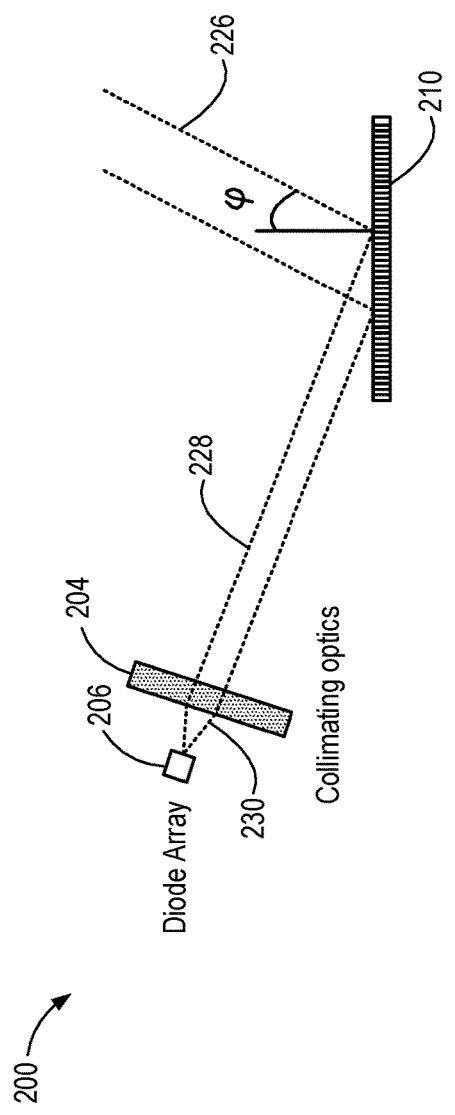
FIG. 2A illustrates a side view of an optical path of a transmitter of a solid-state LiDAR system, according to one embodiment.

FIG. 2A illustrates a side view of the optical path of a transmitter of a solid-state LiDAR system 200, according to one embodiment. As previously described, one or more diodes (such as laser diode array 206) generate optical radiation 230 that passes through collimating optics 204 as collimated optical radiation 228. The collimated optical radiation 228 is reflected by a transmit metasurface 210 as transmitted optical radiation 226. According to the illustrated embodiment, the transmitted optical radiation 226 is steered along an azimuth axis at an angle, cp. As is generally understood in the concept of LiDAR detection systems, the transmitted optical radiation 226 may rebound off one or more distant objects and return as rebounded optical radiation to be detected and measured by a detection system.

Figure 2B:
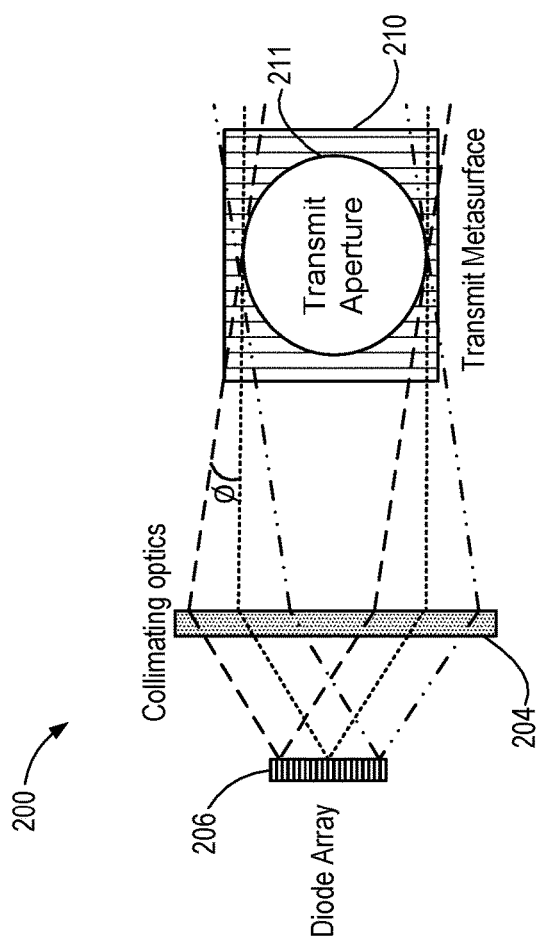
FIG. 2B illustrates a top view of an example optical path of the solid-state LiDAR system.

FIG. 2B illustrates a top view of an example optical path of the transmitter of the solid-state LiDAR system 200 of FIG. 2A. One or more optical sources (e.g., an array of diodes 206, as illustrated) transmits optical radiation through collimating optics 204 to the transmit metasurface 210. Specifically, the optical radiation from the array of diodes 206 is collimated by collimating optics 204 to a transmit aperture region 211 on the transmit metasurface 210.

Figure 3:
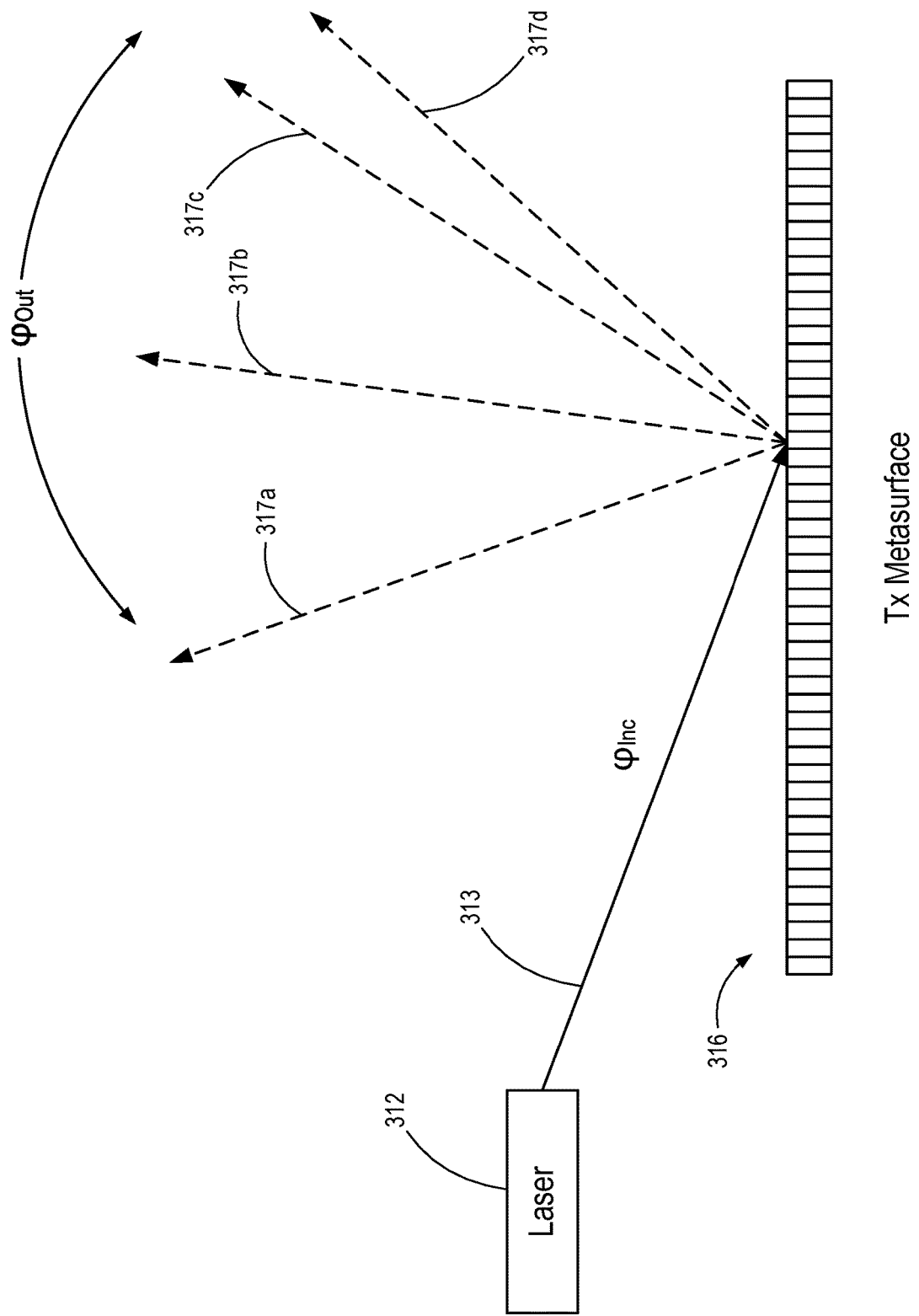
FIG. 3 illustrates a block diagram of a transmit metasurface with an angle of incidence, according to one embodiment.

FIG. 3 illustrates a block diagram of a transmit metasurface 316 that receives optical radiation 313 at a first angle of incidence, ($\varphi_{Inc}$, from a laser 312. The transmit metasurface 316 can be reconfigured or tuned (e.g., by a voltage controller) to transmit beamformed optical radiation 313 at a target steering angle (e.g., one of the steering angles 317a-d).

Figure 4A:
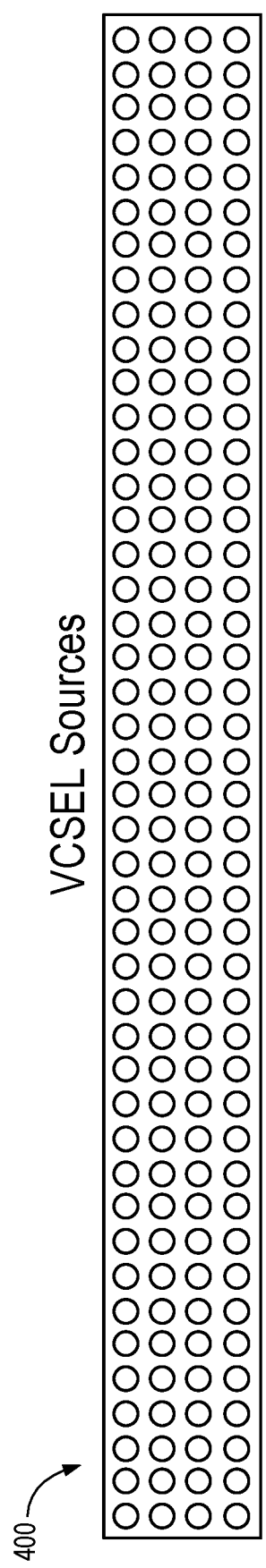
FIG. 4A illustrates an array of vertical-cavity surface-emitting lasers (VCSELs), according to one embodiment.

FIG. 4A illustrates an array of vertically aligned rows of vertical-cavity surface-emitting lasers (VCSELs) 400, according to one embodiment. VCSELs emit light perpendicular to the surface of the substrate and tens, hundreds, or thousands of VCSELs may be arranged in rows and columns on a single chip for use as an optical radiation source in many of the embodiments described herein. Individual or groups of VCSELs may be selectively activated to control the total power output and/or angle at which the optical radiation is incident on the metasurface. In some embodiments, a controller can individually address and selectively activate each VCSEL, groups of VCSELs, rows of VCSELs, columns of VCSELs, and/or tiles or subsets of VCSELs.

Figure 4B:
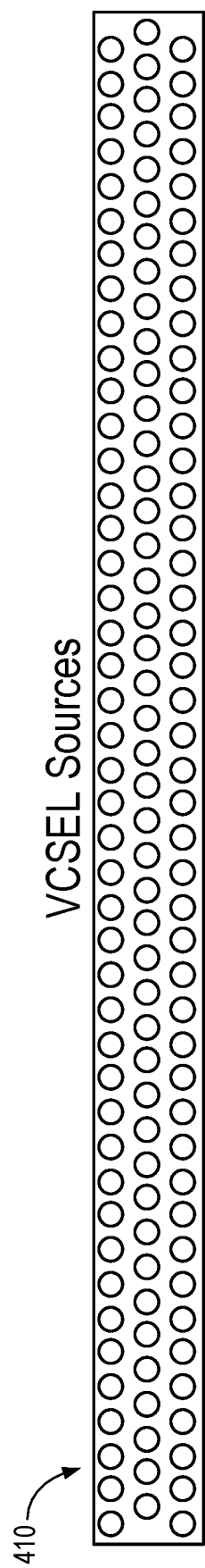
FIG. 4B illustrates an array of offset rows of VCSELs, according to one embodiment.

FIG. 4B illustrates an example of an array of offset rows of VCSELs 410, according to one embodiment. As previously described, the controller may selectively activate individual groups, rows, columns, or tiles of VCSELs. For example, each of a plurality of tiles of VCSELs may be individually activated and deactivated by the controller. Each tile may be defined by, for example, an N×M array of VCSELs, where N is an integer number of rows of VCSELs and M is an integer number of columns of VCSELs.

Figure 5:
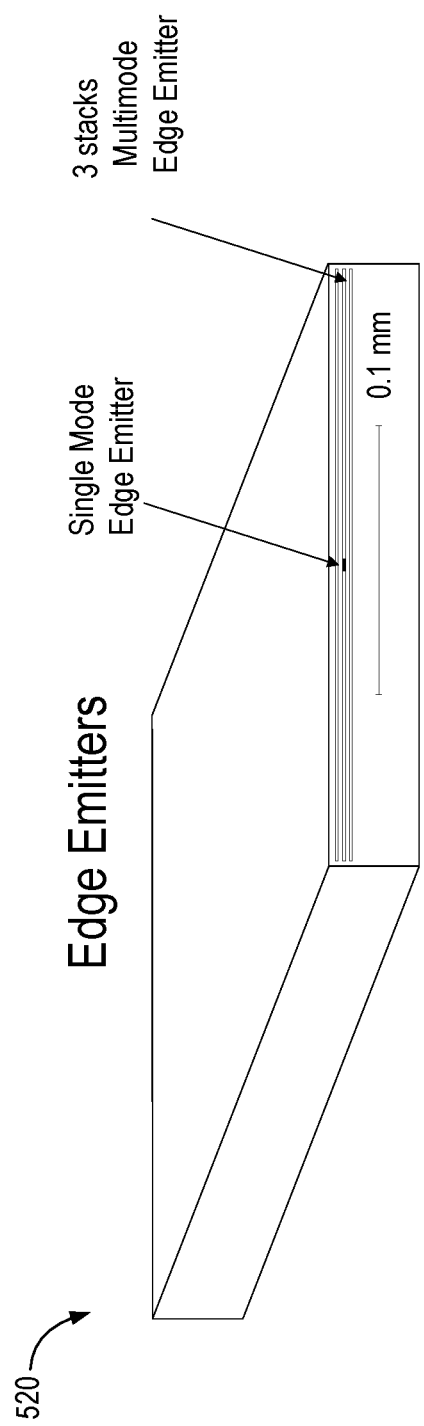
FIG. 5 illustrates an example of edge emitter light sources, according to one embodiment.

FIG. 5 illustrates an example of edge emitter light sources 520, according to one embodiment. Edge emitter light sources 520 may be used as the optical radiation source in many of the embodiments described herein.

Figure 6B:
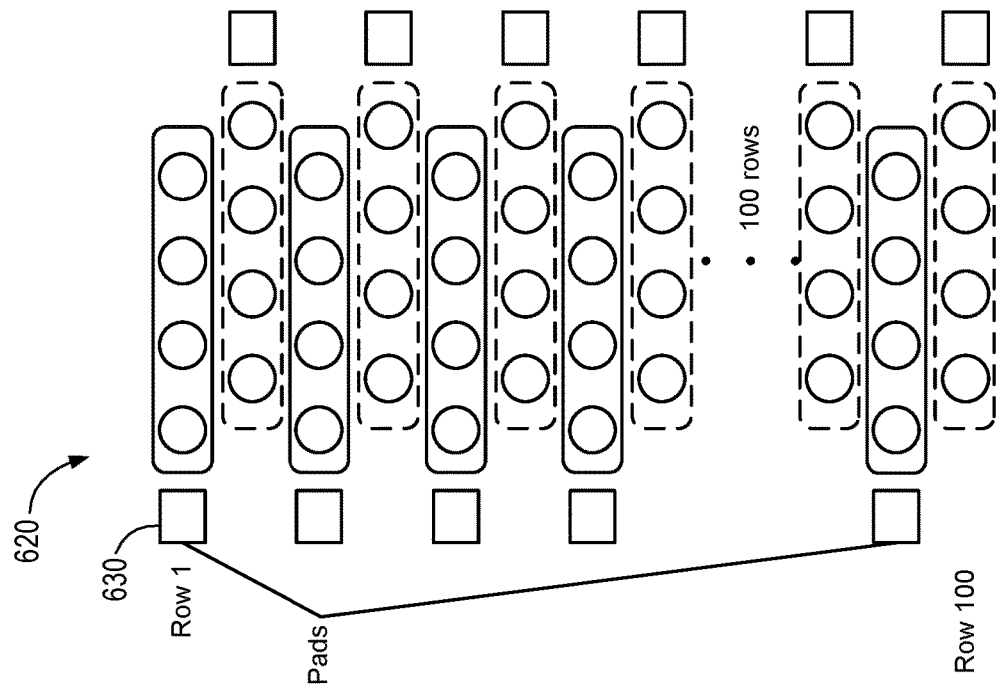
FIG. 6B illustrates another example of offset rows of VCSEL sources, according to one embodiment.
Figure 6A:
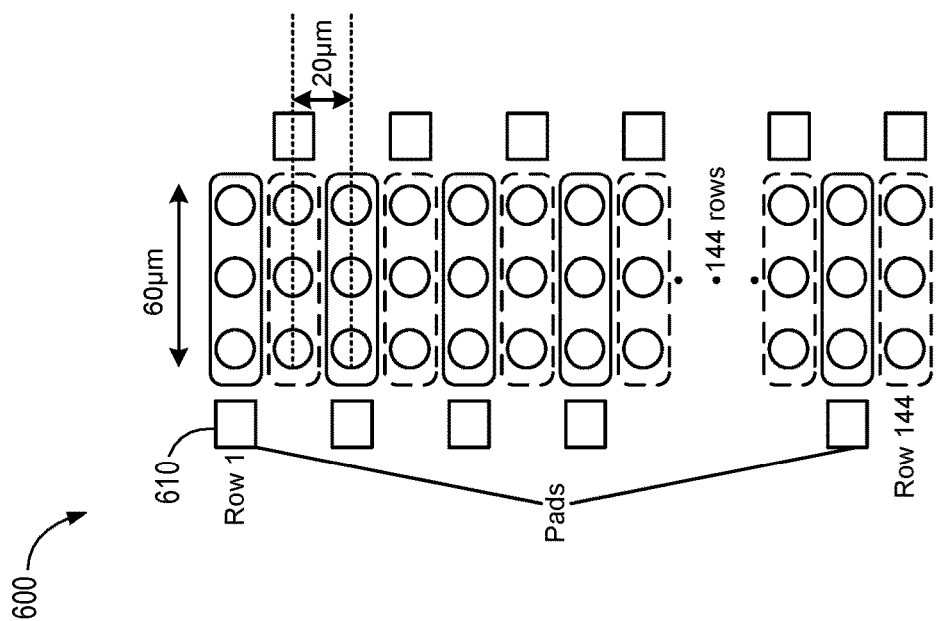
FIG. 6A illustrates an example of rows of VCSEL sources, according to one embodiment.

FIG. 6A illustrates an array of VCSEL sources 600 arranged with bond pads 610 for electrical connection to a controller, according to one embodiment. Example dimensions of 144 rows of VCSELs are provided with 20-micrometer on-center spacing. Three columns of VCSELs may be approximately 60 micrometers wide with bond pads 610 positioned on alternating sides of the array for every other row of VCSELs, such that each row of VCSELs is individually addressable by a controller. The exact on-center spacing, the number columns of VCSELs, and/or the width of the columns of VCSELs may vary based on the specific implementation.

FIG. 6B illustrates another example of an array of VCSEL sources 620 with offset rows, according to one embodiment. Again, bond pads 630 may be arranged on alternating sides of the array for every other row of VCSELs. In the illustrated example, each row of VCSELs includes 4 VCSELs, and the array includes 100 rows of VCSELs. In alternative embodiments, the optical radiation source may include any number of VCSELs in an N×M array of vertically aligned or vertically offset rows, where N and M are arbitrary integer values.

Figure 6D:
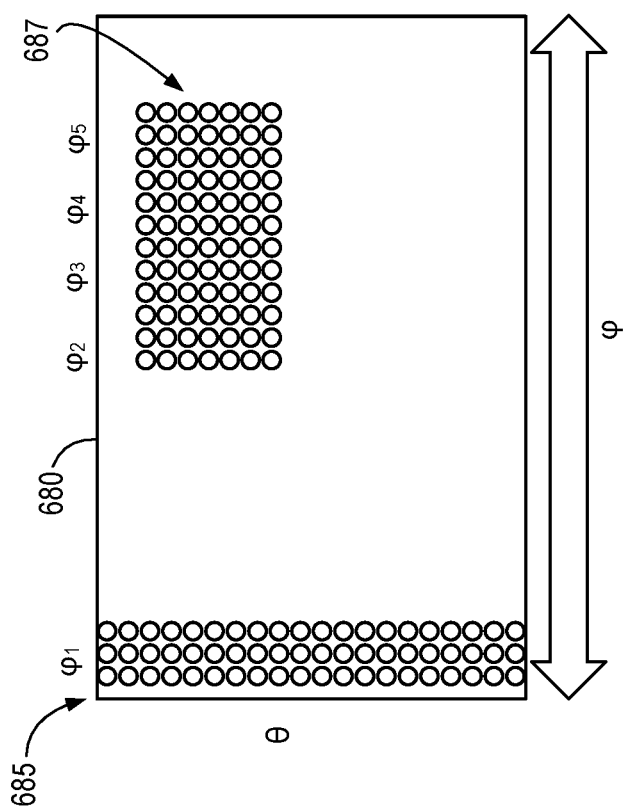
FIG. 6D illustrates examples of far-field illumination via full and partial activation of rows of VCSEL sources, according to one embodiment.
Figure 6C:
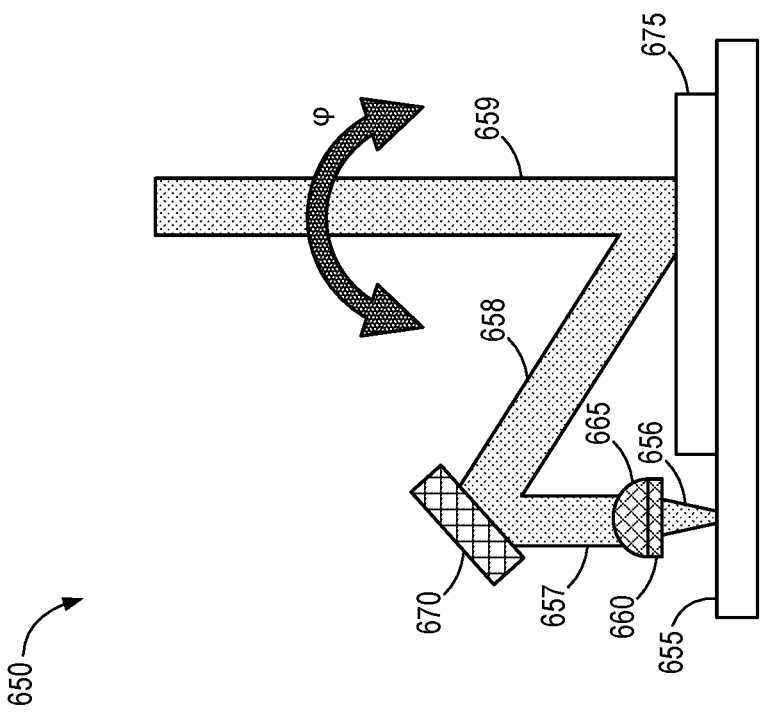
FIG. 6C illustrates a tunable optical metasurface to steer incident optical radiation from an array of VCSEL sources, according to one embodiment.

FIG. 6C illustrates an optical transmission system 650, according to one embodiment, that includes a tunable optical metasurface 675 to steer incident optical radiation 658 from an array of VCSEL sources on a printed circuit board 655, according to one embodiment. In the illustrated embodiment, the VCSEL sources on the printed circuit board 655 generate optical radiation 656 that is collimated by an optical assembly 660 and 665 as collimated optical radiation 657. The optical assembly 660 and 665 may, for example, include a rotationally symmetric aspherical lens 665 and/or a polarization grating 660. The collimated optical radiation 657 is reflected by a reflective optical element 670 (which may be a polarization beamsplitter in some embodiments) for incidence on the metasurface 675.

As described herein, the metasurface 675 may be a voltage-controlled, tunable optical metasurface configured to be tuned for one-dimensional steering of the incident optical radiation 658 as transmitted optical radiation 659. The transmitted optical radiation 659 is steered along the azimuth axis, denoted by cp. As an example, the VCSEL optical radiation source on the printed circuit board 655 may include 20 rows of VCSELs that can be selectively activated and deactivated.

FIG. 6D illustrates examples of far-field illumination via full and partial activation of rows of VCSEL sources and different steering angles, according to one embodiment. The far-field is represented by the region 680. A controller (e.g., integrated within the printed circuit board 655) may tune the metasurface 675 to steer incident optical radiation 658 from all 20 rows of activated VCSELs at a steering angle φ1 to form an illumination pattern 685 in the far-field 680 that has a full elevation height along the height axis, denoted by 8. At a different time, the controller may tune the metasurface 675 to scan from steering angles φ2-φ5 with only rows 3-9 of the array of VCSELs activated to reduce the elevation height of the transmitted optical radiation to illuminate the region 687 in the far-field 680.

FIG. 7A illustrates an example of partial elevation illumination of steered optical radiation by partial activation of a VCSEL array 706, according to one embodiment. In the illustrated example, top rows of the VCSEL array 706 are activated to generate optical radiation incident on a metasurface 711 tuned to steer a first transmitted scan line 788 at a first steering angle, φ1, into the far-field of a region 795. An angle of illumination along an elevation axis, θ, of the first scan line 788 corresponds to the dynamically activated rows of the VCSEL array 706. The angle of illumination along the elevation axis, θ, is also affected by static optical characteristics of lenses, lenslet arrays, prisms, diffusers, field-of-view expanders, and the like that deflect transmitted optical radiation along the elevation axis, θ, after being steered by the metasurface 711.

In LiDAR systems, the first scan line 788 at the first steering angle, φ1, illuminates objects in the far-field 795 that reflect or rebound at least some of the transmitted optical radiation to be received by a receiver subsystem (not shown). A LiDAR controller (not pictured) may perform time-of-flight calculations (e.g., indirect and/or direct time-of-flight calculations) based on the time the first scan line 788 is transmitted and when reflected/rebounded optical radiation is received by a sensor of the receiver system. The LiDAR controller uses the time-of-flight calculations to calculate or otherwise determine the distance to objects that reflected/rebounded the optical radiation of the first scan line 788. A LiDAR imaging system may generate an image of objects in the far field by combining the time-of-flight range information to each object in the far-field.

As illustrated, the LiDAR controller may then tune the metasurface 711 to steer a second transmitted scan line 789 at a second steering angle, φ2, with only the upper rows of the VCSEL array 706 activated again. The process can be repeated for any number of steering angles along the azimuth axis. A target resolution in the azimuth axis can be attained by adjusting the width of each scan line and the number of scan lines within a given region. A target resolution in the elevation axis can be attained by using a sensor with a suitable number of optical detectors along the elevation axis. For a given number of sensor or detector elements, the resolution in the elevation axis can be increased by activating a different subset of the rows of the VCSEL array 706 at the first and second steering angles (e.g., to illuminate a lower portion(s) of the region 795 at the same steering angles).

As depicted and described in FIGS. 7B-7D below, various combinations of steering angles along the steering axis can be attained by tuning the metasurface 711. Similarly, various combinations of effective steering angles are possible along the elevation axis by selectively activating different rows of the VCSEL array 706. The refresh rate of LiDAR imaging is based, at least in part, on the time it takes for the scan lines to scan a region of interest in the far-field along both the steering axis (by tuning the metasurface) and the elevation axis (by selective activation of different rows of the VCSEL array 706).

Figure 7B:
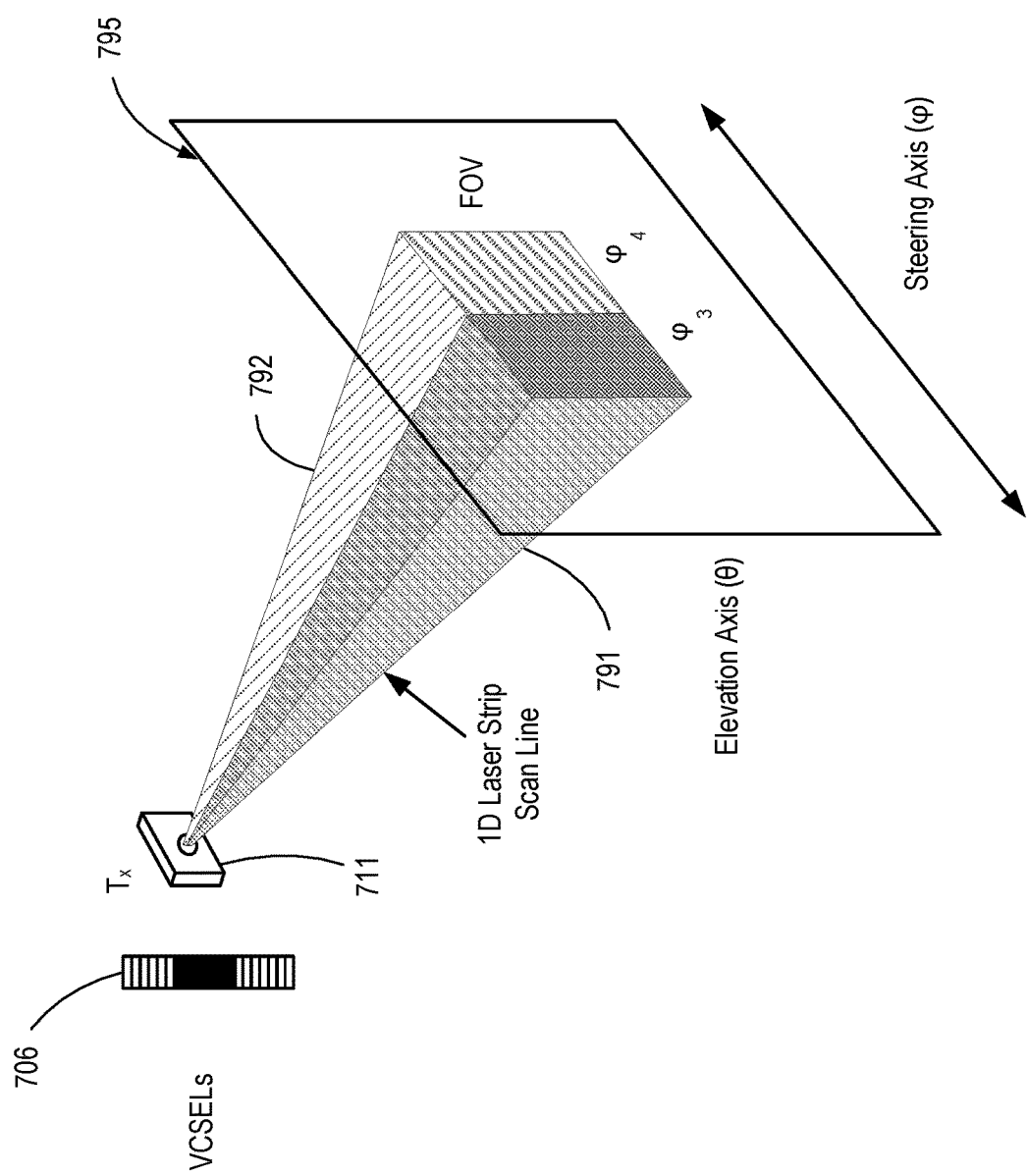
FIG. 7B illustrates another example of partial elevation illumination of steered optical radiation by activation of a different subset of the VCSEL array, according to one embodiment.

FIG. 7B illustrates another example of partial elevation illumination of steered optical radiation by activation of a different subset of the VCSEL array 706, according to one embodiment. As illustrated, a controller tunes the metasurface 711 to steer optical radiation 791 and 792 at steering angles φ3 and φ4 with a middle subset of the VCSEL array 706 activated (shown with shading).

Figure 7C:
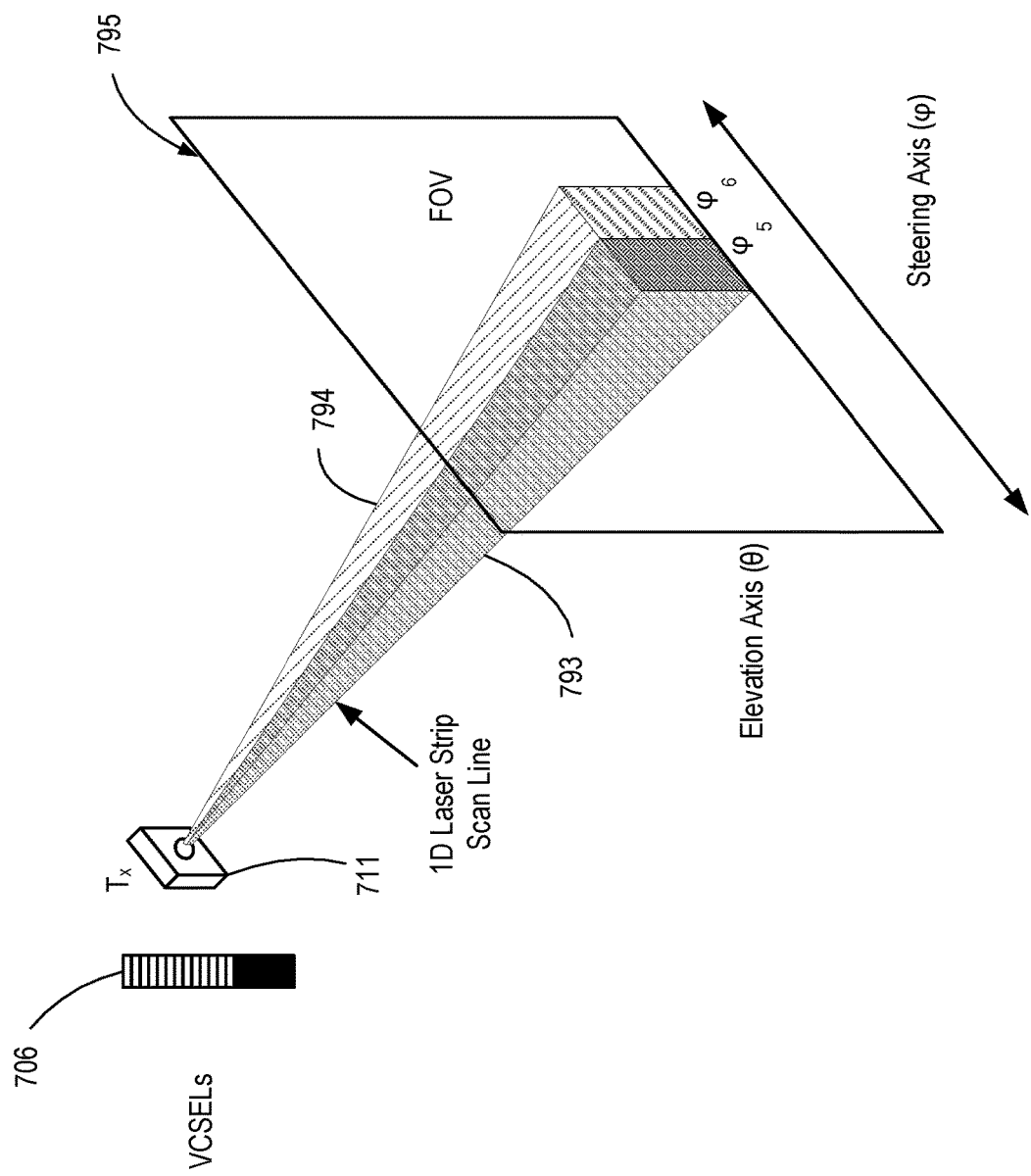
FIG. 7C illustrates another example of partial elevation illumination of steered optical radiation by activation of a different subset of the VCSEL array, according to one embodiment.

FIG. 7C illustrates another example of partial elevation illumination of steered optical radiation by activation of a different subset of the VCSEL array 706, according to one embodiment. As illustrated, a controller tunes the metasurface 711 to steer optical radiation 793 and 794 at steering angles φ5 and φ6 with a lower subset of the VCSEL array 706 activated (shown with shading).

Figure 7D:
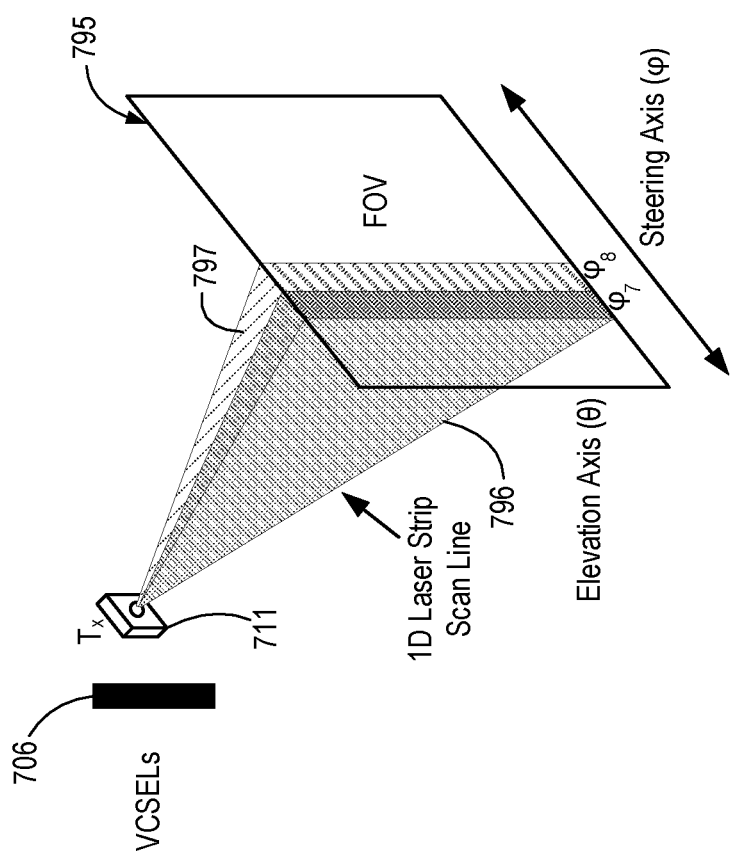
FIG. 7D illustrates an example of complete elevation illumination of steered optical radiation by activation of a different subset of the VCSEL array, according to one embodiment.

FIG. 7D illustrates an example of complete elevation illumination of steered optical radiation by activation of the entire VCSEL array 706, according to one embodiment. As illustrated, a controller tunes the metasurface 711 to steer optical radiation 796 and 797 at steering angles φ7 and φ8 with a lower subset of the VCSEL array 706 activated (shown with shading).

Many implementations of tunable optical metasurfaces operate to steer optical radiation with a single linear polarization. That is, optical radiation that does not have the correct linear polarization is not steered by the tunable optical metamaterial. Accordingly, a common approach is to use a polarization filter that passes only the optical radiation having the correct linear polarization for incidence on the tunable optical metamaterial. However, this results in optical losses and a reduction in power efficiency in terms of the power used to generate a given optical transmission. Some of the embodiments of the presently described systems and methods propose optical assemblies to convert all the optical radiation to the correct polarization for steering by the tunable optical metasurface.

Figure 8:
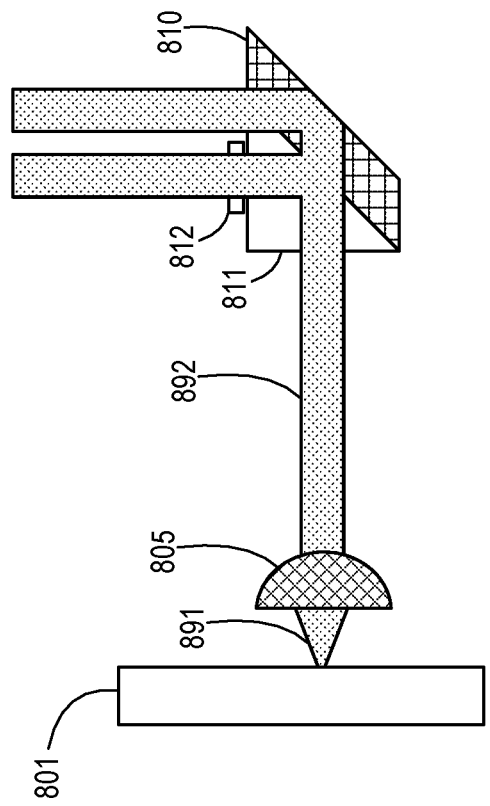
FIG. 8 illustrates an example of an optical assembly for polarization spatial combining of optical radiation from an unpolarized source, according to one embodiment.

FIG. 8 illustrates an example of an optical assembly for polarization spatial combining of optical radiation 891 from an unpolarized source 801, according to one embodiment. In the illustrated embodiment, the unpolarized optical radiation source 801 (e.g., on a printed circuit board) generates optical radiation 891 that is collimated by a lens 805 to form collimated optical radiation 892. The collimated optical radiation 892 is reflected by a combiner (polarization prism 811 and rhomboid 810) with a half-wave plate 812.

For example, a thin-film coating on the hypothenuse of the polarization prism 811 splits the collimated optical radiation into a first beam with a first linear polarization traveling in a first direction and a second beam with a second linear polarization orthogonal to the first linear polarization traveling in a second direction. The half-wave plate 812 rotates the polarization of the first beam to be the same as the linear polarization of the second beam. A rhomboid 810 is positioned on the hypotenuse face of the polarization prism 811 to deflect the second beam to travel in the same direction as the first beam. As illustrated, the polarization prism 811, half-wave plate 812, and the rhomboid 810 operate to linearly polarize the optical radiation generated by the unpolarized source 801 with minimal optical losses.

Figure 9:
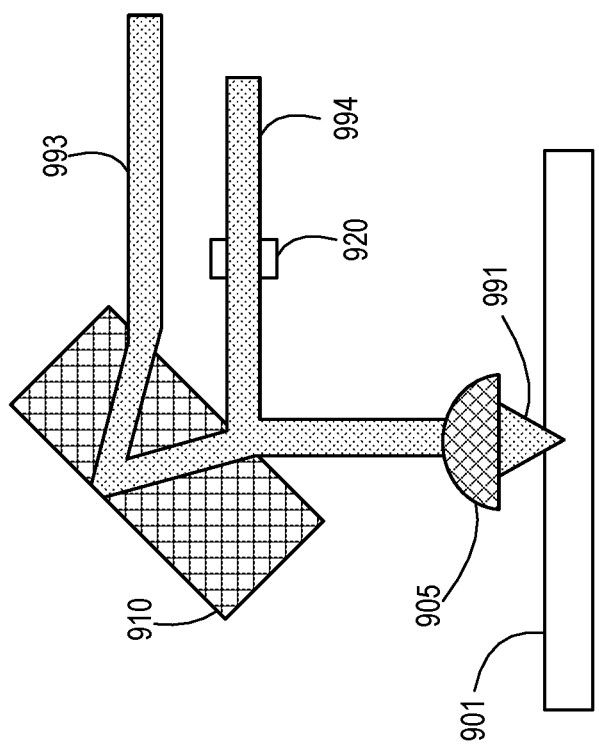
FIG. 9 illustrates another example of an optical assembly for polarization spatial combining of optical radiation from an unpolarized source, according to one embodiment.

FIG. 9 illustrates another example of an optical assembly for polarization spatial combining of optical radiation 991 from an unpolarized source 901, according to one embodiment. Again, the optical radiation 991 is collimated by a lens 905 and reflected by a polarizing beam splitter plate 910. One of the split beams 994 is passed through a half-wave plate 920 and the other split beam 993 is not.

Figure 10:
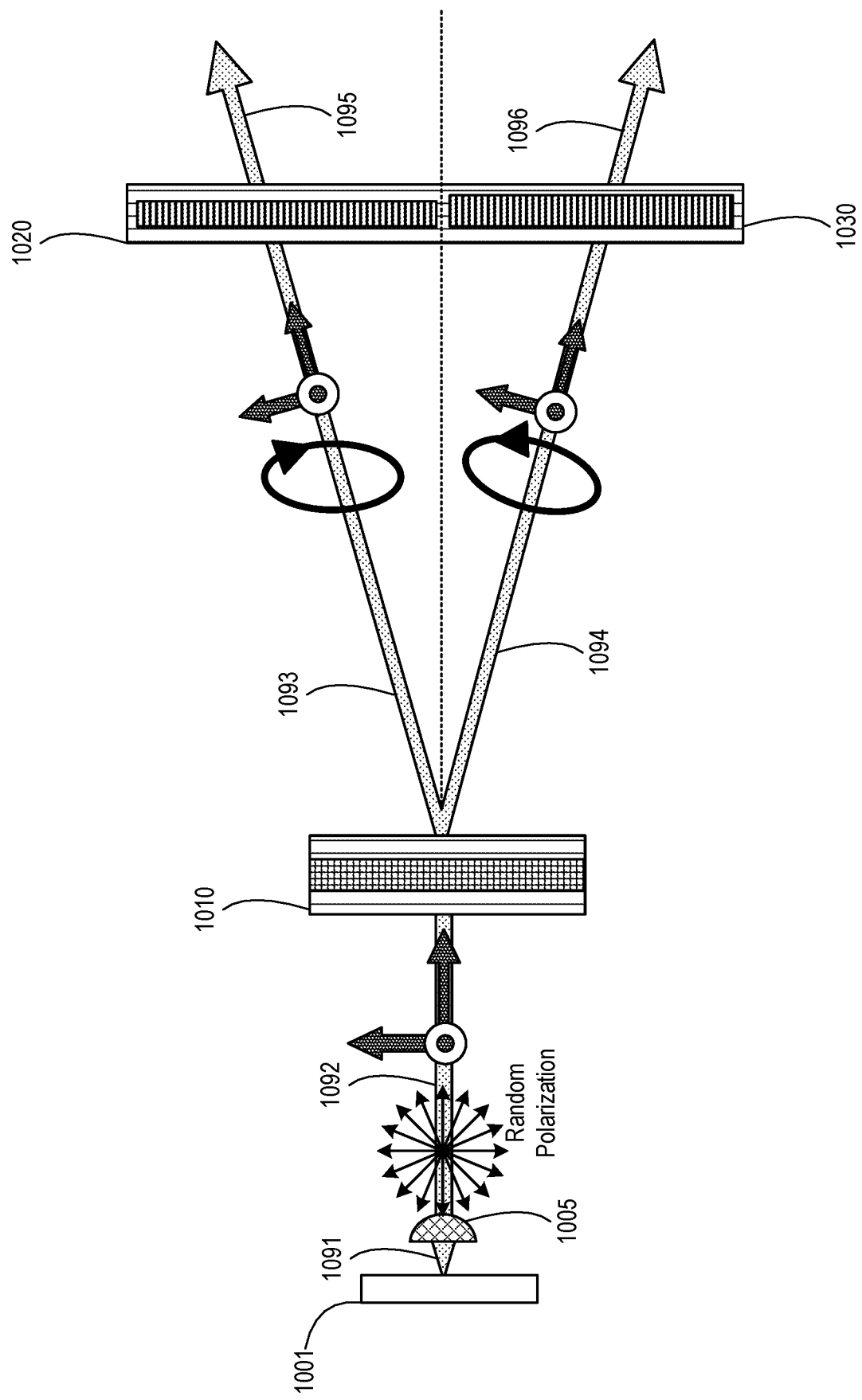
FIG. 10 illustrates another example of an optical assembly for polarization spatial combining of optical radiation from an unpolarized source, according to one embodiment.

FIG. 10 illustrates another example of an optical assembly for polarization spatial combining of optical radiation 1091 from an unpolarized source 1001, according to one embodiment. The optical radiation 1091 is collimated by a lens 1005 with random polarization. The collimated optical radiation 1092 passes through a polarization grating 1010 to generate optical radiation 1093 with right-handed circular polarization and optical radiation 1094 with left-handed circular polarization. The optical radiation 1093 is passed through a quarter-wave plate 1020 with a first clocking position (e.g., −45 degrees) to generate linearly polarized optical radiation 1095. The optical radiation 1094 is passed through a quarter-wave plate 1030 with a second clocking position that is 90 degrees out of phase with the first clocking position (e.g., +45 degrees) to generate linearly polarized optical radiation 1096.

Figure 11:
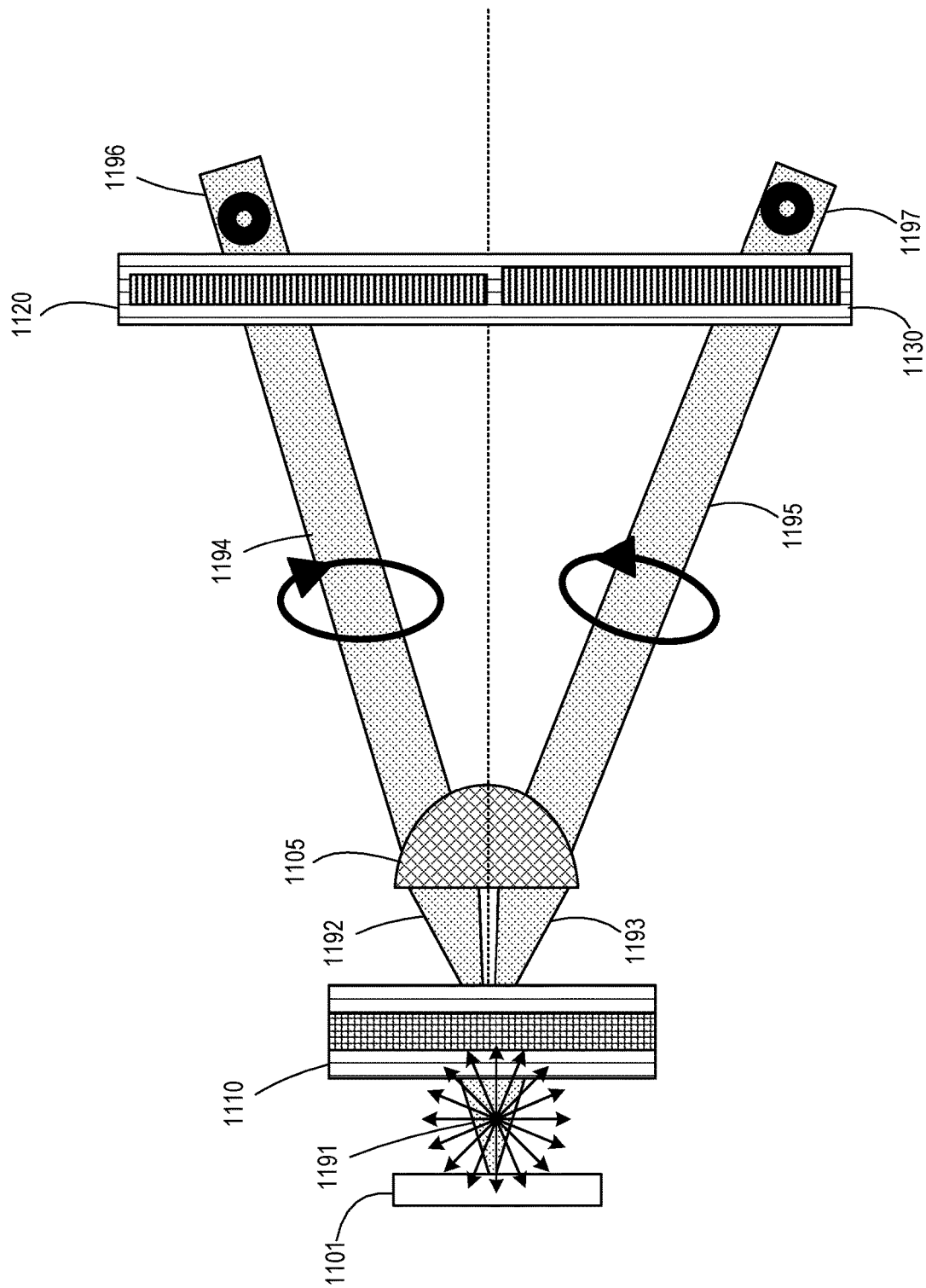
FIG. 11 illustrates another example of an optical assembly for polarization spatial combining of optical radiation from an unpolarized source, according to one embodiment.

FIG. 11 illustrates another example of an optical assembly for polarization spatial combining of optical radiation 1191 with random polarization from an unpolarized source 1101, according to one embodiment. In the illustrated embodiment, the optical radiation 1191 passes through a polarization grating 1110 before each beam 1192 and 1193 is collimated by a lens assembly 1105 as collimated optical radiation 1194 and 1195 with right-handed circular polarization and left-handed circular polarization, respectively. The beams of optical radiation 1194 and 1195 are passed through quarter-wave plates 1120 and 1130, respectively, to generate linearly polarized optical radiation 1196 and 1197, respectively. As in FIG. 10, the quarter-wave plates 1120 and 1130 may be on the same substrate with −45-degree and +45-degree clocking positions.

Figure 12A:
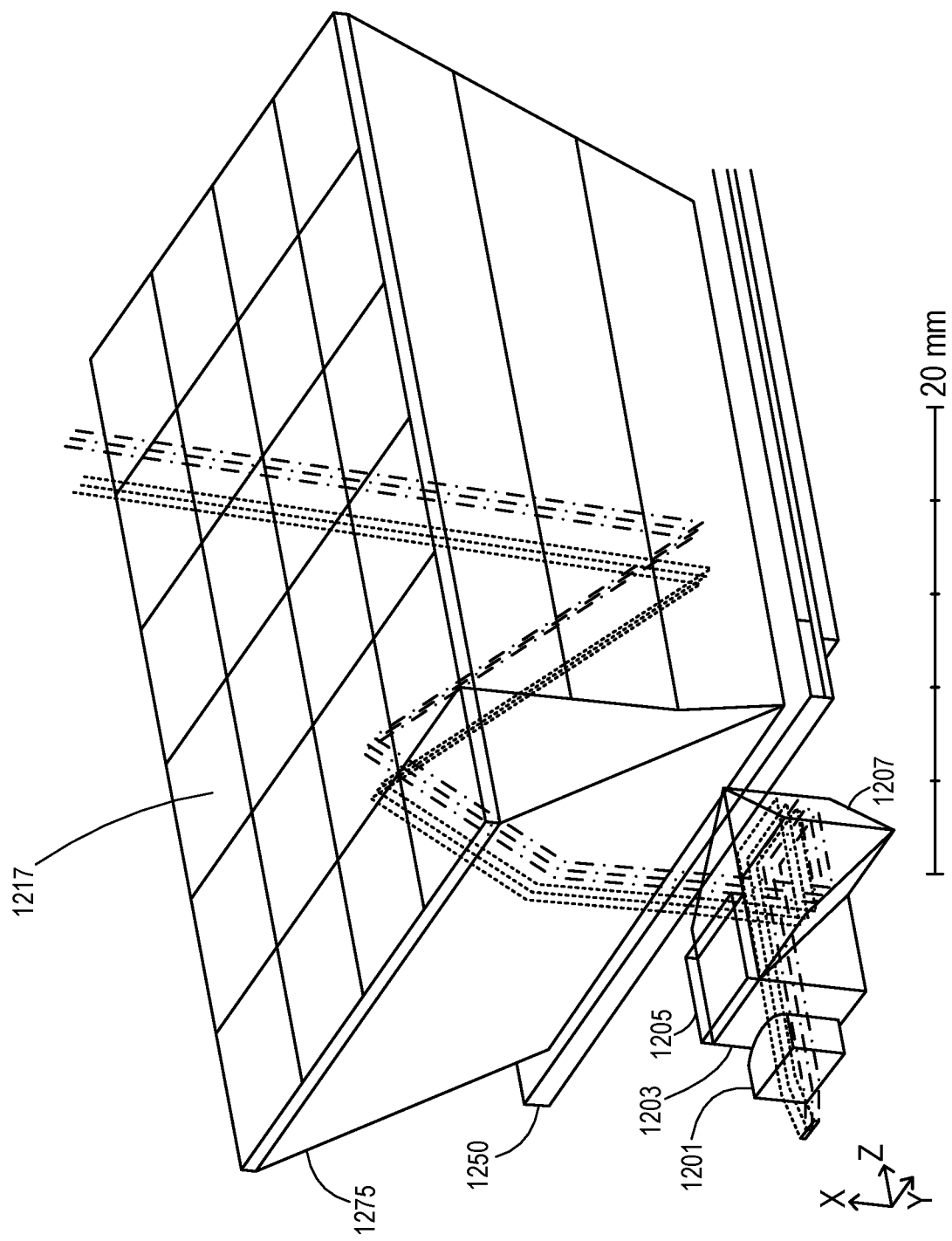
FIG. 12A illustrates two beams overlaid in the same plane using a half waveplate for the S-pol beam path through a prism to a metasurface, according to one embodiment.

FIG. 12A illustrates two beams (using different dashed lines) overlaid in the same plane using a half-wave plate 1205 for an S-pol beam path through a prism 1275 to a metasurface 1250 for reflection at a target steering angle, according to one embodiment. The optical radiation may be collimated, combined, and polarized via one or more lenses 1201, half-wave plate 1205, and a polarization beam splitter cube and/or prism assembly 1207 (e.g., three prisms or a cube).

As illustrated, the prism 1275 comprises a lower planar face that sits on top of the metasurface and an upper planar face 1217. The lower planar face and the upper planar face 1217 are parallel to one another. Many variations of prisms are described herein that show optical radiation being transmitted from an optical radiation source through a prism for transmission and steering by a tunable optical metasurface. However, it is appreciated that the illustrated embodiments of prisms and tunable optical metasurfaces can be used in reverse to receive optical radiation at a target steering angle and transmit the received optical radiation through the prism to a sensor (e.g., an array of diode sensors).

Figure 12B:
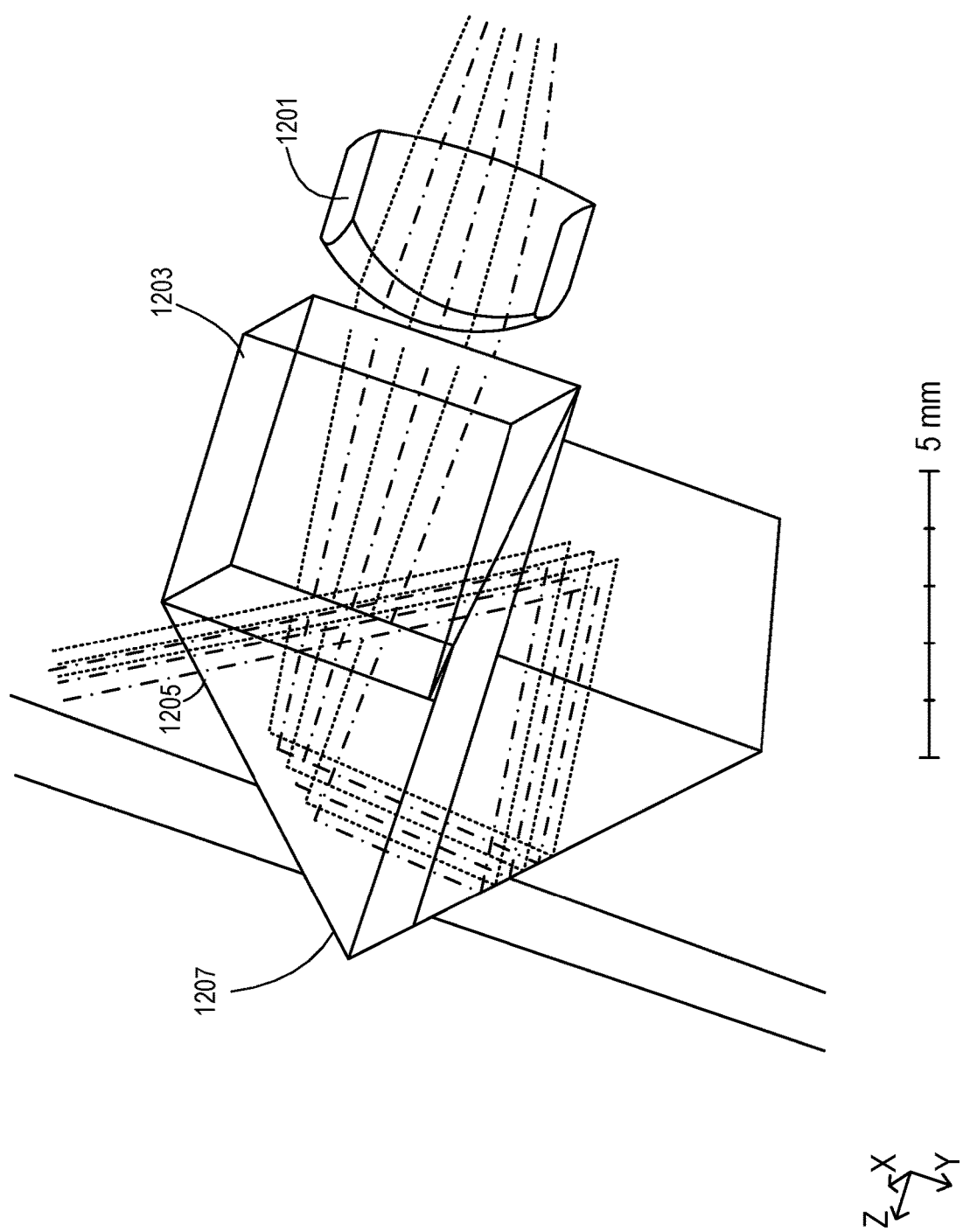
FIG. 12B illustrates another view of optical radiation directed through the prism to the metasurface, according to one embodiment.

FIG. 12B illustrates a bottom view of the optical radiation directed through the collimating lens, prism(s), polarizing beam splitter element, and half-wave plate (1201, 1203, 1205, and 1207) prior to being directed into the coupling prism of the metasurface, according to one embodiment.

Figure 12C:
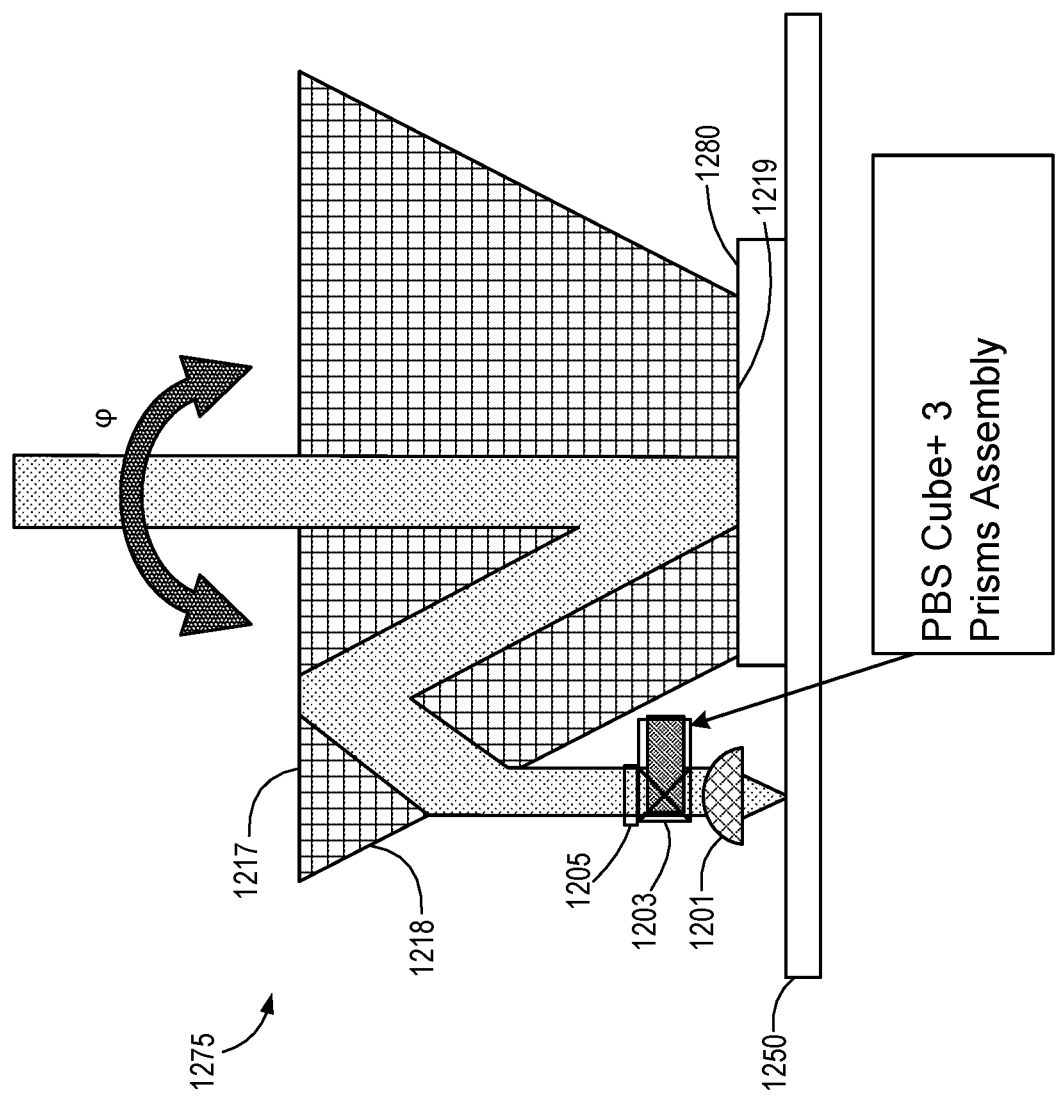
FIG. 12C illustrates a side view of the optical radiation directed through the prism to the metasurface, according to one embodiment.

FIG. 12C illustrates a side view of optical radiation from an optical radiation source on a printed circuit board 1250 collimated by a lens 1201. The collimated optical radiation is passed through a polarization beam splitter element and prism assembly 1203 and a half-wave plate 1205 before entering a lateral face of the coupling prism 1275. The optical radiation is incident on the lateral face of the coupling prism 1275 at an angle for refraction into the coupling prism 1275. The optical radiation is refracted within the coupling prism 1275 at an angle for internal reflection on the upper face of the prism toward a metasurface 1280 at a target angle of incidence.

The polarization beam splitter element and prism assembly 1203 operate to split the collimated optical radiation into a first beam and a second beam. One of the beams is passed through the half-wave plate 1205 such that both beams have the same linear polarization suitable for incidence on and steering by the tunable optical metasurface 1280.

As illustrated, the optical radiation is incident on the metasurface 1280 at a high angle of incidence (e.g., less than 45 degrees). Such a high angle of incidence is not possible in embodiments without a coupling prism 1275 without the optical radiation source or other optical elements blocking at least a portion of the steering aperture of the metasurface 1280. The metasurface 1280 is tunable to steer incident optical radiation for transmission between a first steering angle and a second steering angle (e.g., within a steering range) along a steering axis (e.g., again, referred to herein as the azimuth axis).

As illustrated, the coupling prism 1275 includes a lateral face 1218 that extends from an edge of the lower face 1219 of the coupling prism 1275 at an obtuse angle to an edge of the upper face 1217 of the coupling prism 1275. The linearly polarized and collimated optical radiation is transmitted through the lateral face 1218 (and refracted upon entry) at an angle for internal reflection by the upper surface 1217 of the prism coupling prism for incidence on the tunable optical metasurface 1280.

Figure 12D:
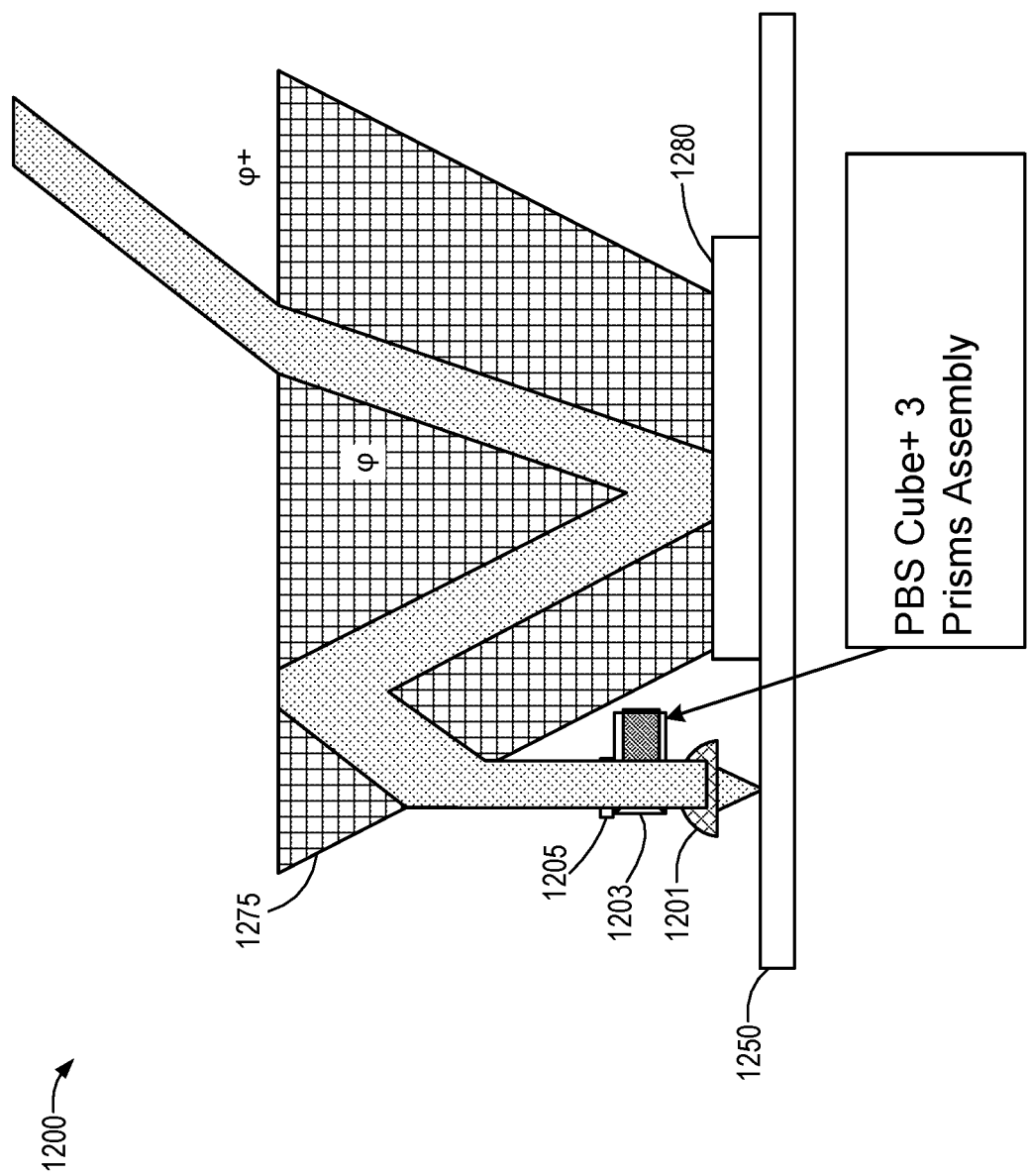
FIG. 12D illustrates the side view of the optical radiation transmission system steered to a steering angle, according to one embodiment.

FIG. 12D illustrates a side view of the optical radiation transmission system 1200 steered to a second steering angle, according to one embodiment. As illustrated, optical radiation is steered at a steering angle, φ, by the metasurface 1280. As the optical radiation leaves the coupling prism 1275, the optical radiation is refracted for transmission at a transmit steering angle, φ+, that is greater than the original steering angle, φ.

Figure 12E:
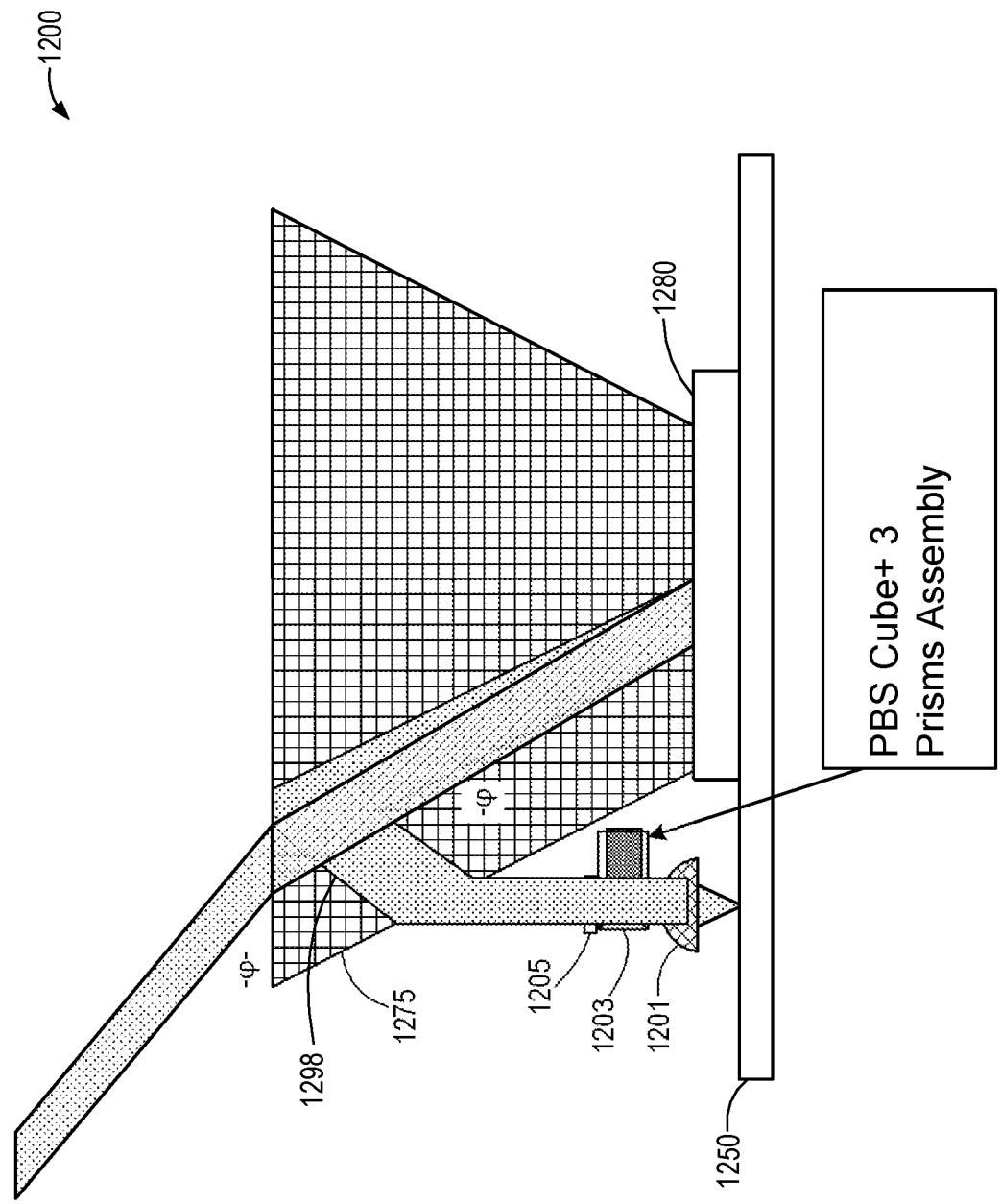
FIG. 12E illustrates the side view of the optical radiation transmission system steered to a third steering angle at which the transmitted optical radiation overlaps the optical radiation incident on the metasurface, according to one embodiment.

FIG. 12E illustrates the side view of the optical radiation transmission system 1200 steered to a third steering angle at which the transmitted optical radiation overlaps the incoming optical radiation from an optical source that is incident on the metasurface 1280, according to one embodiment. Again, the configuration and positioning of the coupling prism 1275 allow the incident optical radiation and the transmitted optical radiation to travel within a shared aperture without the optical radiation source (or associated mirrors or lens) blocking a portion of the aperture.

As illustrated, the metasurface 1280 steers the optical radiation at a steering angle, —φ. As the optical radiation leaves the coupling prism 1275, the optical radiation is refracted for transmission at a transmit steering angle, —φ—, that exceeds the original steering angle, φ—. Notably, the optical radiation 1298 that is internally reflected by the upper surface of the prism for incidence on the metasurface 1280 is incident on the internal surface of the prism at an angle greater than the critical angle of the prism 1275 such that it is reflected. In contrast, the optical radiation steered by the metasurface 1280 is incident on the internal surface of the prism 1275 at an angle less than the critical angle, such that the steered optical radiation is refracted out of the prism 1275 at the transmit steering angle.

Figure 13A:
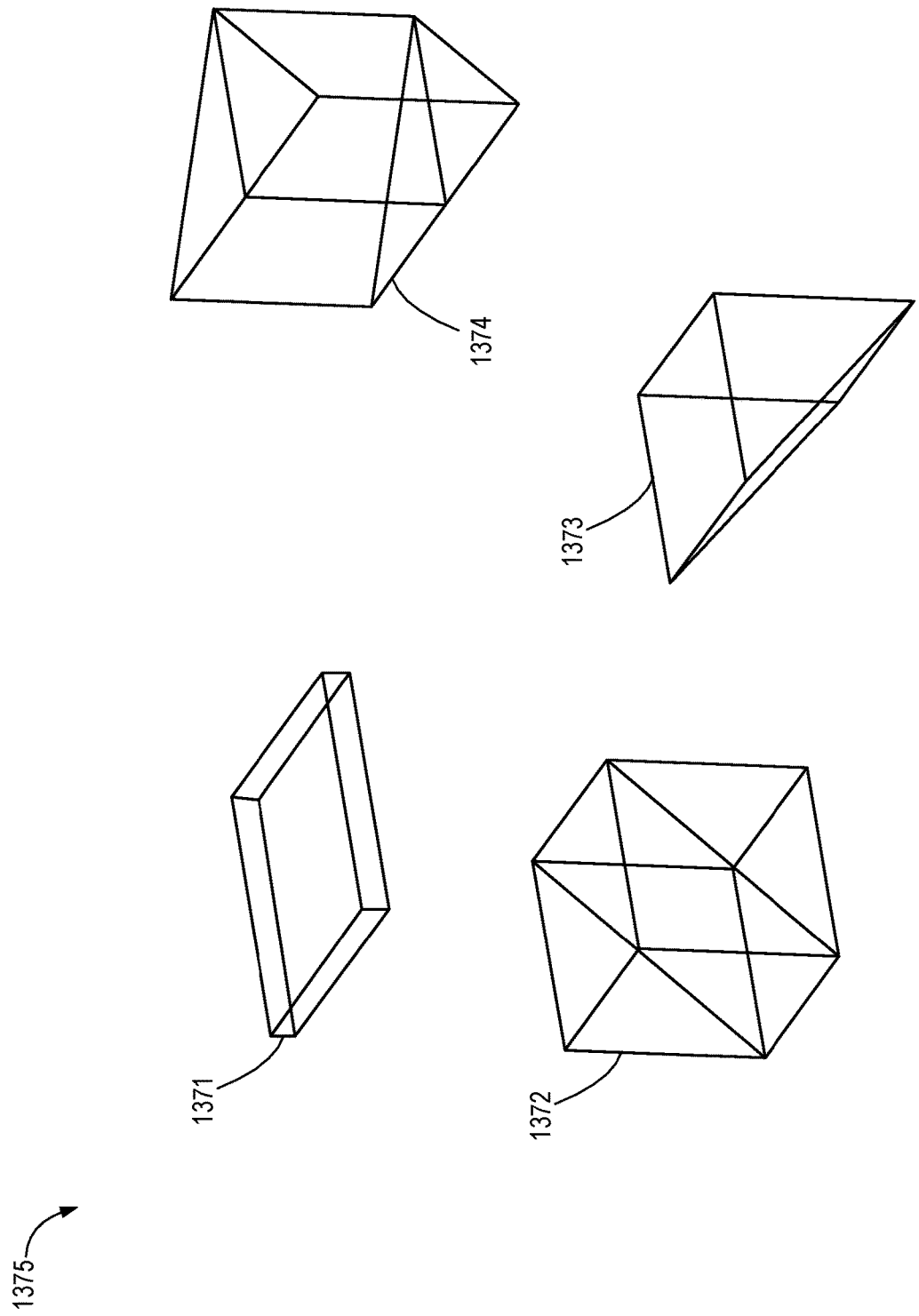
FIG. 13A illustrates example components of an optical prism assembly, according to various embodiments.

FIG. 13A illustrates example components of an optical assembly 1375 similar to the optical assembly described in conjunction with FIGS. 12A and 12B, according to various embodiments. As illustrated, the optical assembly 1375 includes a half-wave plate 1371, a polarizing beam splitter element 1372, a large right-angle prism 1374, and an output right-angle prism 1373. In various embodiments, the large right-angle prism 1374 may be formed as a single element or as two elements joined together.

Figure 13B:
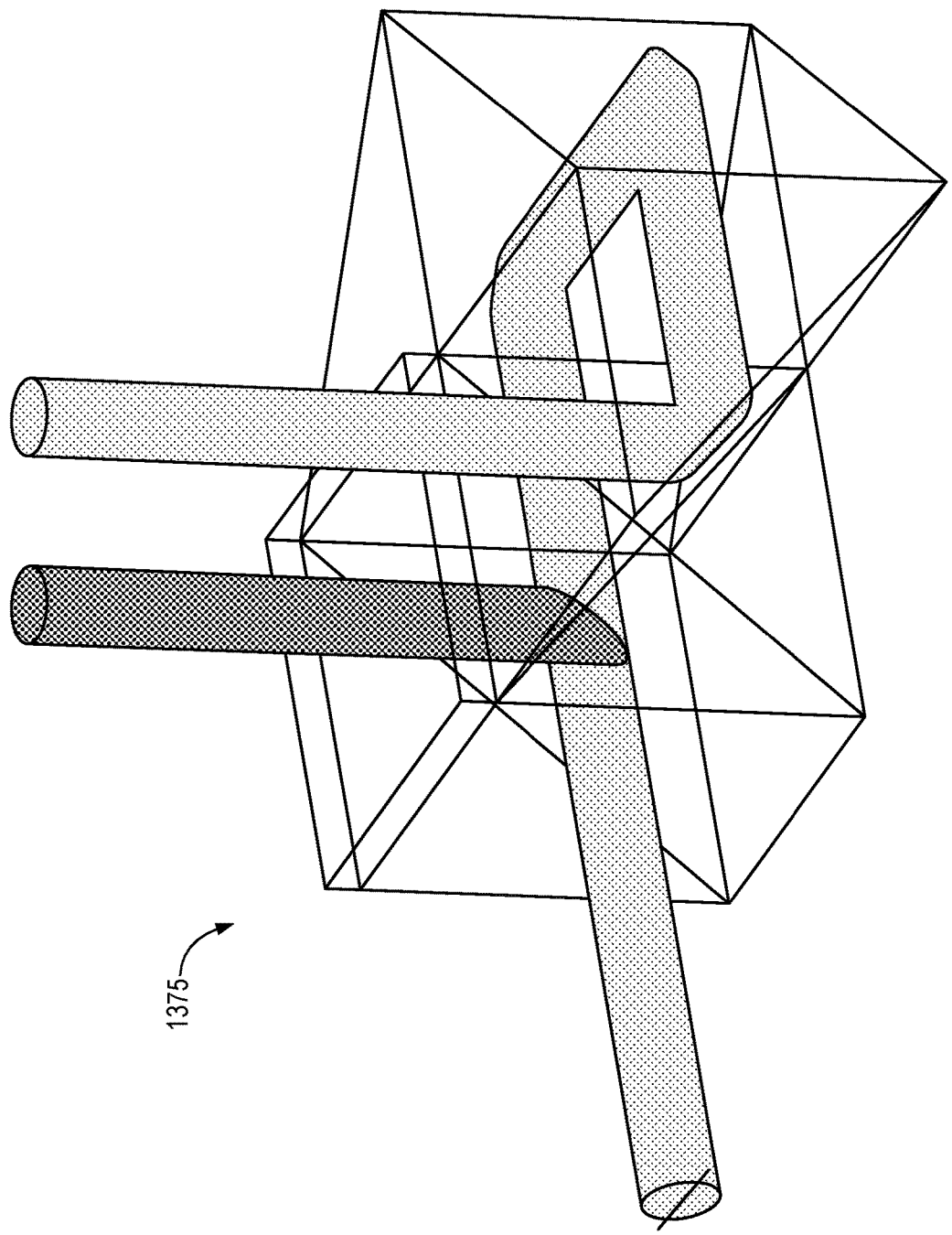
FIG. 13B illustrates an optical path through the optical prism assembly, according to one embodiment.
Figures 14A, 14B:
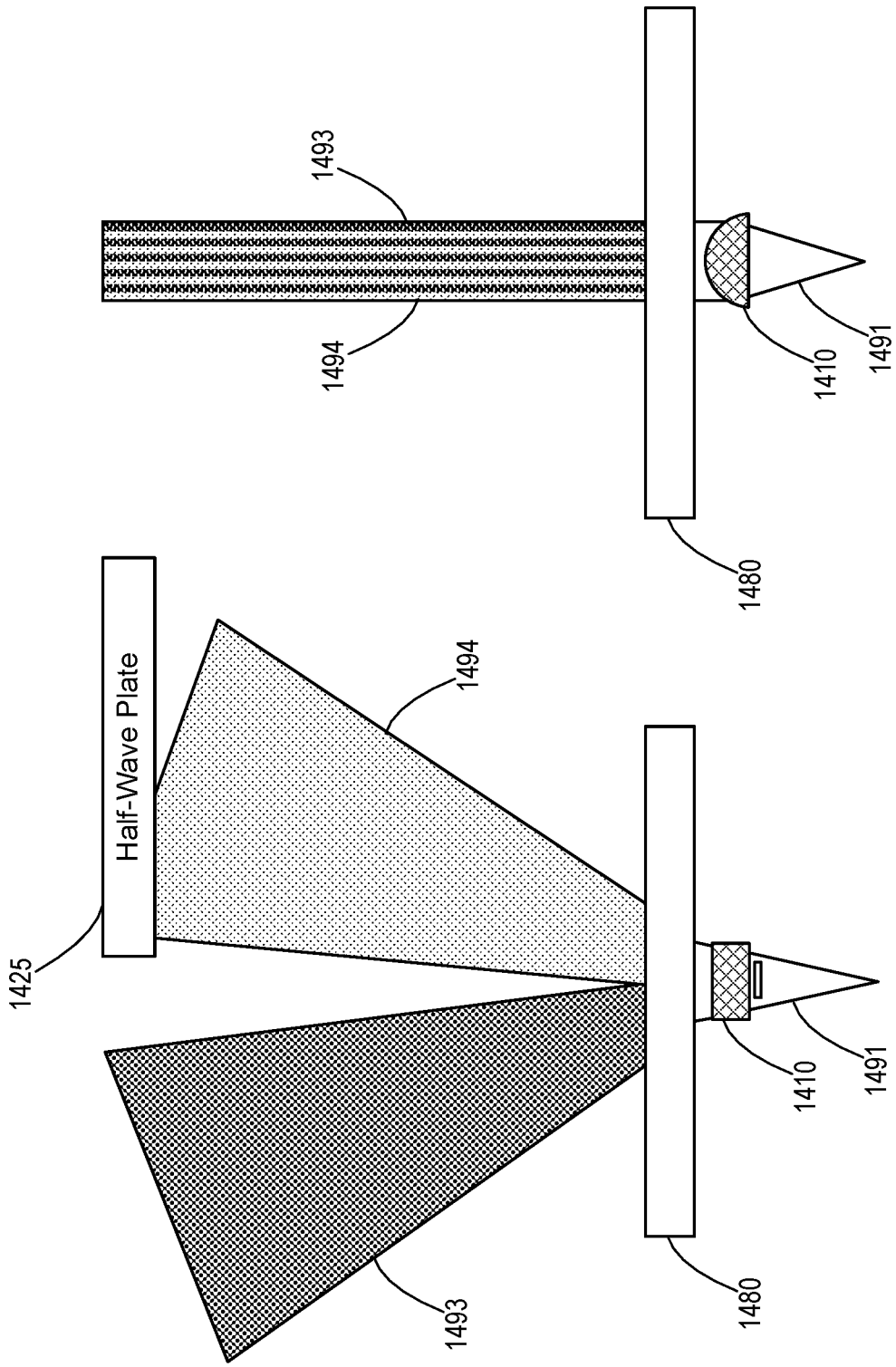
FIGS. 14A-D illustrate example views of a transmissive (e.g., refractive) metasurface with a half waveplate, according to various embodiments.
Figure 14D:
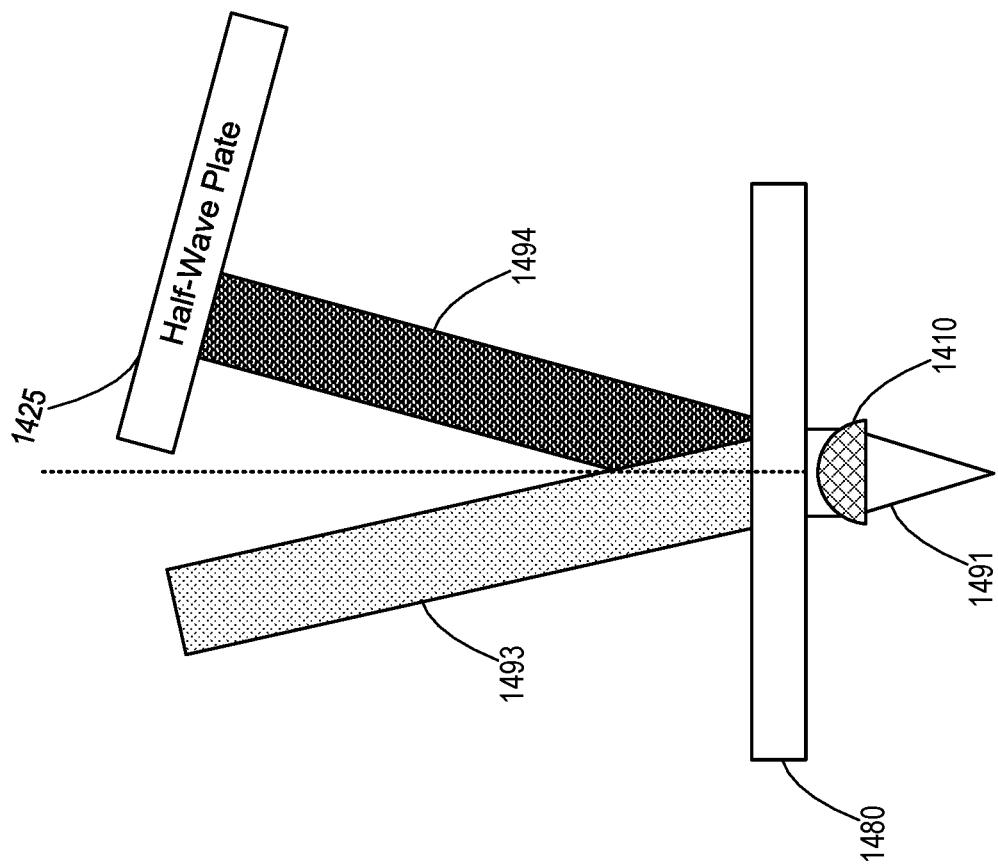
Figure 14C:
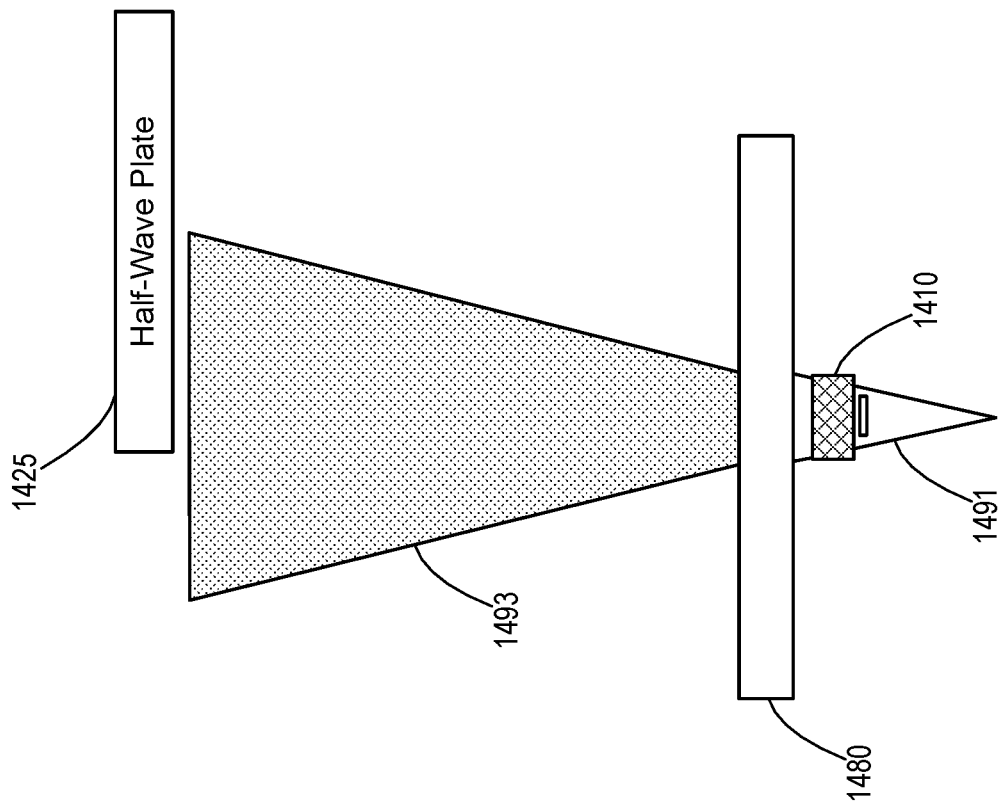
Figure 15D:
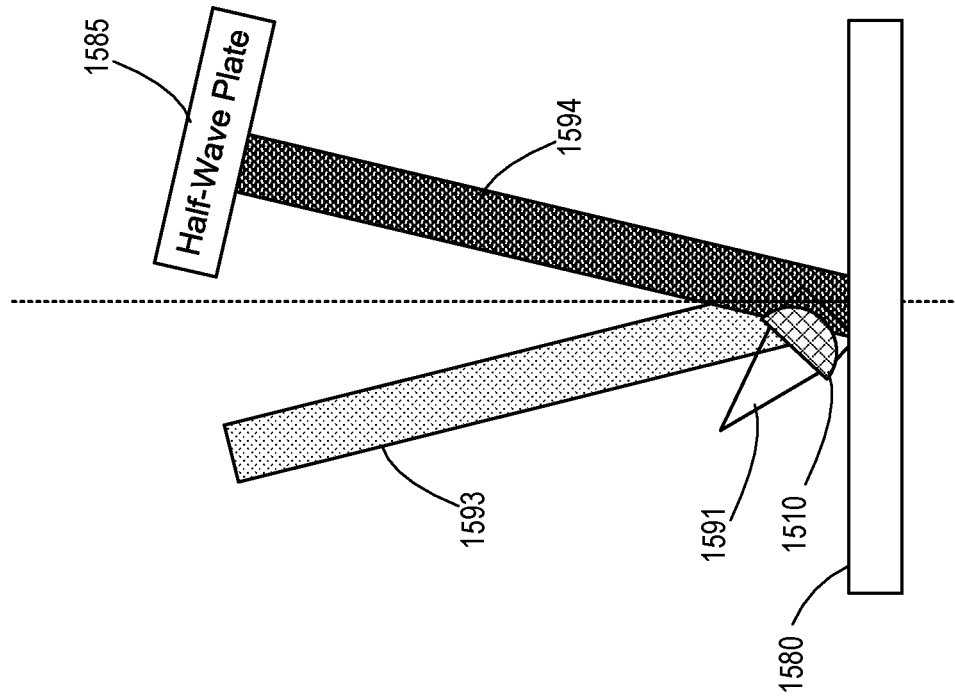
Figure 15C:
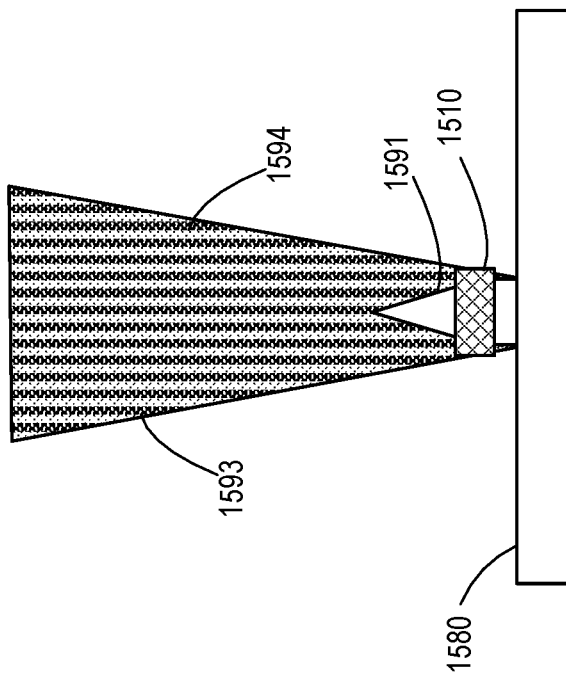

FIG. 13B illustrates the optical path through the optical prism assembly 1375, according to one embodiment.

FIGS. 14A-D illustrate example views of a transmissive (e.g., refractive-type) metasurface 1480 with a half-wave plate 1425, according to various embodiments. As illustrated, optical radiation 1491 is collimated by a toroidal lens 1410 and steered by the refractive-type metasurface 1480 as optical radiation 1493 and 1494. The optical radiation 1494 is passed through a half-wave plate 1425.

FIGS. 15A-D illustrate example views of a reflective metasurface 1580 with a half-wave plate 1585, according to various embodiments. As illustrated, optical radiation 1591 is collimated by a toroidal lens 1510. Optical radiation 1594 with S-polarization is reflected through the half-wave plate 1585. Optical radiation 1593 with P-polarization is diffracted by the metasurface 1580.

Figure 16A:
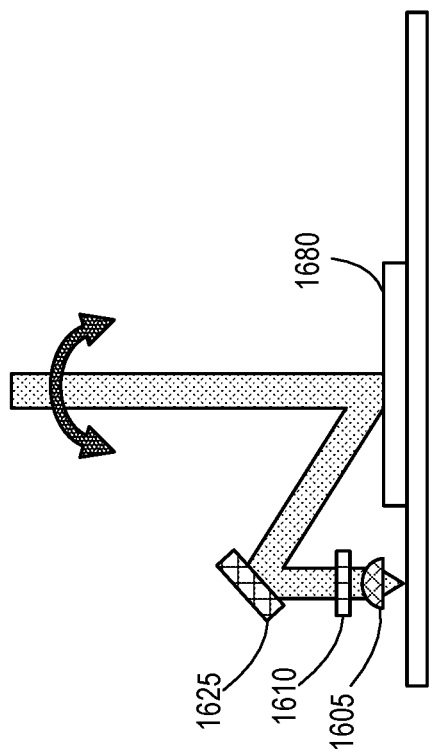
FIGS. 16A-B illustrate examples of metasurface transmitters utilizing low-angle optical assemblies to convey optical radiation to a metasurface, according to various embodiments.
Figure 16B:
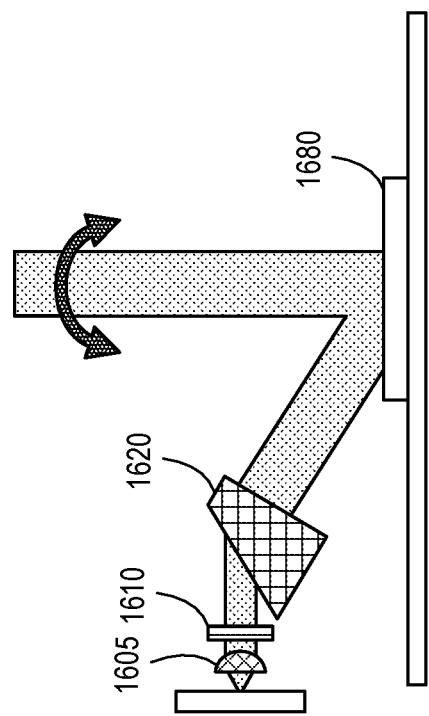

FIGS. 16A-B illustrate examples of metasurface transmitters utilizing low-angle optical assemblies to convey optical radiation to a metasurface 1680, according to various embodiments. In each of FIGS. 16A and 16B, optical radiation from an optical radiation source is steered through optical assembly elements 1605, 1610, 1620, and 1625 for incidence on the metasurface 1680 at a relatively low angle of incidence. The metasurface 1680 steers the optical radiation within a steering range. The optical radiation incident on the metasurface 1680 from the optical assembly elements 1605, 1610, 1620, and 1625 is incident at a relatively low angle such that the optical assembly elements do not block the steered optical radiation transmitted by the metasurface 1680.

Figure 16C:
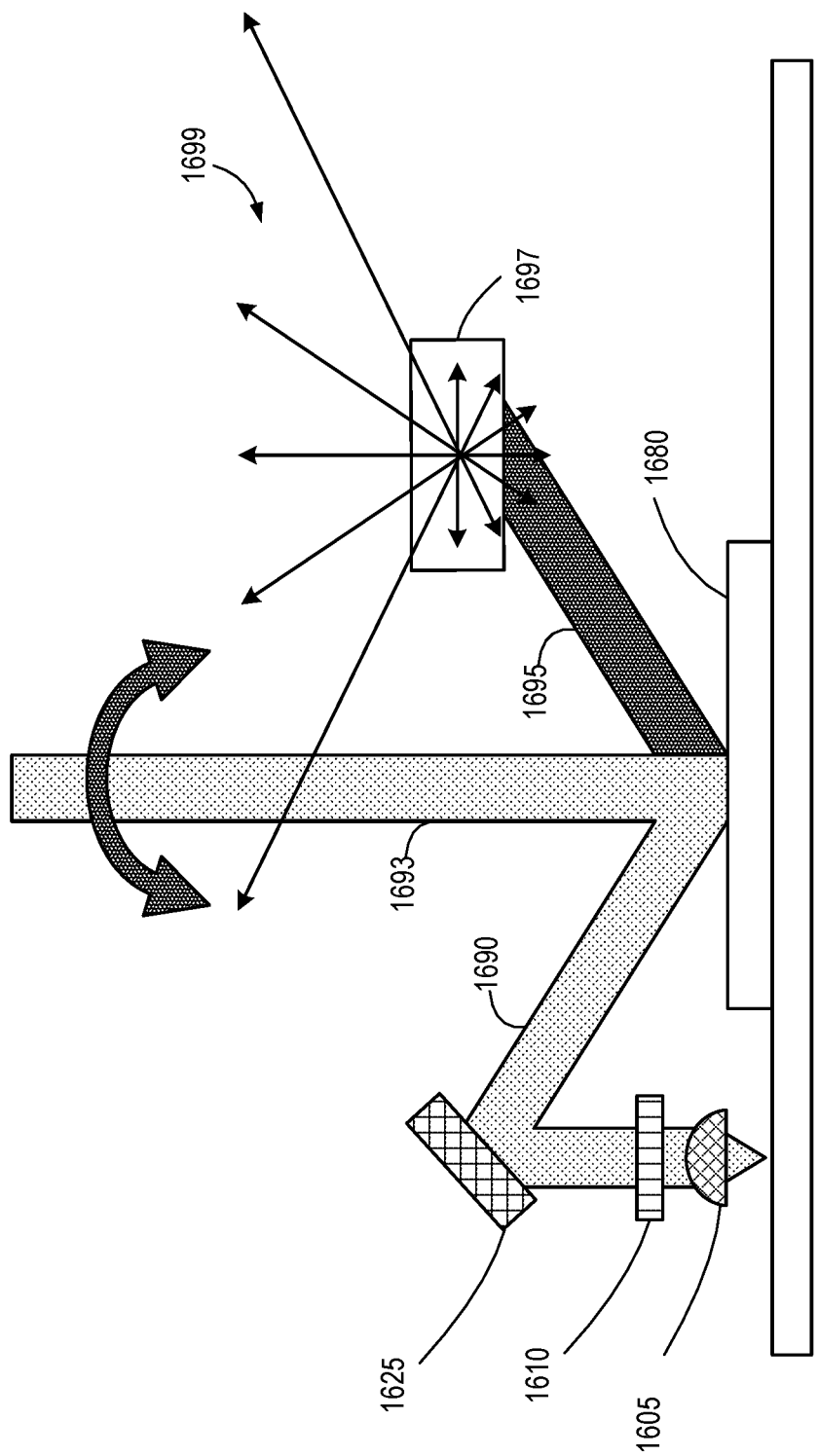
FIG. 16C illustrates an example of a metasurface transmitter with a diffuser to diffuse unsteered optical radiation, according to one embodiment.

FIG. 16C illustrates an example of a metasurface transmitter with a diffuser 167 to diffuse unsteered optical radiation 1695, according to one embodiment. Most of the incident optical radiation 1690 is steered by the metasurface 1680 as steered beam 1693. In a perfectly efficient system, all the incident optical radiation 1690 is steered by the metasurface 1680. However, in many actual implementations, some of the incident optical radiation 1690 is reflected as unsteered optical radiation 1695. In the illustrated embodiment, a diffuser 1697 is positioned to receive the unsteered optical radiation 1695 and diffuse the unsteered optical radiation 1695 and diffuse it as diffuse radiation 1699. The diffuser 1697 may be, for example, an opal plate, frosted grass, an engineered diffuser, an etching, etc.

In lidar systems, the diffuser may operate to illuminate objects located at short range to increase the effective dynamic range of the lidar system. As previously described, in a lidar system, the steered optical radiation 1693 illuminates objects at short, medium, and long range. The objects reflect a portion of the steered optical radiation 1693 back to a lidar receiver. The intensity of the received optical radiation generally decreases as the distance to the object increases. As such, the optical radiation received from objects at medium and long range is generally less intense than the optical radiation received at short range. In fact, at short range, the optical radiation reflected by the object to be received by the lidar receiver may be more than desirable and outside of the dynamic range of the lidar receiver sensors. The diffuser 1697 operates to uniformly or quasi-uniformly illuminate objects at short range so as to decrease the dynamic range of the scene at short range.

FIGS. 17A-24 illustrate examples of optical transmitters utilizing prisms to convey optical radiation to a tunable metasurface from optical radiation sources in various locations relative to the metasurface, according to various embodiments.

FIG. 17A illustrates an optical radiation transmission system 1700 with optical elements 1705, 1725, and 1727 for collimating and polarizing optical radiation from an optical radiation source on a printed circuit board 1770. The collimated and polarized optical radiation enters a first surface of a coupling prism 1775 and is reflected off a mirror 1776 (e.g., a mirrored surface of the coupling prism 1775) toward an upper surface of the coupling prism 1775. The optical radiation is incident on the upper surface of the coupling prism 1775 at an angle greater than the critical angle and is reflected downward for incidence on the metasurface 1780. In the illustrated example, the optical assembly for collimating and polarizing includes a lens 1705, a polarizing beam splitter plate 1725, and a half-wave plate 1727. The angle of the mirrored surface 1776 can be selected to achieve a target angle of incidence on the metasurface 1780 to affect the orders to be used for steering.

FIG. 17B illustrates the optical radiation transmission system 1700 of FIG. 17A with a sensor 1798 (e.g., a photodetector, photodiode, processor, memory, data communication circuitry, and/or the like) to detect unsteered optical radiation 1795, according to one embodiment. As previously described, most of the incident optical radiation 1790 that is incident on the metasurface 1780 is steered through the prism 1775 as steered optical radiation 1793. However, due to system and component inefficiencies, some of the incident optical radiation 1790 is reflected by the metasurface 1780 as unsteered optical radiation 1795. The path of the unsteered optical radiation 1795 is illustrated with darker shading as it is reflected off the upper surface of the prism 1775. One beam is received by the sensor 1798 after reflecting off the upper surface of the prism 1775. The other beam is received by the sensor 1798 after reflecting off the upper surface of the prism 1775 and the vertical, left wall of the prism 1775.

According to various embodiments, the sensor 1798 may be used to detect the laser power being generated. For example, if the metasurface 1780 steers incident optical radiation 1790 with 95% efficiency, the sensor 1798 can be expected to detect approximately 5% of the power generated by the laser. In another implementation, the power output of the laser or LED may be known and the sensor 1798 can be used to measure the steering efficiency of the metasurface 1780. That is, if 2% of the optical radiation generated by the laser or LED source is received by the sensor, the metasurface can be estimated at approximately 98% efficient, less any known or estimated losses in the various optical elements 1705, 1725, and 1727, the prism 1775, and the mirrored surface 1776.

In some embodiments, the metasurface 1780 may be tuned off so the sensor 1798 can be used to measure the intensity of the LED or laser. The metasurface may then be turned on to measure the efficiency of the metasurface at different steering angles or an average efficiency across all steering angles.

In some embodiments, a metasurface efficiency and/or power output of an optical radiation source may be measured as part of a factory calibration, manufacturing, or setup. The efficiency and/or power intensity may be measured at later dates to confirm the health and continued operation of the metasurface and/or optical radiation source (e.g., LED or laser). In some embodiments, the sensor 1798 may be used to measure the switching speed of the metasurface 1780 as the metasurface 1780 is used to steer the optical radiation at different steering angles. In some embodiments, the sensor 1798 may be used to ensure that the output optical radiation steered by the metasurface 1780 does not exceed operational rules, safety standards, or eye safety standards.

Figure 18A:
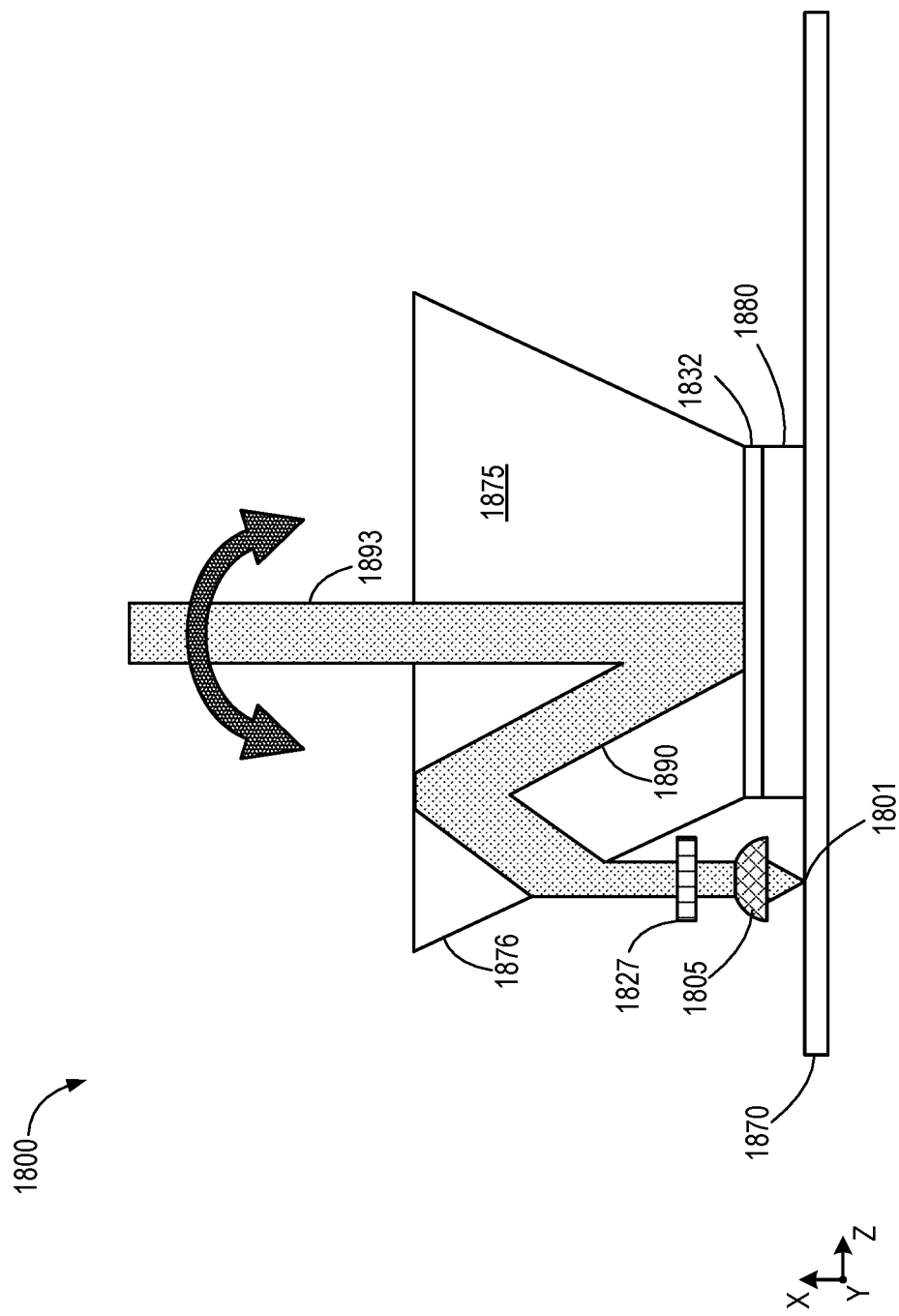

FIG. 18A illustrates an optical radiation transmission system 1800 with a collimating lens 1805 and a polarization grating 1827 for collimating and polarizing optical radiation from an optical radiation source 1801 on a printed circuit board 1870. The collimated and polarized optical radiation enters an input facet 1876 of a coupling prism 1875 and is refracted for internal reflection by an upper surface of the coupling prism 1875 for incidence on a metasurface 1880. Two quarter-wave plates 1832 are positioned adjacent to one another (e.g., coplanar and side by side) between the coupling prism 1875 and the metasurface 1880, such that the optical radiation passes through one of the quarter-wave plate 1832 before incidence on the metasurface 1880 and after being steered for transmission by the metasurface 1880. The input facet 1876 of the coupling prism 1875 has a Brewster angle that does not need to be coated. Stray light can be rejected on the opposite facet.

Figure 18B:
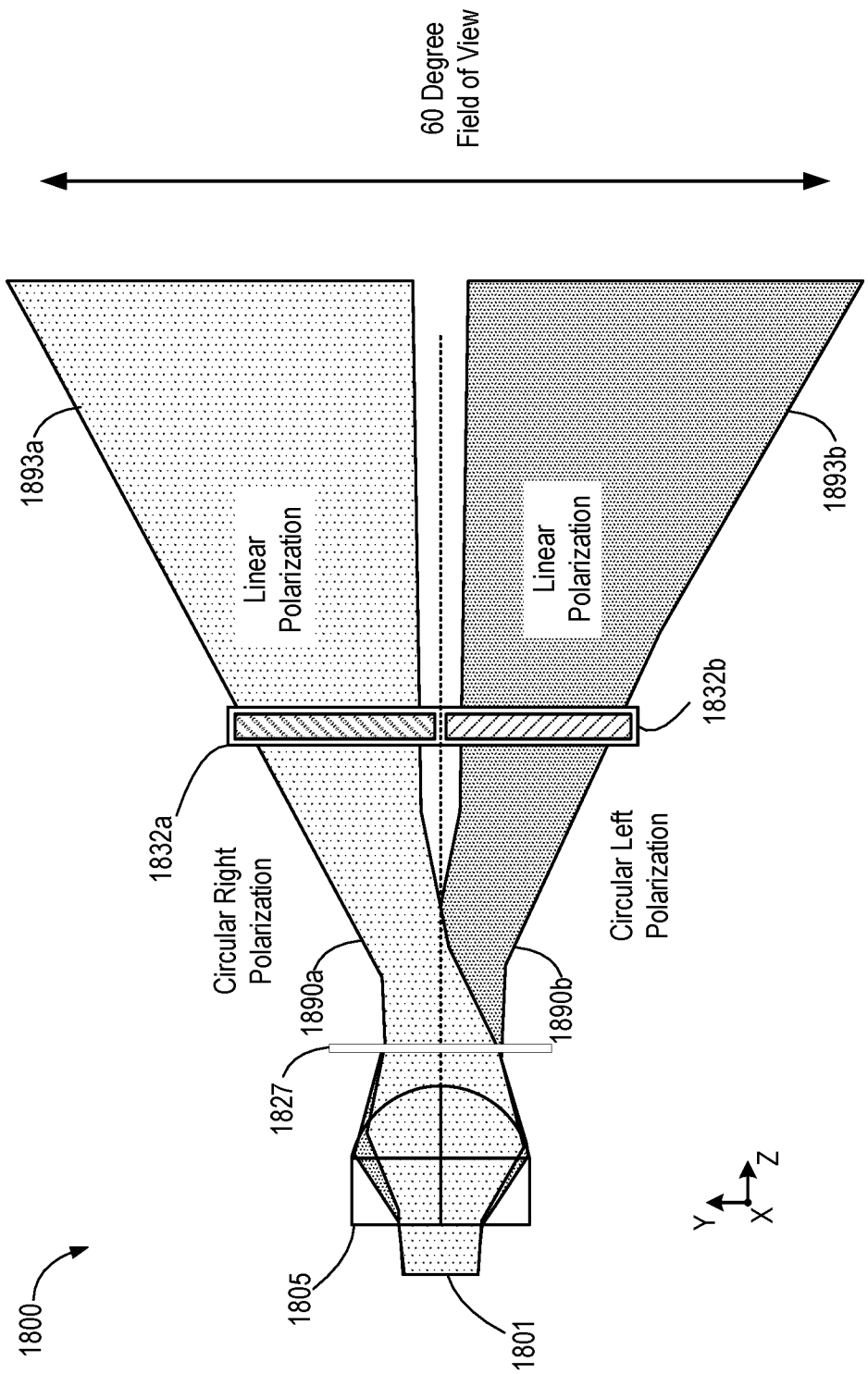

FIG. 18B illustrates another view of the optical radiation transmission system 1800 showing the spatial separation of the different polarizations of optical radiation, according to one embodiment. As illustrated, optical radiation is passed through a polarization grating to effectuate spatial separation of the optical radiation with circular right polarization 1890a and optical radiation with circular left polarization 1890b. The two quarter-wave plates 1832a and 1832b linearly polarize the optical radiation 1893a and 1893b, which is steered by the metasurface.

Figure 18C:
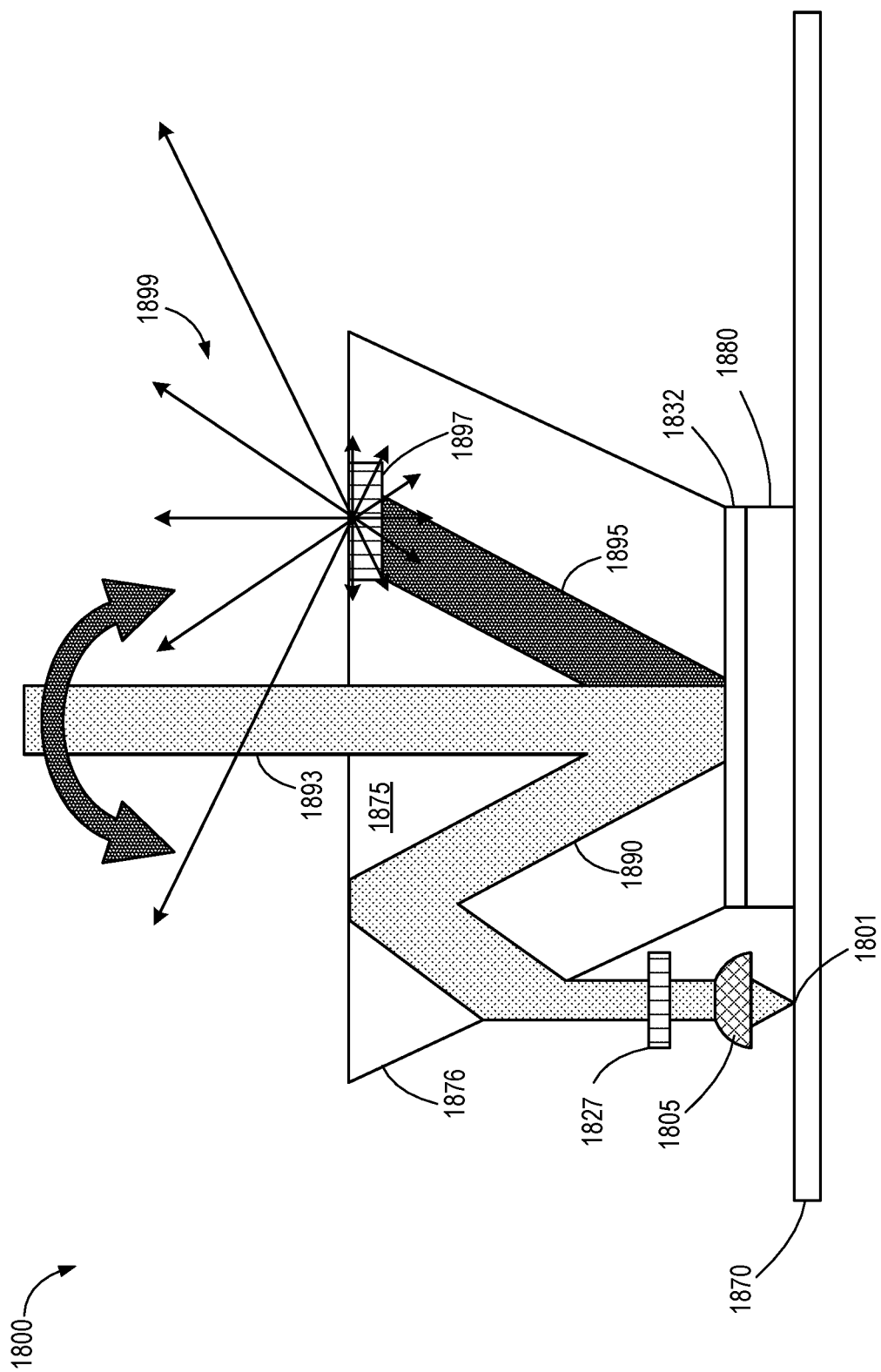

FIG. 18C illustrates the optical radiation transmission system 1800 with a diffuser 1897 to diffuse unsteered optical radiation 1895. While a high percentage of the incident optical radiation 1890 is steered by the metasurface 1880 as steered beam 1893. However, a small percentage of the incident optical radiation 1890 is reflected as unsteered optical radiation 1895. The diffuser 1897 may be a discrete element within the prism 1875 (as illustrated), a grating or pattern etched into the surface of the prism 1875, or as a discrete element external to the prism 1875. The diffuser 1897 receives and diffuses the unsteered optical radiation 1895 as diffuse radiation 1899.

Figure 19:
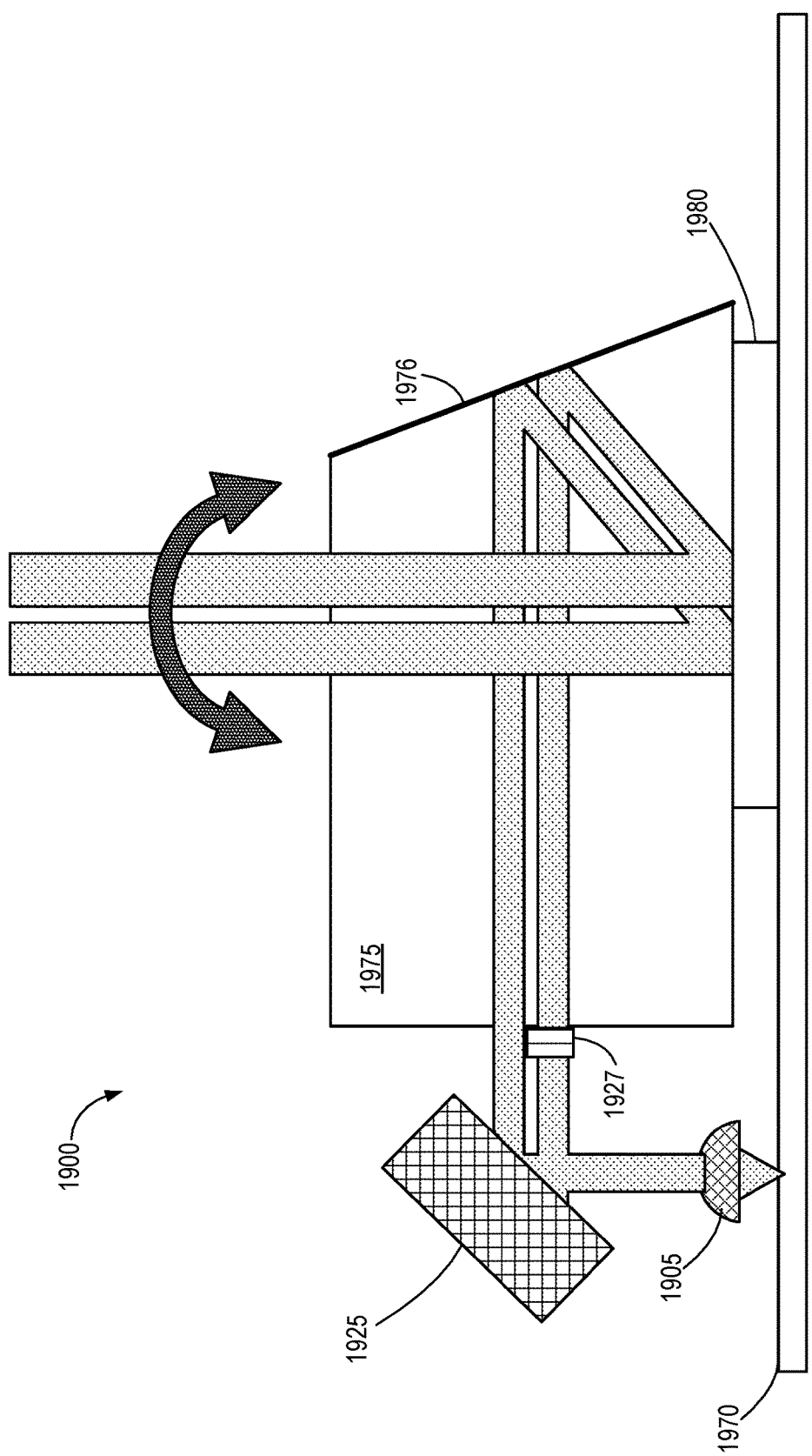

FIG. 19 illustrates an optical radiation transmission system 1900 with a collimating lens 1905, a polarizing beam splitter plate 1925, and a half-wave plate 1927 to collimate and polarize optical radiation from an optical radiation source on a printed circuit board 1970. The optical radiation enters a surface of a coupling prism 1975 and is reflected by an opposing mirrored surface 1976 for incidence on a metasurface 1980. The angle of the mirrored surface 1976 can be selected to achieve a target angle of incidence on the metasurface 1980 to affect orders to be used for steering.

In the illustrated embodiment, the first surface of the coupling prism 1975 extends between the lower and upper faces of the coupling prism at right angles. The mirrored surface extends at an acute angle from the lower surface and connects to the upper surface at an obtuse angle.

FIG. 20A illustrates an optical radiation transmission system 2000 with a collimating lens 2005 and a polarization spatial combiner 2027 (prism, rhomboid, and half-wave plate) to collimate and polarize optical radiation from an optical radiation source 2070 that is positioned orthogonal to the primary printed circuit board 2071. The optical radiation enters an input facet 2076 of a coupling prism 2075 and is reflected by an upper surface for incidence on a metasurface 2080. Again, the input facet 2076 of the coupling prism 2075 may be configured with a Brewster angle that does not need to be coated and the specular light can be rejected on the opposite facet.

FIG. 20B illustrates the optical radiation transmission system 2000 with a reflective diffuser to diffuse unsteered optical radiation, according to one embodiment. As illustrated, the unsteered optical radiation beams 2095 are reflected out of the prism 2075 where they are received by an external diffuser 2097. The external diffuser 2097 may be, for example, an opal plate, frosted grass, an engineered diffuser, an etching, etc. The external diffuser 2097 reflects and diffuses the unsteered optical radiation 2095 into the short range as diffuse radiation 2099.

Figure 20C:
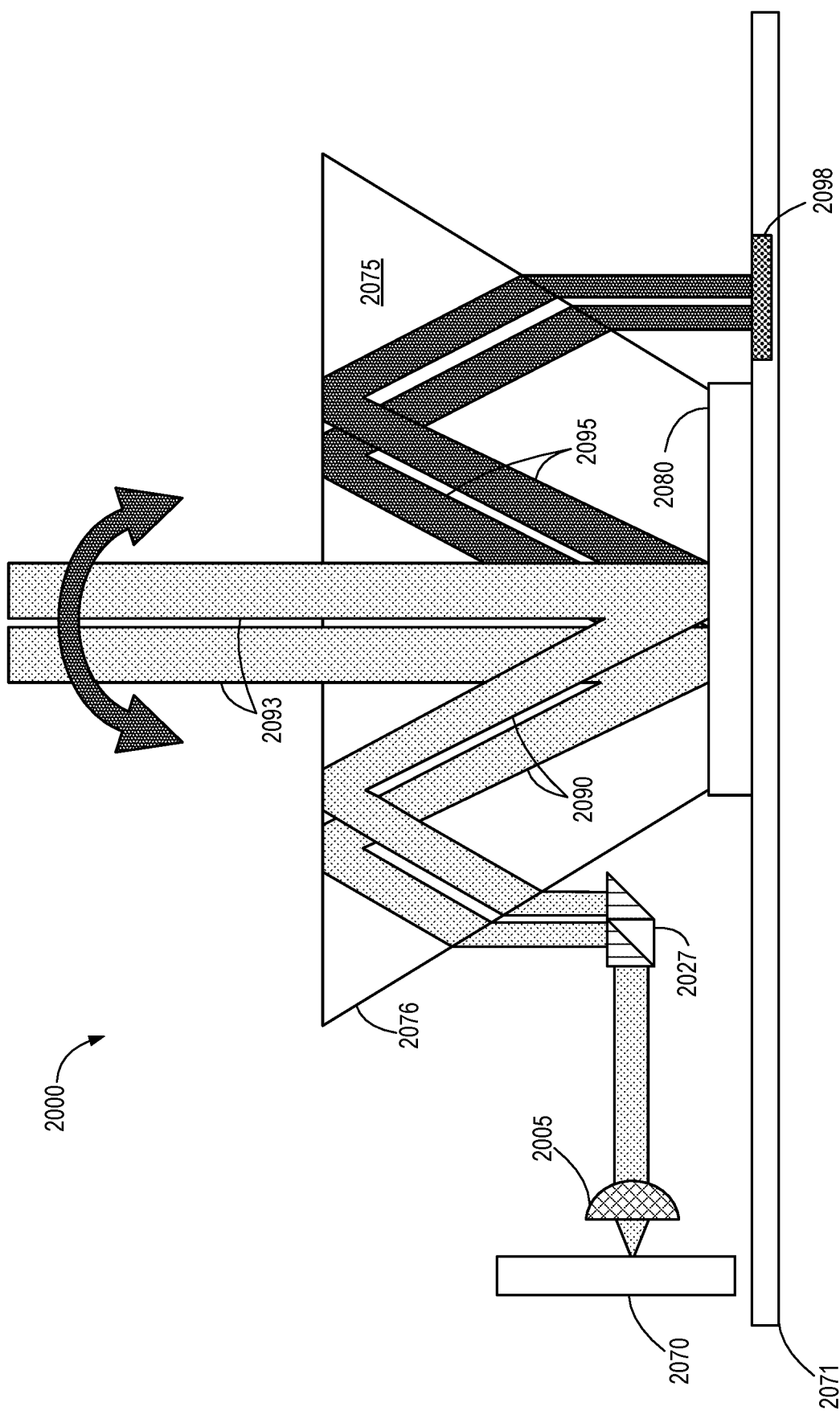

FIG. 20C illustrates the optical radiation transmission system 2000 with a photodetector 2098 in the printed circuit board 2071 to detect unsteered optical radiation 2095 that is reflected by the metasurface 2080 out of the prism 2075, according to one embodiment. Again, most of the incident optical radiation 2090 that is incident on the metasurface 2080 is steered through the prism 2075 as steered optical radiation 2093. Some of the incident optical radiation 2090 is reflected by the metasurface 2080 as unsteered optical radiation 2095. The path of the unsteered optical radiation 2095 is illustrated with darker shading as it is reflected off the upper surface of the prism 2075 and then downward out of the lateral face of the prism 2075 that extends at an obtuse angle from the base of the prism 2075.

The photodetector 2098 (optionally in conjunction with other components on the printed circuit board 2071 and/or off-chip components) is used to detect the unsteered optical radiation 2095. The measurement of the intensity of the unsteered optical radiation 2095 may be used to measure the efficiency of the metasurface 2080, the power output of the LED or laser optical radiation source 2070, the health of the optical radiation source 2070 or metasurface 2080, the switching speed of the metasurface 2080.

Figure 21:
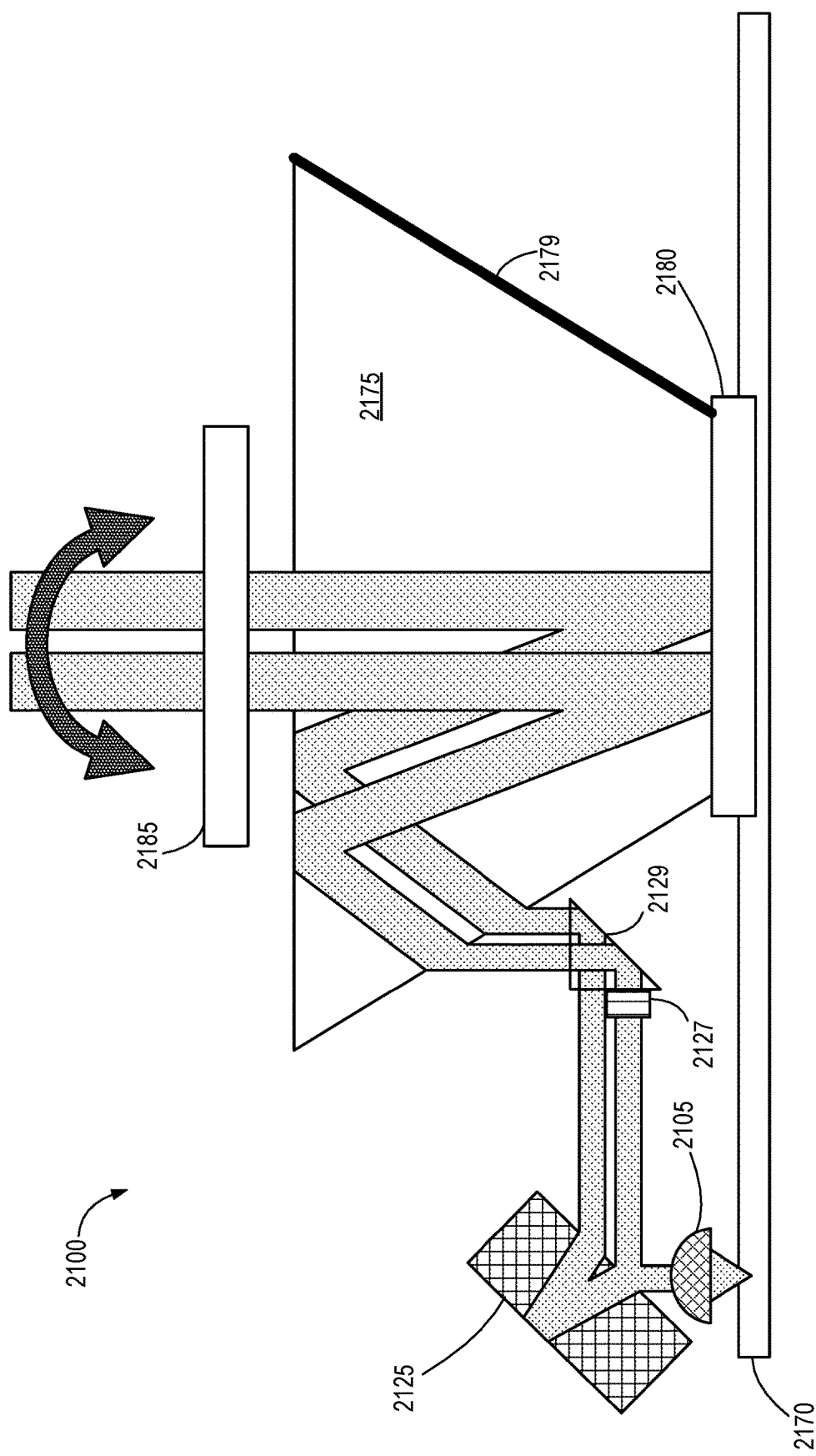

FIG. 21 illustrates an optical radiation transmission system 2100 with a collimating lens 2105, a polarizing beam splitter plate 2125, a half-wave plate 2127, and a right-angle prism 2129 to direct the combined and polarized optical radiation into a trapezoidal coupling prism 2175. The optical radiation enters an input facet of the coupling prism 2175 and is reflected by an upper surface for incidence on the metasurface 2180 positioned on a printed circuit board 2170 or another substrate. A diffuser 2185 may operate to diffuse the optical radiation along an elevation axis as the optical radiation is steered along ab azimuth axis by the metasurface 2180. A facet of the trapezoidal coupling prism 2175 opposite the input facet may include a specular dump 2179 to absorb, deflect, or otherwise reduce stray optical radiation within the prism.

Figure 22:
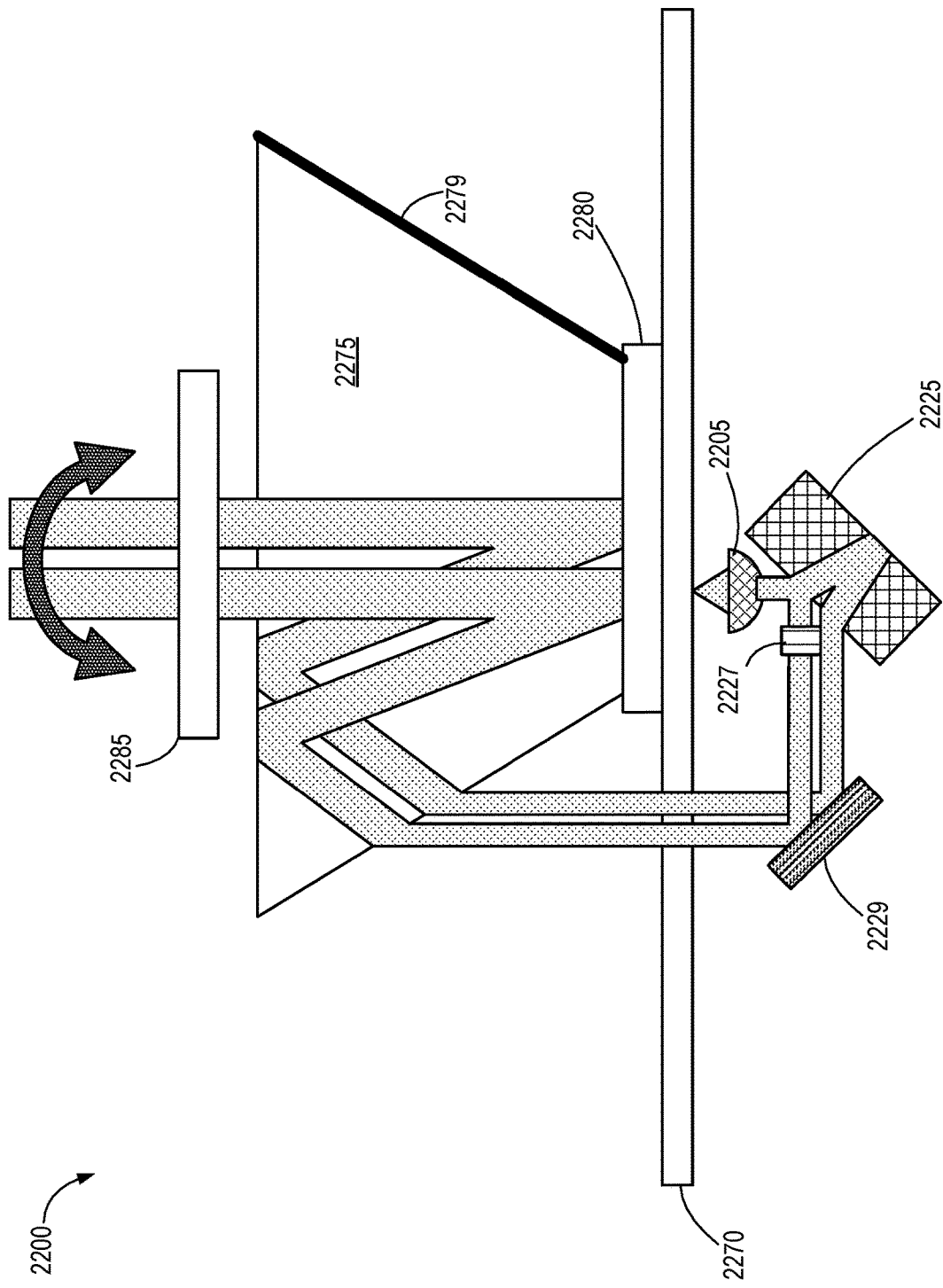

FIG. 22 illustrates an optical radiation transmission system 2200 with a collimating lens 2205, a polarizing beam splitter plate 2225, a half-wave plate 2227, and a mirror 2229 to direct combined and polarized optical radiation through holes in a printed circuit board 2270 (or another substrate) into a trapezoidal coupling prism 2275. The optical radiation enters an input facet of the coupling prism 2275 and is reflected by an upper surface for incidence on the metasurface 2280. Again, a diffuser 2285 may operate to diffuse the optical radiation along an elevation axis as the optical radiation is steered along an azimuth axis by the metasurface 2280. A facet of the trapezoidal coupling prism 2275 opposite the input facet may include a specular dump 2279 to absorb, deflect, or otherwise reduce or eliminate stray optical radiation within the prism.

Figure 23:
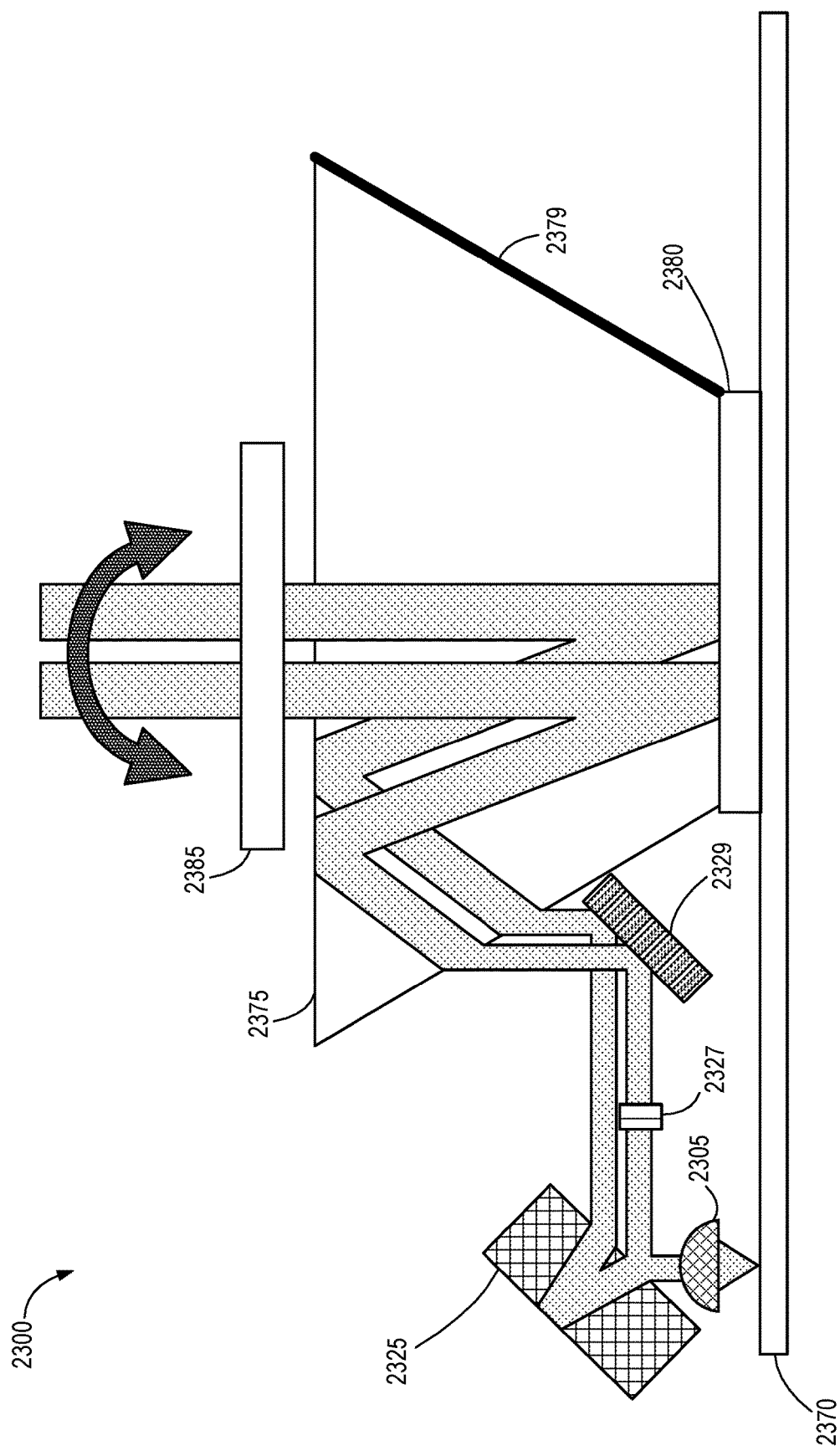

FIG. 23 illustrates an optical radiation transmission system 2300 with a collimating lens 2305, a polarizing beam splitter plate 2325, a half-wave plate 2327, and a mirror 2329 to direct the combined and polarized optical radiation into a trapezoidal coupling prism 2375. The optical radiation enters an input facet of the coupling prism 2375 and is reflected by an upper surface for incidence on a metasurface 2380. Again, a diffuser 2385 may operate to diffuse the optical radiation along an elevation axis as the optical radiation is steered along an azimuth axis by the metasurface 2380. A facet of the trapezoidal coupling prism 2375 opposite the input facet may include a specular dump 2379 to reduce stray optical radiation.

Figure 24:
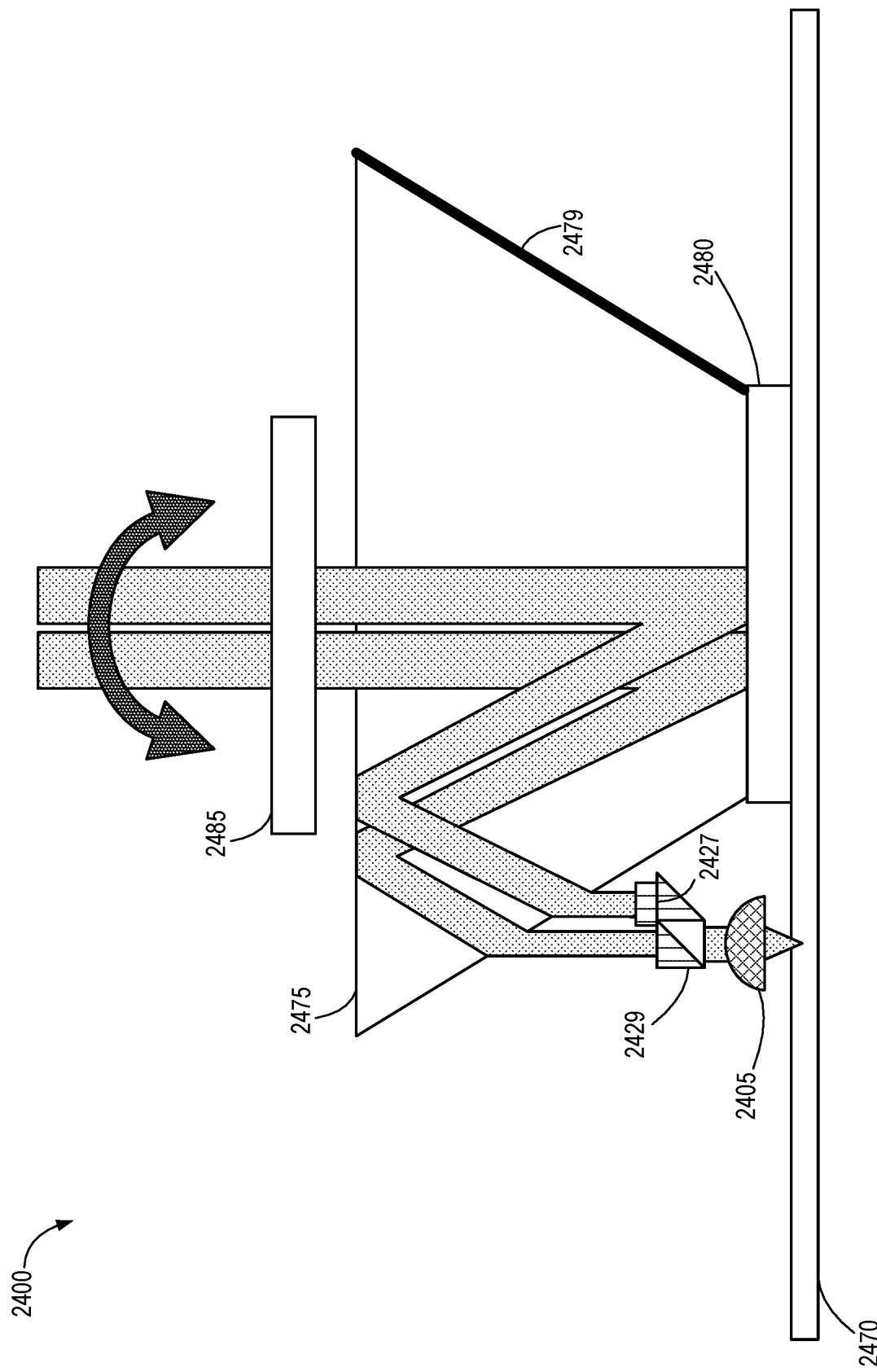

FIG. 24 illustrates an optical radiation transmission system 2400 with a collimating lens 2405, a combiner 2429 (prism and rhomboid), and a half-wave plate 2427 to direct the combined and polarized optical radiation into a trapezoidal coupling prism 2475. The optical radiation enters an input facet of the coupling prism 2475 and is reflected by an upper surface for incidence on a metasurface 2480 at a much higher angle of incidence than is possible in prism less designs (without the optical radiation source or diffracting optical elements blocking a portion of an aperture). Again, a diffuser 2485 may operate to diffuse the optical radiation along an elevation axis as the optical radiation is steered along an azimuth axis by the metasurface 2480. A facet of the trapezoidal coupling prism 2475 opposite the input facet may include a specular dump 2479 to absorb and/or deflect stray optical radiation.

Figures 25A, 25B, 25C:
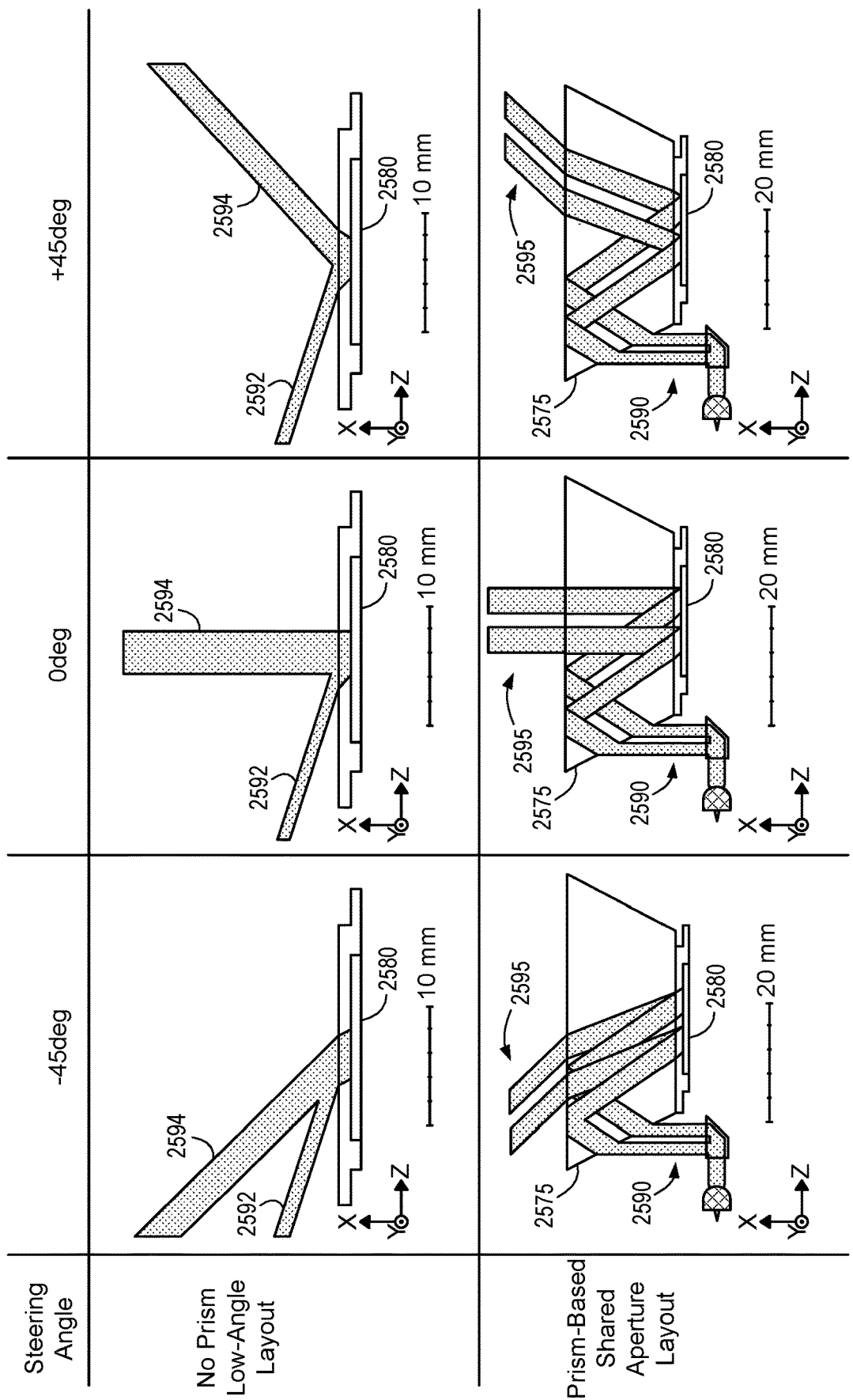
FIGS. 25A-C illustrates a comparison of low-angle "prismless" optical assemblies with prism-based optical assemblies at various steering angles, according to various embodiments.

FIGS. 25A-C illustrate a comparison of low-angle "prism less" optical assemblies with prism-based optical assemblies at various steering angles, according to various embodiments. The prismless layouts on the top row illustrate optical radiation 2592 incident on a metasurface 2580 at a relatively low angle before being steered as transmitted optical radiation 2594 at −45 degrees, 0 degrees, and +45 degrees by the metasurface 2580. In such embodiments, the optical radiation source (not shown) is relatively far away from the metasurface 2580 as compared to embodiments utilizing prisms.

In the prism-based layouts in the bottom row of each of FIGS. 25A-C, an aperture within the prism 2575 is shared by both the incident optical radiation 2590 directed toward the metasurface 2580 and the optical radiation 2595 transmitted by the metasurface at the various steering angles. The shared aperture within the prism 2575 allows for compact packaging and relatively close spacing of the optical radiation source and the metasurface.

Figure 26:
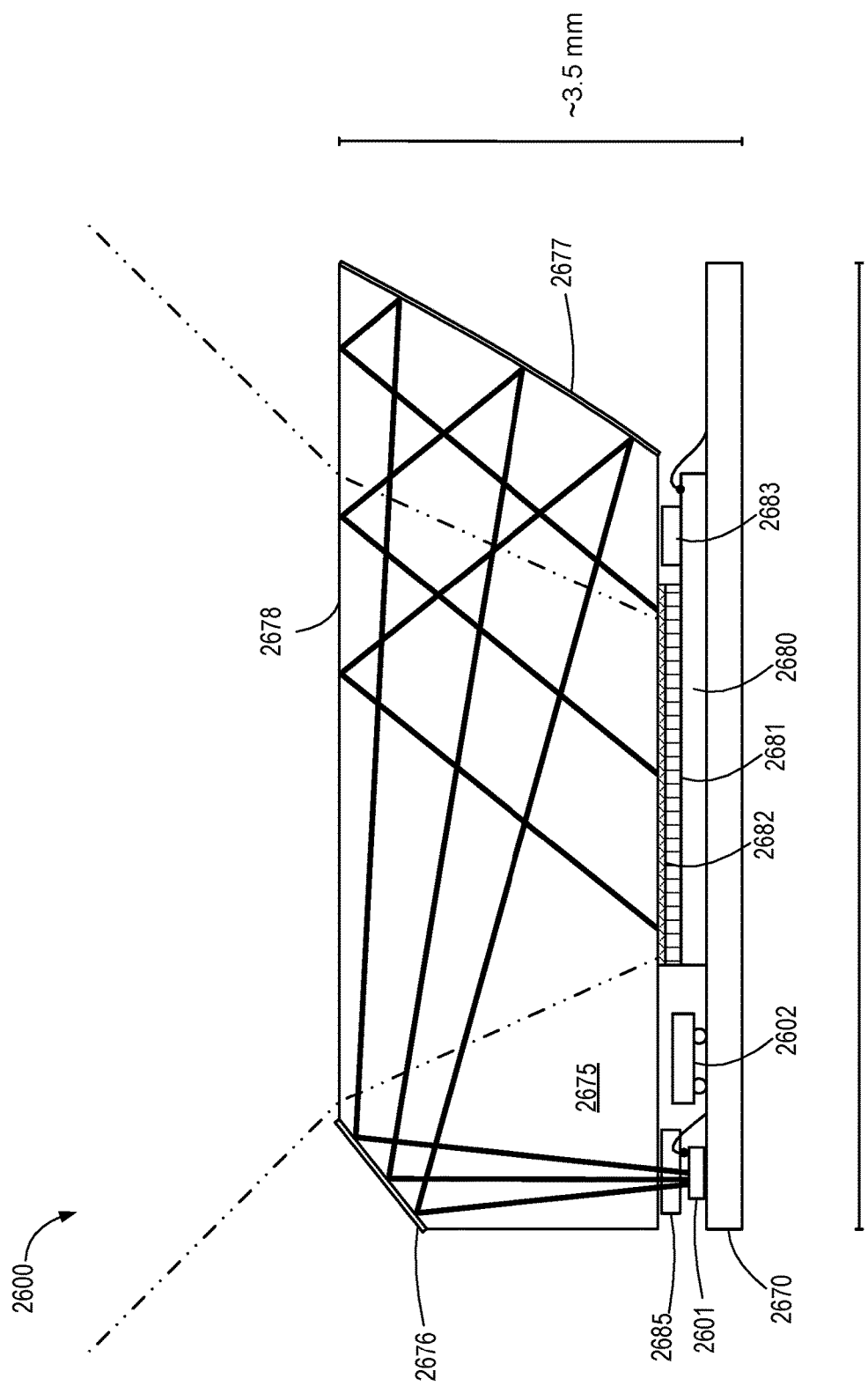
FIG. 26 illustrates an example of an optical transmitter with a prism and a tunable metasurface, according to one embodiment.

FIG. 26 illustrates an example of an optical transmitter 2600 with a coupling prism 2675 and a tunable metasurface 2680, according to one embodiment. A VCSEL array 2601 (or alternative optical radiation source) is driven by the VCSEL driver 2602 to generate optical radiation that passes through a polarization grating 2685 before entering a bottom facet of the coupling prism 2675. The optical radiation is reflected by a mirrored facet 2676 of the coupling prism that is at an angle relative to a bottom facet and a top facet 2678 of the coupling prism 2675. The optical radiation is reflected over the metasurface 2680 toward a mirrored collimating facet 2677 on an opposing side of the coupling prism 2675. The optical radiation is collimated by the collimating facet 2677 (e.g, a mirrored face) and reflected toward the upper surface 2678 of the coupling prism.

The upper surface 2678 of the coupling prism 2675 may be coated with an optical coating to achieve a target reflection and/or refraction pattern. The collimated optical radiation is reflected by the upper surface 2678 for incidence on the metasurface 2680 after passing through a half-wave plate 2682 and a glass cover 2681. The metasurface 2680 is tuned and driven by a metasurface driver 2683 on the printed circuit board 2670 to steer the incident optical radiation for far-field transmission.

Figure 27A:
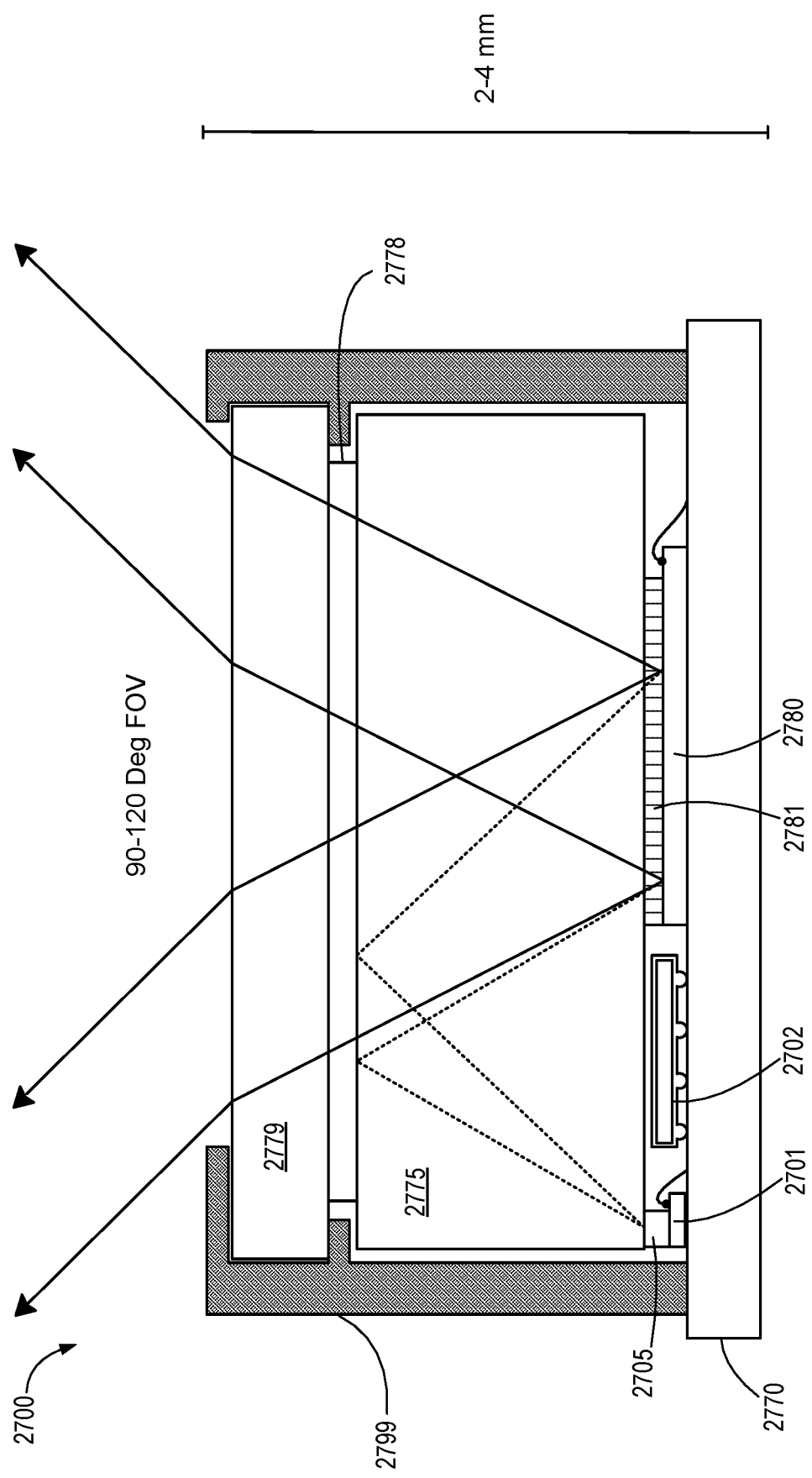
FIG. 27A illustrates an example of an optical transmitter with a prism, a tunable metasurface, and a cylindrical defocusing lens, according to one embodiment.

FIG. 27A illustrates another example of an optical transmitter 2700 with a coupling prism 2775, a tunable metasurface 2780, and a cylindrical defocusing lens 2779, according to one embodiment. The optical transmitter 2700 is packaged within a housing 2799 positioned on a printed circuit board 2770. A VCSEL driver 2702 drives a VCSEL array 2701 (e.g., a one-dimensional or two-dimensional array of VCSELs) to generate optical radiation. The optical radiation passes through a beam deflector 2705 into the coupling prism 2775 for internal reflection and incidence on the metasurface 2780 (after passing through a coverglass 2781). In the illustrated embodiment, the metasurface 2780 steers and collimates the optical radiation. The cylindrical defocusing lens 2779 diffuses or spreads laser light in the vertical axis (e.g., non-steering or elevation axis).

Figure 27B:
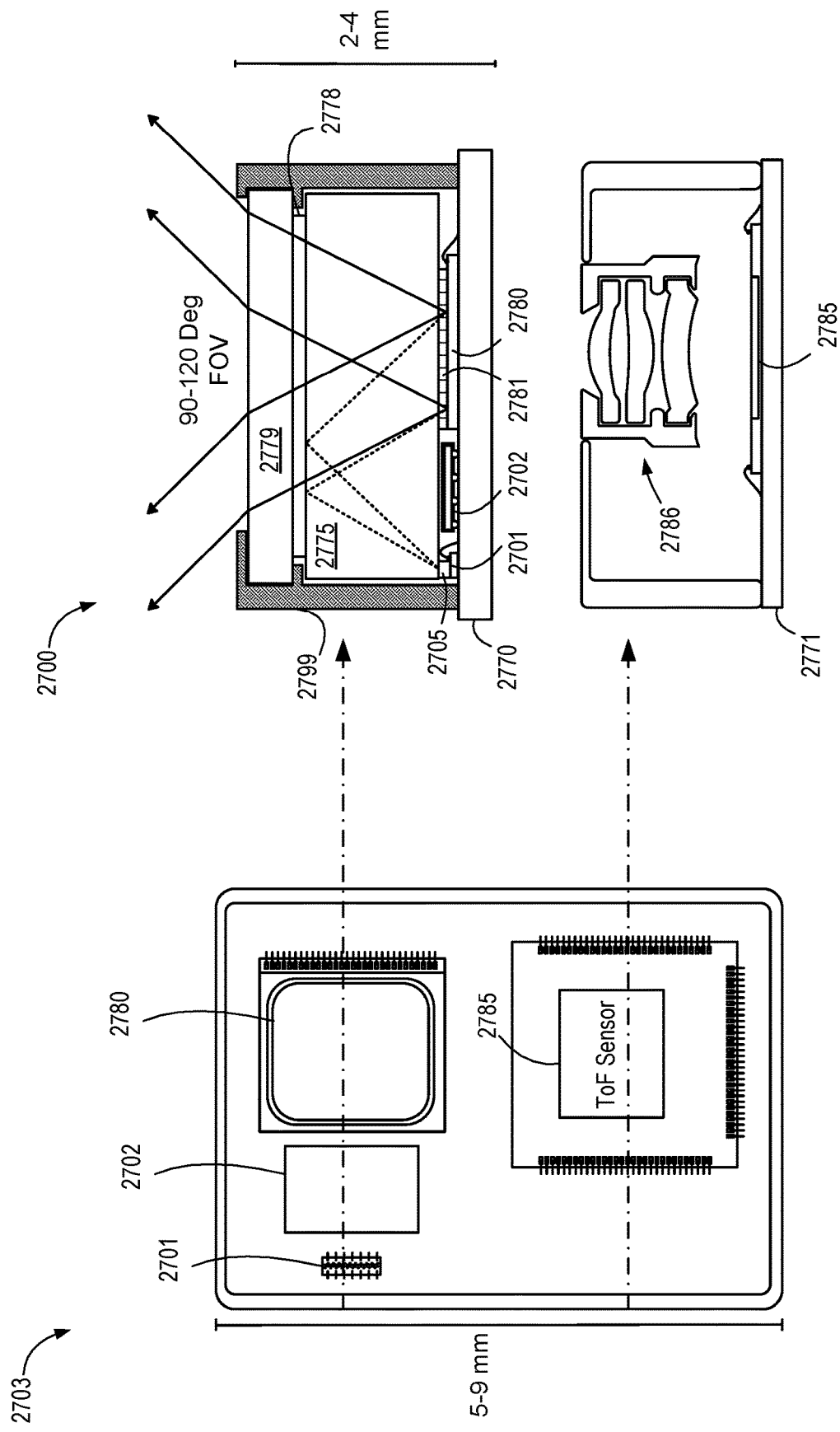
FIG. 27B illustrates an example embodiment of a LiDAR system using the optical transmitter of FIG. 27A, according to one embodiment.

FIG. 27B illustrates an example embodiment of a LiDAR system 2703 using the optical transmitter 2700 of FIG. 27A and a time-of-flight sensor 2785 within a housing 2771 that secures a receiver optical assembly 2786, according to one embodiment. The specific elements of the optical transmitter 2700 are described in conjunction with FIG. 27 above.

Figure 28C:
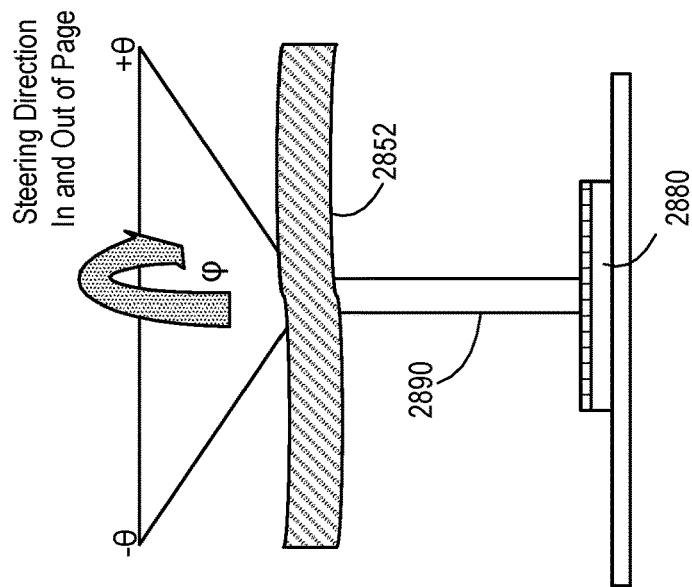
FIGS. 28A-C illustrate examples of optical field-of-view (FOV) expanding assemblies for use with the optical transmitter systems described herein, according to various embodiments.
Figure 28B:
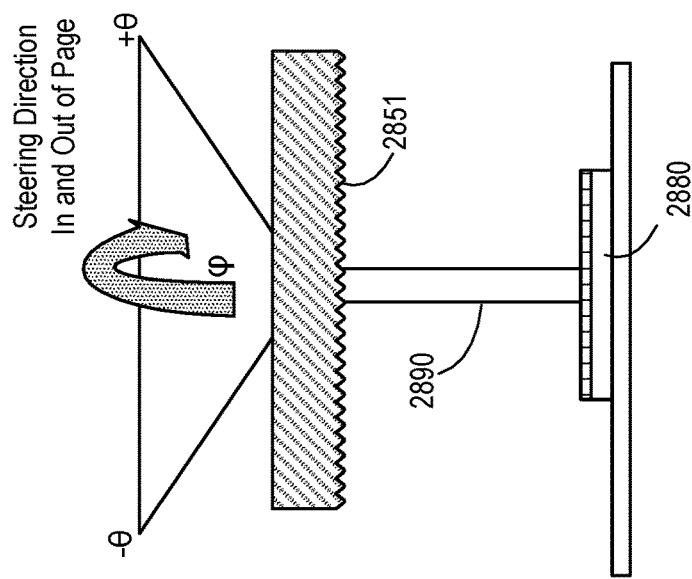
Figure 28A:
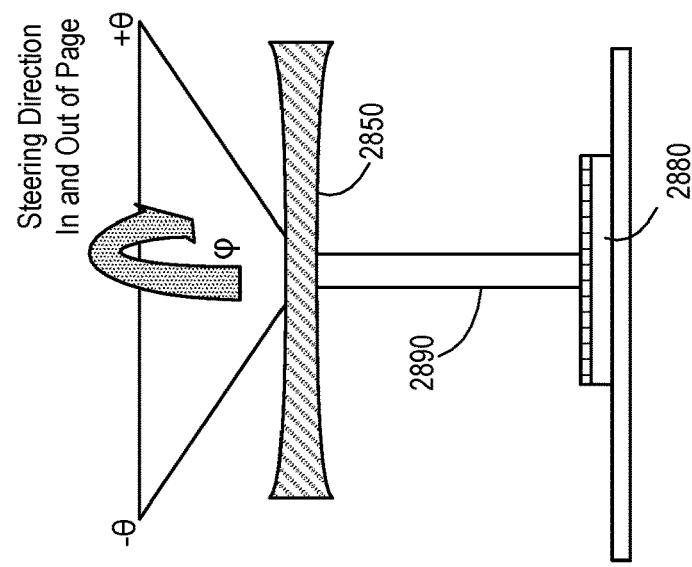

FIG. 28A illustrates a metasurface-based transmitter device with a lens 2850 to expand optical radiation 2890 steered by a metasurface 2880 in a non-steering direction. The lens 2850 can generate a symmetrical fan beam in the non-steering direction.

FIG. 28B illustrates a metasurface-based transmitter device with a lenslet array diffuser 2851 to expand the optical radiation 2890 steered by the metasurface 2880 in the non-steering direction. The lenslet array diffuser 2851 can generate a symmetrical fan beam in the non-steering direction.

FIG. 28C illustrates a metasurface-based transmitter device with a freeform optic diffuser 2852 to expand the optical radiation 2890 steered by the metasurface 2880 in the non-steering direction. The freeform optic diffuser 2852 can also be configured to correct asymmetrical distortion.

Figure 29:
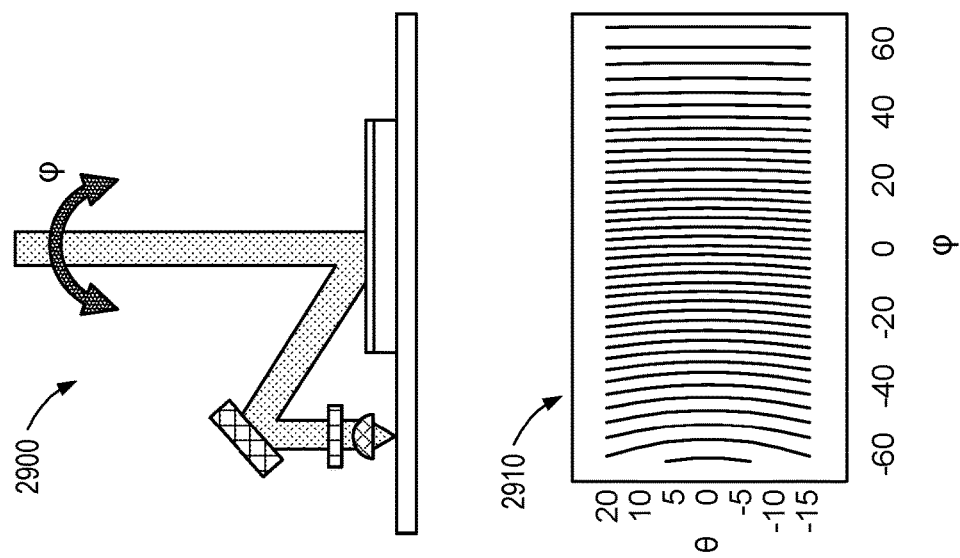
FIG. 29 illustrates the range of straight and curved transmit scan lines of a low-angle, "prismless" metasurface at various steering angles, according to one embodiment.

FIG. 29 illustrates a range of straight and curved transmit scan lines 2910 of a low-angle, "prism less" metasurface 2900 at various steering angles, according to one embodiment. As illustrated, at negative steering angles, the transmit scan lines 2910 are curved and may be difficult to detect by a straight array of sensors in a LiDAR receiver or other sensor arrays. At positive steering angles, the transmit scan lines 2910 are straighter.

Figure 30:
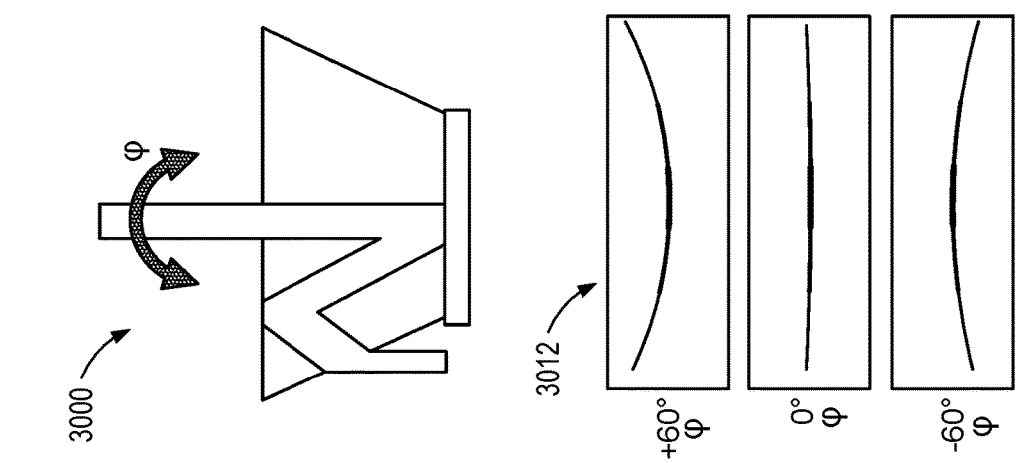
FIG. 30 illustrates the range of straight and curved transmit scan lines of a metasurface with a prism, according to one embodiment.

FIG. 30 illustrates a range of straight and curved transmit scan lines 3012 of a metasurface 3000 with a prism, according to one embodiment. As illustrated, the scan lines 3012 are straight at 0-degree steering angles and become increasingly curved as optical radiation is steered in either direction.

Figure 31:
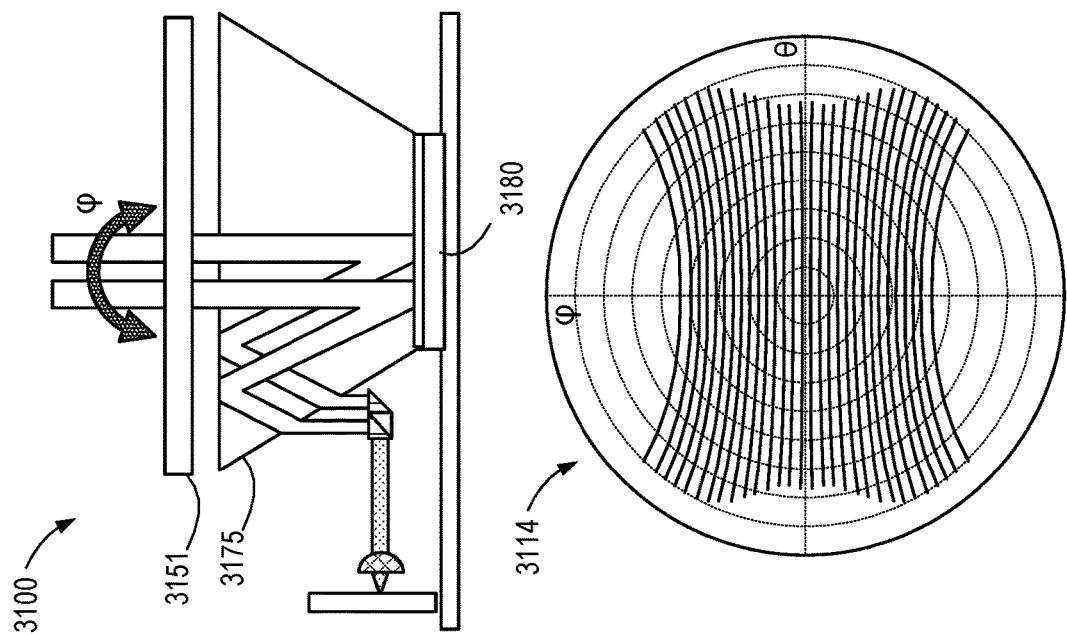
FIG. 31 illustrates the curvature of transmit scan lines in the far-field using an optical transmitter with a tunable metasurface, a prism, and an optical FOV expander, according to one embodiment.

FIG. 31 illustrates a curvature of transmit scan lines 3114 in a far-field using an optical transmitter 3100 with a tunable metasurface 3180, a prism 3175, and an optical FOV expander 3151 (e.g., a lenslet array diffuser), according to one embodiment. Similar to FIG. 30, the scan lines 3114 are straight at 0-degree steering angles and become increasingly curved as optical radiation is steered in either direction.

Figure 32:
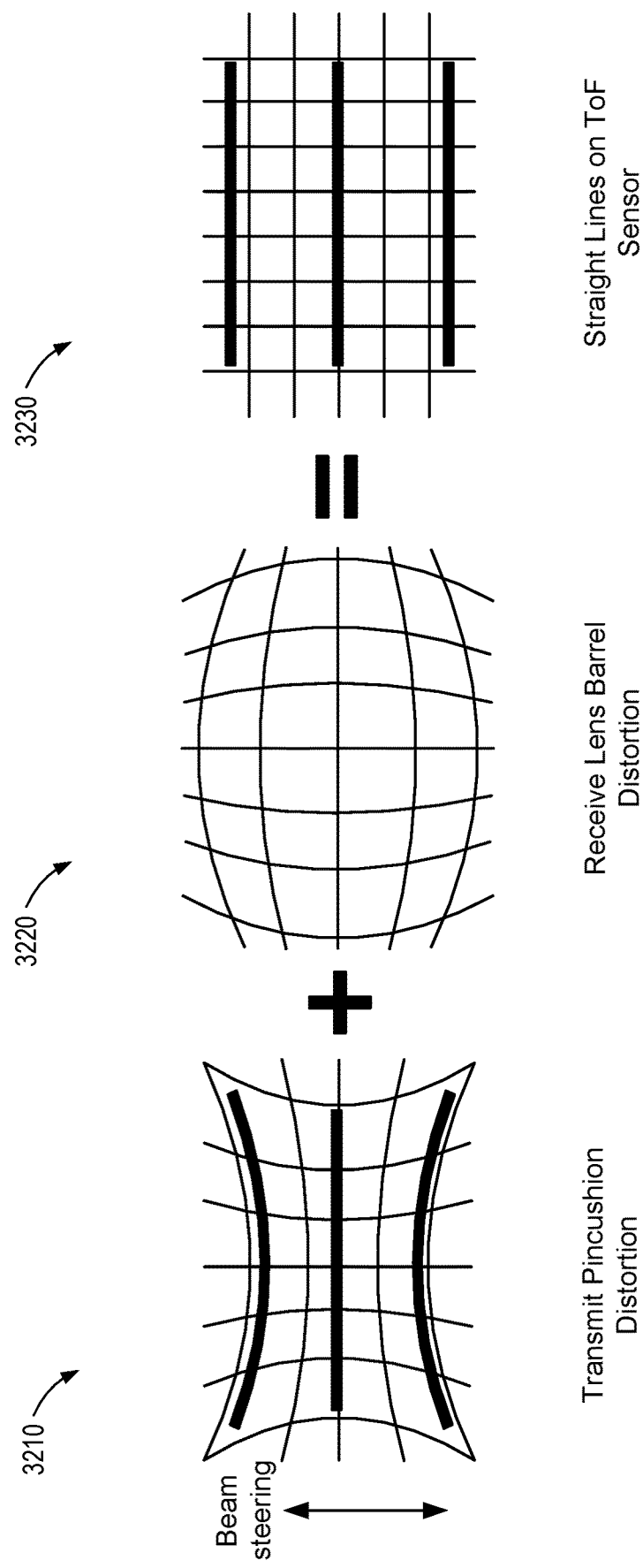
FIG. 32 illustrates an example of a receive lens with barrel distortion to compensate for inherent pincushion distortion of transmit scan lines such that detected optical radiation is aligned in straight lines on a sensor, according to one embodiment.

FIG. 32 illustrates an example of a receive lens 3220 with barrel distortion used to compensate for inherent pincushion distortion of transmit scan lines 3210 such that detected optical radiation is aligned in straight lines on a sensor 3230, according to one embodiment.

This disclosure has been made with reference to various exemplary embodiments, including the best mode. However, those skilled in the art will recognize that changes and modifications may be made to the exemplary embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. This disclosure should, therefore, be determined to encompass at least the following claims and all possible permutations thereof.

The invention claimed is:

1. An optical radiation receiver system, comprising:
a prism;
a sensor to detect optical radiation; and
a tunable optical metasurface steerable to:
receive optical radiation through an upper face of the prism at a target steering angle, and
transmit the received optical radiation to be internally reflected within the prism before passing through the prism to be received by the sensor.

2. The system of claim 1, wherein the tunable optical metasurface transmits the received optical radiation toward the upper face of the prism at an angle greater than a critical angle for internal reflection by the upper face of the prism before passing through the prism to be received by the sensor.

3. The system of claim 1, wherein the sensor comprises an array of optical sensors.

4. The system of claim 3, wherein the sensor comprises a two-dimensional array of optical sensors.

5. The system of claim 3, wherein the sensor comprises a one-dimensional array of optical sensors.

6. The system of claim 1, wherein the upper face of the prism is planar and the prism comprises a lower planar face that is parallel to the upper face, and
wherein the lower planar face of the prism is positioned above and parallel to the tunable optical metasurface, such that the optical radiation steerably received by the tunable optical metasurface is received through the lower planar face of the prism and the upper planar face of the prism.

7. The system of claim 6, wherein the prism comprises a first lateral face that extends from an edge of the lower face of the prism at an obtuse angle to an edge of the upper face of the prism.

8. The system of claim 7, wherein the prism comprises a second lateral face opposing the first lateral face, wherein the second lateral face extends from the lower face of the prism at a right angle to the upper face of the prism.

9. The system of claim 6, wherein the prism comprises a first, mirrored lateral face that extends from an edge of the lower face of the prism at an acute angle to an edge of the upper face of the prism,
wherein the prism comprises a second lateral face opposing the first lateral face, the second lateral face of the prism extending from the lower face of the prism to the upper face of the prism at a right angle, and
wherein the tunable optical metasurface transmits the received optical radiation to be reflected by the mirrored lateral face of the prism and then passed through the second lateral face of the prism to be received by the sensor.

10. The system of claim 1, further comprising:
a controller to tune the tunable optical metasurface to receive the optical radiation.

11. A system for light detection and ranging (LiDAR), comprising:
a transmission system, including:
an optical radiation source to generate optical radiation;
a first tunable optical metasurface to transmit incident optical radiation from the optical radiation source as output optical radiation that is selectively steerable to a plurality of steering angles; and
a transmit prism positioned relative to the first tunable optical metasurface to deflect the optical radiation generated by the optical radiation source for incidence on the first tunable optical metasurface; and a detection system, including:
a receive prism;
a sensor to detect optical radiation; and
a second tunable optical metasurface steerable to:
receive optical radiation through an upper planar face of the receive prism at a target steering angle, and transmit the received optical radiation to be internally reflected within the receive prism before passing through the receive prism to be received by the sensor.

12. The system of claim 11, wherein the second tunable optical metasurface transmits the received optical radiation toward the upper planar face of the receive prism at an angle greater than a critical angle for internal reflection by the upper planar face of the receive prism before passing through the receive prism to be received by the sensor.

13. The system of claim 11, wherein the sensor comprises an array of optical sensors.

14. The system of claim 11, wherein the receive prism comprises a lower planar face and parallel to the upper planar face, and
wherein the lower planar face of the receive prism is positioned above and parallel to the second tunable optical metasurface, such that the optical radiation steerably received by the second tunable optical metasurface is received through the lower planar face of the receive prism and the upper planar face of the receive prism.

15. The system of claim 14, wherein the receive prism comprises a first lateral face that extends from an edge of the lower planar face of the receive prism at an obtuse angle to an edge of the upper planar face of the receive prism.

16. The system of claim 15, wherein the receive prism comprises a second lateral face opposing the first lateral face, wherein the second lateral face extends from the lower planar face of the receive prism at a right angle to the upper planar face of the receive prism.

17. The system of claim 14, wherein the receive prism comprises a first, mirrored lateral face that extends from an edge of the lower planar face of the receive prism at an acute angle to an edge of the upper planar face of the receive prism,
wherein the receive prism comprises a second lateral face opposing the first, mirrored lateral face, the second lateral face extending from the lower planar face of the receive prism to the upper planar face of the receive prism at a right angle, and
wherein the second tunable optical metasurface transmits the received optical radiation to be reflected by the first, mirrored lateral face and then passed through the second lateral face to be received by the sensor.

18. The system of claim 11, wherein the optical radiation incident on the first tunable optical metasurface and the steered output optical radiation from the first tunable optical metasurface spatially overlap within the transmit prism for at least some of the plurality of steering angles.

19. The system of claim 11, further comprising an optical assembly positioned between the optical radiation source and the transmit prism to:
shape the optical radiation generated by the optical radiation source prior to being deflected by the transmit prism, and
adjust a polarization of at least some of the optical radiation generated by the optical radiation source.

20. The system of claim 11, wherein the optical radiation source comprises a set of vertical-cavity surface-emitting lasers (VCSELs).

21. The system of claim 20, wherein the first tunable optical metasurface comprises a one-dimensionally steerable metasurface to steer the optical radiation along an azimuth axis, and
wherein the set of VCSELs comprises N subsets of VCSELs, where N is an integer, and each of the N subsets is selectively activated to generate optical radiation for incidence on the first tunable optical metasurface at an angle of incidence for unsteered deflection by the first tunable optical metasurface at a different elevation angle.

22. The system of claim 21, further comprising:
a controller to:
activate one of the first and second subsets of VCSELs to generate optical radiation at a target elevation angle, and
tune the first tunable optical metasurface to deflect incident optical radiation as output optical radiation steered at a target steering angle.

23. The system of claim 11, further comprising
a photodetector positioned to receive optical radiation incident on the first tunable optical metasurface that is unsteered by the first tunable optical metasurface.

24. The system of claim 23, further comprising
a sensor system to determine at least one of:
an efficiency of the first tunable optical metasurface,
a power output of the optical radiation source, and
a health status of the system.

* * * * *